US009239159B2

(12) United States Patent
Takenaka et al.

(10) Patent No.: US 9,239,159 B2
(45) Date of Patent: Jan. 19, 2016

(54) HEAT-DISSIPATING STRUCTURE FOR LIGHTING APPARATUS AND LIGHTING APPARATUS

(71) Applicant: SAMSUNG ELECTRONICS CO., LTD., Suwon-Si, Gyeonggi-do (KR)

(72) Inventors: Hiromitsu Takenaka, Kanagawa (JP); Ichiro Morishita, Kanagawa (JP)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 25 days.

(21) Appl. No.: 14/365,974

(22) PCT Filed: Dec. 14, 2012

(86) PCT No.: PCT/KR2012/010966
§ 371 (c)(1),
(2) Date: Jun. 16, 2014

(87) PCT Pub. No.: WO2013/089521
PCT Pub. Date: Jun. 20, 2013

(65) Prior Publication Data
US 2014/0355241 A1 Dec. 4, 2014

(30) Foreign Application Priority Data

Dec. 16, 2011 (JP) .................. 2011-276475
Dec. 16, 2011 (JP) .................. 2011-276476
Dec. 16, 2011 (JP) .................. 2011-276477
Dec. 16, 2011 (JP) .................. 2011-276478
Dec. 16, 2011 (JP) .................. 2011-276479
Dec. 16, 2011 (JP) .................. 2011-276480
Dec. 16, 2011 (JP) .................. 2011-276481
Dec. 14, 2012 (KR) .............. 10-2012-0146414

(51) Int. Cl.
| F21V 29/00 | (2015.01) |
| F21V 3/04 | (2006.01) |
| F21V 23/00 | (2015.01) |
| F21K 99/00 | (2010.01) |
| F21V 3/02 | (2006.01) |
| F21V 7/00 | (2006.01) |
| F21V 29/77 | (2015.01) |
| F21Y 101/02 | (2006.01) |
| F21Y 103/02 | (2006.01) |
| F21Y 111/00 | (2006.01) |

(52) U.S. Cl.
CPC ............. *F21V 29/22* (2013.01); *F21K 9/135* (2013.01); *F21K 9/50* (2013.01); *F21K 9/56* (2013.01); *F21V 3/02* (2013.01); *F21V 3/0472* (2013.01); *F21V 3/0481* (2013.01); *F21V 7/0016* (2013.01); *F21V 23/005* (2013.01); *F21V 29/773* (2015.01); *F21V 23/006* (2013.01); *F21Y 2101/02* (2013.01); *F21Y 2103/022* (2013.01); *F21Y 2111/005* (2013.01)

(58) Field of Classification Search
CPC ..... F21V 29/22; F21V 7/0016; F21V 29/773; F21V 23/005; F21V 3/0481; F21V 3/0472; F21V 3/02; F21V 23/006; F21K 9/50; F21K 9/135; F21Y 2111/005; F21Y 2103/022; F21Y 2101/02
USPC ............................................... 362/84
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |

| | | |
|---|---|---|
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2010/0270014 A1 | 10/2010 | Huang |
| 2010/0327751 A1 | 12/2010 | Takenaka et al. |
| 2011/0234078 A1 | 9/2011 | Choi et al. |
| 2012/0236573 A1 | 9/2012 | Yamamoto et al. |

FOREIGN PATENT DOCUMENTS

| | | |
|---|---|---|
| EP | 2 551 584 A2 | 1/2013 |
| EP | 2 690 345 A1 | 1/2014 |
| JP | 2004-296245 A | 10/2004 |
| JP | 2010-086946 A | 4/2010 |
| JP | 2011-014306 A | 1/2011 |
| JP | 2011-054340 A | 3/2011 |
| JP | 2011-119187 A | 6/2011 |
| KR | 2009-0029056 A | 3/2009 |
| KR | 10- 2010-0069095 A | 6/2010 |
| KR | 20-0454183 Y1 | 6/2011 |
| KR | 10-2011-0090238 A | 8/2011 |
| WO | 2011/059268 A2 | 5/2011 |
| WO | 2012/122095 A2 | 9/2012 |

OTHER PUBLICATIONS

Supplementary Partial European Search Report issued in corresponding European Patent Application No. 12858384.6, mailed on May 22, 2015.
International Search Report issued in PCT/KR2012/010966, dated Mar. 27, 2013, with English translation.

*Primary Examiner* — Joseph L Williams
(74) *Attorney, Agent, or Firm* — McDermott Will & Emery LLP

(57) ABSTRACT

There is provided a lighting device including: a light emitting module having at least one light emitting device outputting light and a light emitting device board on which the at least one light emitting device is disposed; a housing installed on one side of a ring in a central axis direction relatively to the light emitting device board; and a resin globe installed to cover the light emitting module, wherein the globe has a plurality of protrusions formed by retaining at least a portion of a gate unit used in molding the globe, and the light emitting device board may have notch portions combined with the protrusions.

20 Claims, 49 Drawing Sheets

HEAT-DISSIPATING STRUCTURE FOR LIGHTING APPARATUS AND LIGHTING APPARATUS

RELATED APPLICATIONS

This application is the U.S. National Phase under 35 U.S.C. §371 of International Application No. PCT/KR2012/010966, filed on Dec. 14, 2012, which in turn claims the benefit of the following: Japanese Application No. 2011-276481, filed on Dec. 16, 2011; Japanese Application No. 2011-276480, filed on Dec. 16, 2011; Japanese Application No. 2011-276479, filed on Dec. 16, 2011; Japanese Application No. 2011-276478, filed on Dec. 16, 2011; Japanese Application No. 2011-276477, filed on Dec. 16, 2011; Japanese Application No. 2011-276476, filed on Dec. 16, 2011; Japanese Application No. 2011-276475, filed on Dec. 16, 2011; and Korean Application No. 10-2012-0146414, filed on Dec. 14, 2012, the disclosures of which Applications are incorporated by reference herein.

TECHNICAL FIELD

The present disclosure relates to a heat dissipation structure of a lighting device using a light emitting device, and a lighting device having the same.

BACKGROUND ART

In lighting devices using a light emitting device, a heat sink, dissipating heat from a light emitting device is generally disposed to the rear of a board on which the light emitting device is mounted. However, in order to avoid degradations in performance of lighting devices caused by insufficient heat dissipation efficiency, various measures have been adopted to enhance the heat dissipation efficiency of lighting devices.

Also, lighting devices using a light emitting device employ light emitting diodes (LEDs) having strong directivity as light sources, and thus, light may only be distributed in limited directions. Meanwhile, incandescent lamps are available to substantially distribute light in all directions, excluding a region covered by a metal socket thereof, or the like. Thus, in a case in which light needs to be substantially distributed in all directions, LED lighting devices may not be appropriate as substitutes for incandescent lamps. Thus, a technique of enhancing light distribution is required in the field of LED illumination devices.

DISCLOSURE

Technical Problem

However, in cases in which lighting devices are limited in terms of shape due to a standards applied thereto, or the like, an area of heat dissipation of a heat sink may not be increased, it may be difficult to improve heat dissipation efficiency, and there is a limitation in enhancing light distribution, and thus, in order to address these problems, a new heat dissipation structure and a lighting device using the new heat dissipation structure are required.

Technical Solution

According to an aspect of a first example embodiment of the present disclosure, there is provided a lighting device including: a light emitting module having at least one light emitting device outputting light and a light emitting device board on which the at least one light emitting device is disposed; a housing installed on one side of a ring in a central axis direction relatively to the light emitting device board; and a resin globe installed to cover the light emitting module, wherein the globe has a plurality of protrusions formed by retaining at least a portion of a gate unit used in molding the globe, and the light emitting device board has notch portions combined with the protrusions.

According to another aspect of the first example embodiment of the present disclosure, there is provided a lighting device including: a light emitting module having at least one light emitting device outputting light and a light emitting device board on which the at least one light emitting device is disposed; a housing installed on one side of a ring in a central axis direction based on the emitting device board as a reference; a resin globe installed to cover the light emitting module; and a heat dissipation plate installed to be in contact with both the light emitting device board and the housing and transmitting heat generated by the light emitting module to the housing, wherein at least one of the light emitting device board and the heat dissipation plate has notch portions combined with the protrusions.

Here, in each of the lighting devices, the protrusions may be disposed at equal intervals.

Also, in each of the lighting devices, the globe may have a circular opening in an end portion of the light emitting device board side, and the protrusions may be installed on the circumferential edge of the opening.

According to a second example embodiment of the present disclosure, there is provided a lighting device including: a light emitting module having a plurality of light emitting devices outputting light and a light emitting device board on which the light emitting devices are disposed in an annular arrangement; a substantially hollow vessel-like housing installed on one side of the ring in a central axis direction relatively to the light emitting device board; a reflector supported by the other surface of the light emitting device board opposite to the one side and reflecting light output from the light emitting devices; and a globe installed to cover the light emitting module and the reflector and having a maximum diameter greater than that of the housing, wherein the reflector is installed to be protruded from the other surface of the light emitting device board such that the reflector has a reversed circular truncated conical shape having a diameter increased in a direction away from the light emitting device board, and has a reflective surface formed on a lateral circumferential surface of the truncated cone to reflect light output from the light emitting devices, and the globe includes a globe neck portion connected to the housing and having a sloped surface in accordance with the slope of the reflective surface; and a substantially hemispherical globe head portion connected to the globe neck portion.

Here, preferably, in the lighting device, the reflective surface of the reflector and the sloped surface of the globe may be substantially parallel.

Also, in the lighting device, preferably, a material of the globe may be a material containing a phosphor or a surface of the globe may be coated with a phosphor, and the light emitting device may be a light emitting diode (LED) emitting light exciting the phosphor of the globe.

Also, in the lighting device, a material of the globe may be a material further containing a light diffuser or a light diffuser may be further coated on the surface of the globe.

Also, in the lighting device, a material of the globe may a material containing a light diffuser, a light diffuser may be coated on a surface of the globe, and the light emitting device may be an LED emitting white light.

Also, preferably, in the lighting device, a length d1 of the reflector in a central axis direction of the ring may be greater than a length d2 of the globe neck portion in the central axis direction of the ring.

Also, in the lighting device, when the reflector is projected to the light emitting device board in a direction in which a diameter of the reflector is increased, preferably, at least a portion of the light emitting devices may exist within the projected region.

According to a third example embodiment of the present disclosure, there is provided a heat dissipation member of a lighting device using a light emitting device. The heat dissipation member according to the present disclosure may include: a metal hollow body portion having one end to which a globe covering a light emitting device board with light emitting devices mounted thereon is connected; and a heat dissipation portion formed of a resin material and installed in an outer circumferential surface of the body portion through insert-molding, wherein a holding portion holding the resin material forming the heat dissipation portion is installed in the body portion.

The holding portion may be a plurality of holes formed in an outer circumferential surface of the body portion. Here, the holes may be formed to have an oval or polygonal shape having a diameter extended in a direction in which the resin material forming the heat dissipation portion flows during insert-molding and in a length direction of the body portion.

Also, the holding portion may be a plurality of slits formed in the outer circumferential surface of the body portion and extending in the length direction of the body portion.

Also, the holding portion may be a step portion having a diameter of an outer circumference decreased from one end connected to the globe formed in the outer circumferential surface of the body portion toward the other end thereof.

Also, the holding portion may be a plurality of concave portions formed in the outer circumferential surface of the body portion.

Also, the holding portion may be a plurality of protrusions formed in the outer circumferential surface of the body portion.

According to specific example embodiments (fourth and fifth example embodiments) of the present disclosure, there is provided a heat dissipation structure of a lighting device using a light emitting device. The heat dissipation structure of a lighting device may include: a first heat sink installed on one side of light emitting devices disposed in an annular arrangement in a central axis direction based on heating elements including the light emitting devices disposed in an annular arrangement; and a second heat sink installed on the other side in the central axis direction.

Here, the heating elements may include: the light emitting devices and a light emitting device board on which the light emitting devices are mounted.

Also, the first heat sink and the second heat sink may have a hollow body portion, respectively, and a central axis of the body portion and a central axis of the light emitting devices may correspond to each other.

Also, a flange portion may be installed between the first heat sink and the second heat sink, extend from an outer circumferential surface of the body portion of the first heat sink or the body portion of the second heat sink, and support the heating elements.

Also, the heating elements may be installed in the outer circumferential surface of the second heat sink.

Also, the first heat sink and the second heat sink may be integrally formed.

According to another aspect of a sixth example embodiment of the present disclosure, there is provided a lighting device including: light emitting devices outputting light; a light emitting device board on which the light emitting devices are disposed in an annular arrangement; a heat sink dissipating heat from heating elements including the light emitting devices; and a globe covering the light emitting device board with the light emitting devices mounted thereon, wherein the heat sink includes a first heat sink installed on one side of the light emitting devices disposed in an annular arrangement in a central axis direction based on the heating elements as a reference and a second heat sink installed on the other side of the light emitting devices in the central axis direction.

Here, the first heat sink and the second heat sink may respectively have a hollow body portion having a central axis corresponding to the central axis of the light emitting devices, and the globe may have an opening connected to the hollow portion of the body portion of the second heat sink installed in the globe side.

According to other specific example embodiments (seventh and eighth example embodiments) of the present disclosure, there is provided a lighting device including: a light emitting module having a plurality of light emitting devices outputting light and a light emitting device board on which the light emitting devices are disposed in an annular arrangement; a first heat sink installed on one side of the ring in a central axis direction relatively to the light emitting device board; a second heat sink installed on the other side of the ring in a central axis direction relatively to the light emitting device board; a globe installed to cover the light emitting module; and a driving circuit installed within the second heat sink and driving the light emitting devices, wherein the first heat sink only outwardly dissipates heat generated by any one of the light emitting module and the driving circuit, and the second heat sink only dissipates heat generated by the other of the light emitting module and the driving circuit.

Here, in the lighting device, the first heat sink may outwardly dissipate heat generated by the driving circuit, and the second heat sink may outwardly dissipate heat generated by the light emitting module.

In this case, the first heat sink may have a substantially cylindrical or columnar shape, an opening may be installed in a central portion of the light emitting device board such that it is not in contact with the first heat sink, the light emitting device board may be thermally combined with the second heat sink, and the driving circuit may be thermally combined with the first heat sink through a heat conduction member formed of a material having thermal conductivity.

Also, the lighting device may further include a heat dissipation plate provided between the light emitting device board and the second heat sink and transmitting heat generated by the light emitting device board to the second heat, wherein an opening is installed in a central portion of the heat dissipation plate such that the opening is not in contact with the first heat sink.

Also, in the lighting device, the first heat sink may outwardly dissipate heat generated by the light emitting module, and the second heat sink may outwardly dissipate heat generated by the driving circuit.

According to an aspect of a ninth example embodiment of the present disclosure, there is provided a heat dissipation structure of a lighting device using a light emitting device. The heat dissipation structure of a lighting device may include: a hollow heat sink installed in a central portion of heating elements including light emitting devices disposed in an annular arrangement and extending in a direction of a central axis of the light emitting devices disposed in the annular arrangement; and a hollow internal heat sink installed within the heat sink, wherein distances from an inner circumferential surface of the heat sink passing through the center of the heat sink to an outer circumferential surface of the internal heat sink are unequal.

Here, a planar shape of the heat sink in the central axis direction may be circular, and a planar shape of the internal heat sink may be an oval shape or a polygonal shape having a longer diameter and a short diameter.

According to another aspect of the ninth example embodiment of the present disclosure, there is provided a lighting device including: light emitting devices outputting light; a light emitting device board on which the light emitting devices are disposed in an annular arrangement; a globe covering the light emitting device board with the light emitting devices mounted thereon; a hollow heat sink installed in a central portion of heating elements including light emitting devices disposed in an annular arrangement and extending in a direction of a central axis of the light emitting devices disposed in the annular arrangement; and a hollow internal heat sink installed within the heat sink, wherein distances from an inner circumferential surface of the heat sink passing through the center of the heat sink to an outer circumferential surface of the internal heat sink are unequal.

According to an aspect of a tenth example embodiment of the present disclosure, there is provided a heat dissipation structure of a lighting device using a light emitting device. The heat dissipation structure of a lighting device may include: a hollow heat sink installed in a central portion of heating elements including light emitting devices disposed in an annular arrangement and extending in a direction of a central axis of the light emitting devices disposed in the annular arrangement; and at least one fin extending from an inner circumferential surface of the heat sink, wherein distances between inner circumferential surfaces of the heat sink passing through the center of the heat sink are unequal.

Here, at least one of a plurality of fins installed in the inner circumferential surface of the heat sink may have a length different from that of a different fin in a radial direction.

Also, the fins may be respectively disposed radially in a circumferential direction from the inner circumferential surface of the heat sink toward the center thereof. Alternatively, the fins may respectively extend in one direction from the inner circumferential surface of the heat sink toward an inner space thereof.

According to another aspect of the tenth example embodiment of the present disclosure, there is provided a lighting device including: light emitting devices outputting light; a light emitting device board on which the light emitting devices are disposed in an annular arrangement; a globe covering the light emitting device board with the light emitting devices mounted thereon; a hollow heat sink installed in a central portion of heating elements including light emitting devices disposed in an annular arrangement and extending in a direction of a central axis of the light emitting devices disposed in the annular arrangement; and at least one fin extending from an inner circumferential surface of the heat sink, wherein distances between inner circumferential surfaces of the heat sink passing through the center of the heat sink are unequal.

According to an eleventh example embodiment of the present disclosure, there is provided a lighting device including: a light emitting module having at least one light emitting device outputting light and a light emitting device board on which the at least one light emitting device is disposed; a first heat sink installed on one side of a ring in a central axis direction relatively to the light emitting device board; a second heat sink installed on the other side of the ring in the central axis direction relatively to the light emitting device board and having a hollow shape; a reflector maintained in one surface of the light emitting device board and reflecting light output from the light emitting devices; a globe installed to cover the light emitting module and the reflector; and a driving circuit installed within the second heat sink and driving the light emitting devices, wherein the first heat sink and the second heat sink respectively dissipate at least one of heat generated by the light emitting module and heat generated by the driving circuit.

The lighting device may further include: a heat dissipation plate installed to be in contact with both the light emitting device board and the second heat sink and transmitting heat generated by the light emitting module to the second heat sink.

In the lighting device, the reflector may be installed to be protruded from one surface of the light emitting device board such that the reflector has a reversed circular truncated conical shape having a diameter increased in a direction away from the light emitting device board, and have a reflective surface formed on a lateral circumferential surface of the truncated cone to reflect light output from the light emitting devices.

In the lighting device, the second heat sink may have a substantially cylindrical shape, and a maximum diameter of the globe may be greater than that of the second heat sink.

In the lighting device, a maximum diameter of the globe may be 1.2 times or greater than the maximum diameter of the second heat sink.

In the lighting device, a material of the globe may be a material containing a phosphor or a surface of the globe may be coated with a phosphor, the light emitting device may be a light emitting diode (LED) emitting light exciting the phosphor of the globe, and wavelengths of light reflected by the reflector and light output from the light emitting devices may be converted by the phosphor.

In this case, a material of the globe may be a material further containing a light diffuser or a light diffuser may be further coated on the surface of the globe.

Also, a material of the globe may be a material containing a light diffuser or a light diffuser may be coated on the surface of the globe so the light emitting device may be a light emitting diode (LED) emitting white light.

In the lighting device, the second heat sink may have a metal member inserted into a resin, and may be obtained by integrally insert-molding the resin and the metal member.

In the lighting device, the driving circuit may not have an electrolytic capacitor converting an alternating current (AC) into a direct current (DC).

In the lighting device, the first heat sink may have a substantially cylindrical or columnar shape, and the globe may have an opening connected to one end of the first heat sink.

In the lighting device, the reflector may have a hollow shape, the first heat sink may be disposed in the hollow portion of the reflector, and a maximum diameter of the first heat sink may be equal to or smaller than a maximum diameter of the reflector.

According to a twelfth example embodiment of the present disclosure, there is provided a lighting device including: a light emitting module having a plurality of light emitting devices outputting light and a light emitting device board on which the light emitting devices are disposed in an annular arrangement; a first heat sink installed on one side of the ring in a central axis direction relatively to the light emitting device board such that the first heat sink is in contact with the light emitting device board; a second heat sink installed on the other side of the ring in the central axis direction relatively to the light emitting device board and having a hollow shape; a globe installed to cover the light emitting module and the reflector; and a driving circuit installed within the second heat sink and driving the light emitting devices, wherein the first heat sink and the second heat sink respectively outwardly dissipate at least one of heat generated by the light emitting module and heat generated by the driving circuit, and the first heat sink may have a reflective surface reflecting light output from the light emitting devices.

Advantageous Effects

A heat dissipation structure of a lighting device capable of actively dissipating heat from a heating element, and a lighting device may be provided.

A gate portion used in molding a resin globe is used as a positioning rib between a light emitting module and a globe, whereby quality of the globe as a molded product is secured and precision of positioning between the light emitting module and the globe in a lighting device using light emitting devices (in particular, the first example embodiment)

A lighting device facilitating a light distribution with a simpler structure and having a wide light distribution angle equal to that of an incandescent bulb, which thus may be able to replace an incandescent bulb, may be provided (in particular, the second example embodiment).

A heat dissipation member of a lighting device may be formed by mixing a metal material and a resin material, without limiting a metal material for insert-molding (in particular, the third example embodiment).

A lighting device having a new heat dissipation structure and capable of enhancing heat dissipation efficiency of a driving circuit with respect to heat generated by the driving circuit, without being affected by heat generated by a light emitting module (in particular, the seventh and eighth example embodiments).

A bulb-type lighting device having excellent heat dissipation efficiency, having a wide distribution angle equal to that of an incandescent bulb, having high luminous efficiency, a large amount of light, excellent color rendering, and having a shape (size) equal to that of an incandescent bulb, which, thus, may be able to replace an incandescent bulb, may be provided (Eleventh and twelfth example embodiments).

BEST MODE

Figure 1A:
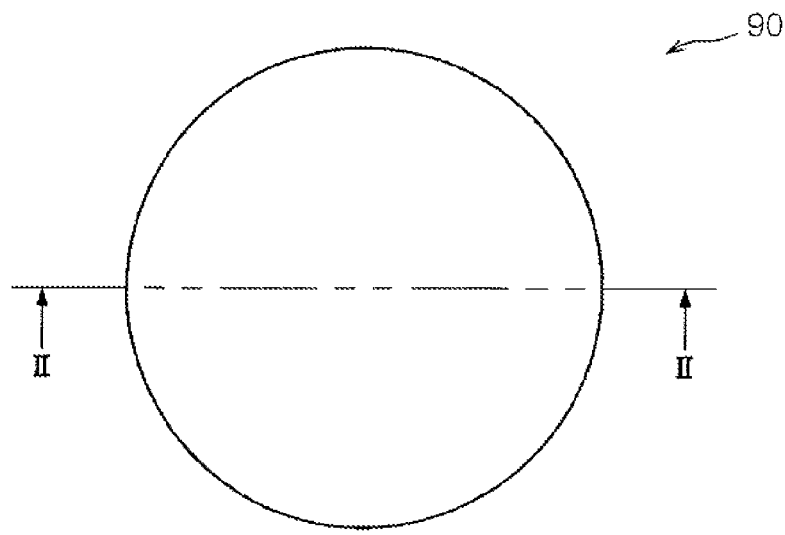
FIG. 1A is a top view and FIG. 1B is a front view illustrating an overall configuration of a lighting device according to a first example embodiment of the present disclosure.

Hereinafter, example embodiments of the present disclosure will be described in detail with reference to the accompanying drawings. Meanwhile, in the present disclosure and drawings, like reference numerals are used for the components having substantially the same function and redundant descriptions will be omitted.

<First Example Embodiment>

[Configuration of Lighting Device According to First Example Embodiment]

Figure 1B:
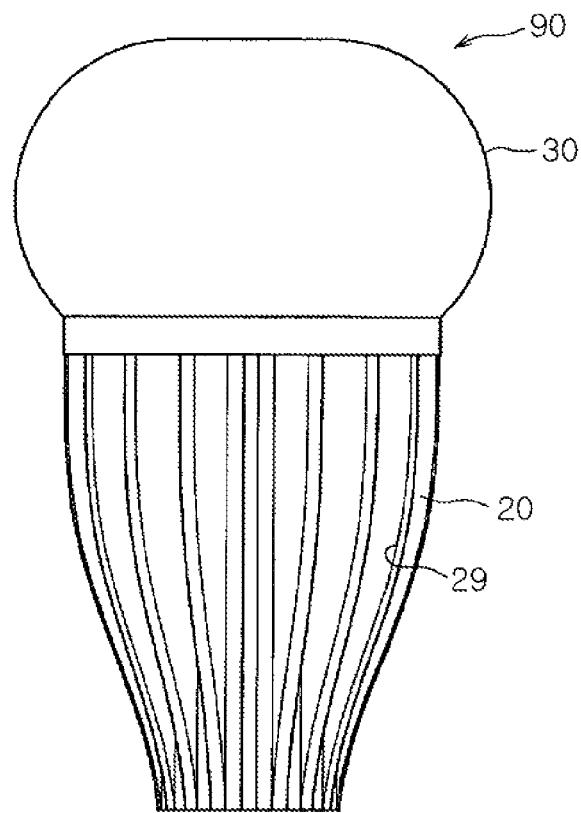
Figure 2:
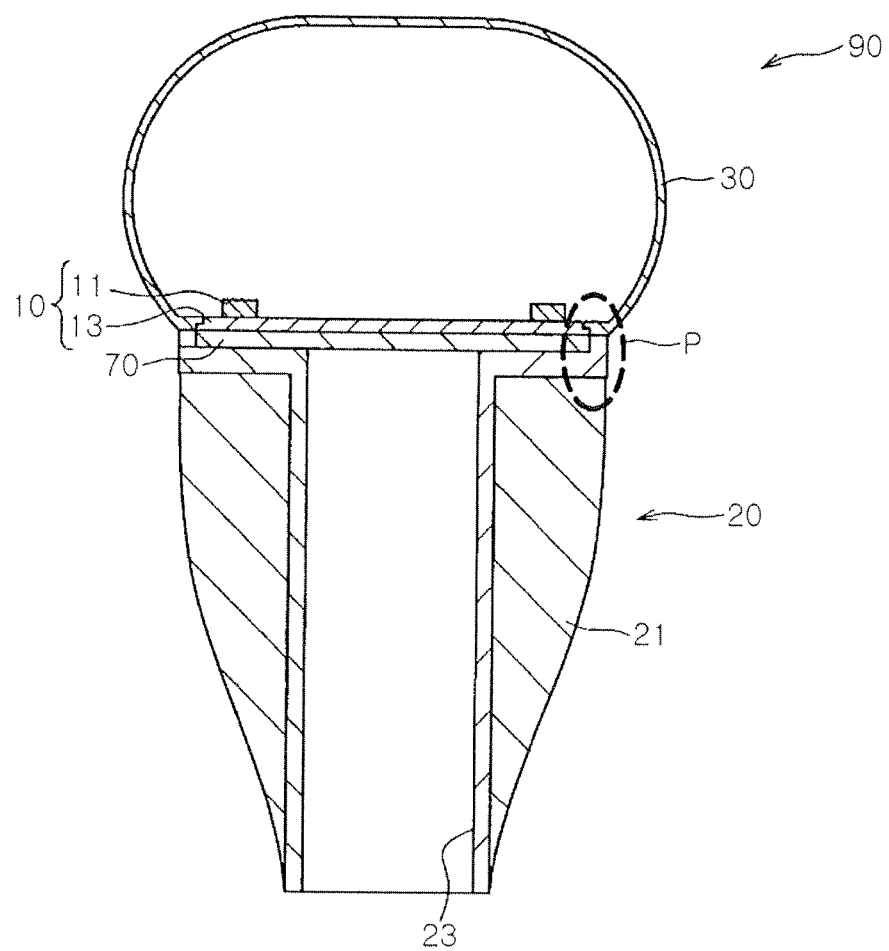
FIG. 2 is a cross-sectional view of the lighting device according to the first example embodiment taken along line II-II in FIG. 1A.
Figure 3:
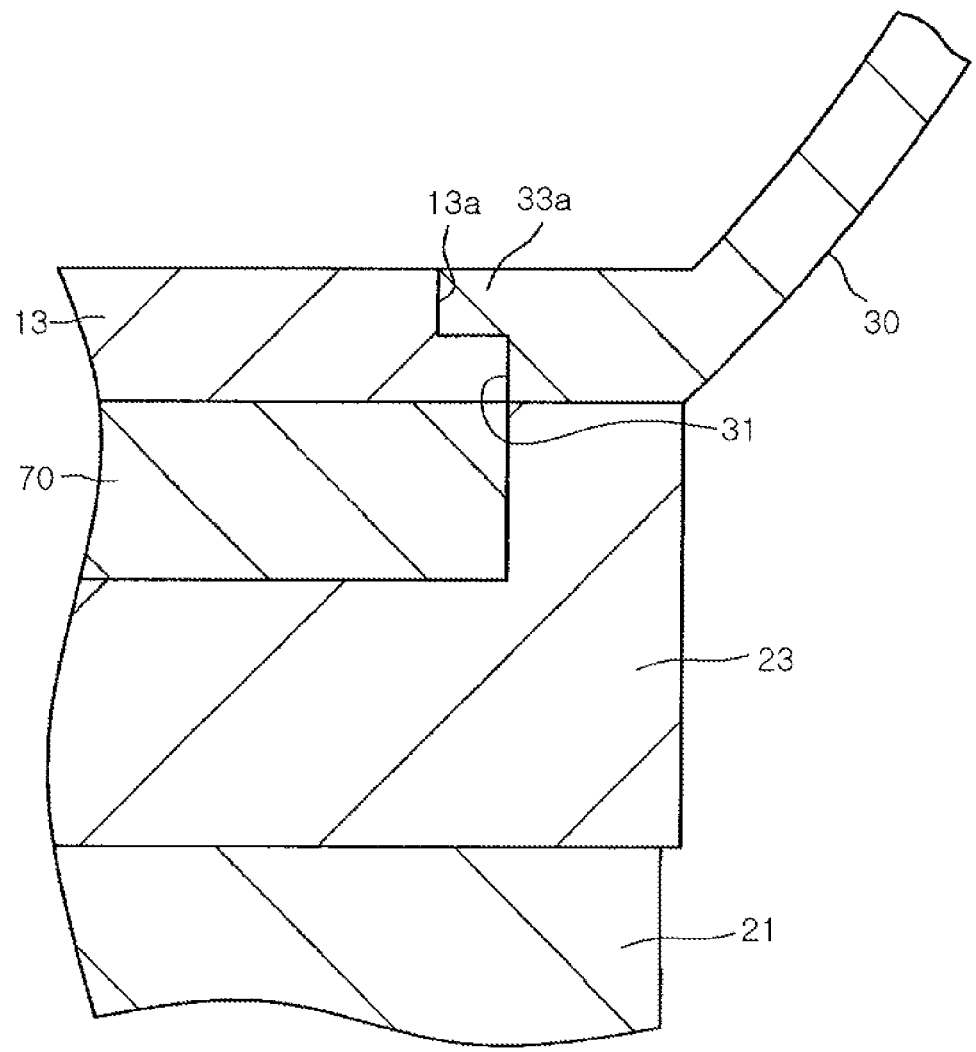
FIG. 3 is an enlarged cross-sectional view of portion 'P' of FIG. 2.
Figure 4:
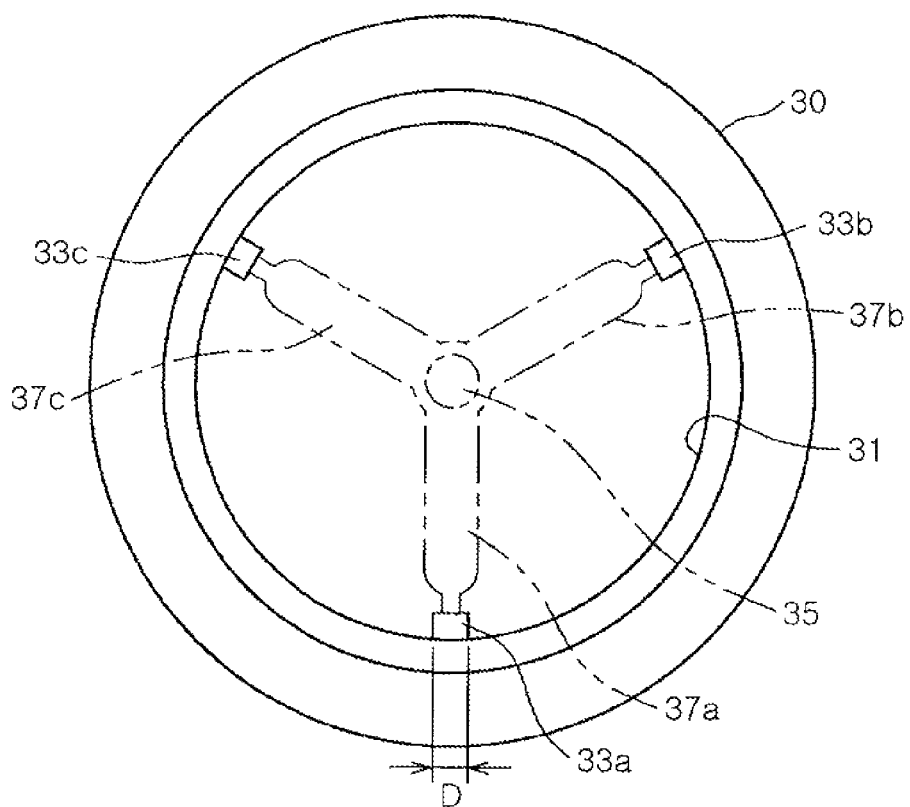
FIG. 4 is a plan view illustrating a configuration of a globe according to the first example embodiment.
Figure 5:
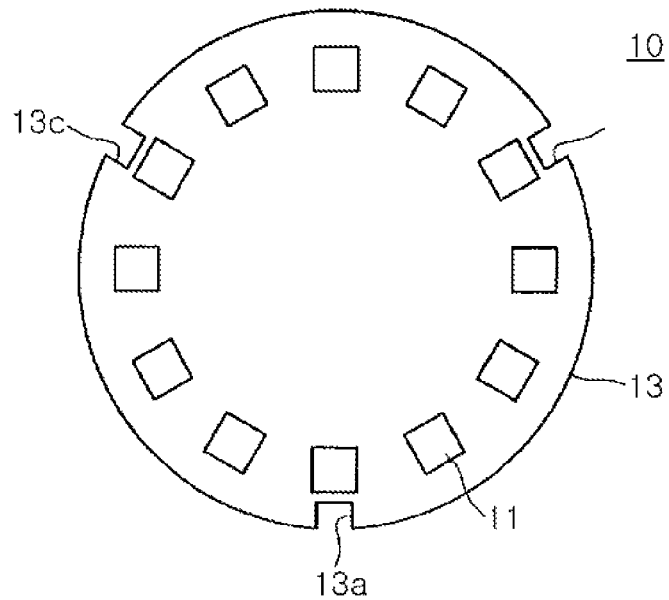
FIG. 5 is a plan view illustrating a configuration of a light emitting module according to the first example embodiment.

First, a configuration of a lighting device according to an example embodiment of the present disclosure will be described in detail with reference to FIGS. 1 through 5. FIG. 1A is a top view and FIG. 1B is a front view illustrating an overall configuration of a lighting device according to the first example embodiment of the present disclosure. FIG. 2 is a cross-sectional view of the lighting device according to the first example embodiment taken along line II-II in FIG. 1A. FIG. 3 is an enlarged cross-sectional view of portion 'P' of FIG. 2. FIG. 4 is a plan view illustrating a configuration of a globe according to the first example embodiment. FIG. 5 is a plan view illustrating a configuration of a light emitting module according to the first example embodiment.

As illustrated in FIGS. 1 and 2, a lighting device 90 according to the present example embodiment includes a light emitting module 10, a housing 20, a globe 30, and a heat dissipation plate 70.

(Light Emitting Module 10)

The light emitting module 10 is a member including a light emitting device 11 and a light emitting device board 13 and is a light source of the lighting device 90.

The light emitting device 11 is a semiconductor light emitting device such as a light emitting diode (LED), or the like, and outputs light. A luminous color of the light emitting device 11 is not particularly limited and may vary according to a constituent material of the globe 30. For example, in a case in which the globe 30 is formed of a material (resin, or the like) containing a phosphor, a luminous color of the light emitting device 11 may be blue, and a wavelength of light is converted in the globe 30 to emit white light. Meanwhile, in a case in which the globe 30 is formed of a material (resin, or the like) containing a light diffuser, the light emitting device 11 emits white light (6500K to 20000K). Light output from the light emitting device 11 is diffused from the globe 30 so as to be emitted outwardly.

Also, as illustrated in FIG. 5, the light emitting device 11 is provided in plural, and the plurality of light emitting devices 11 are disposed in an annular arrangement on one surface of the light emitting device board 13. Here, the annular arrangement includes an oval annular arrangement and a polygonal annular arrangement, as well as a circular annular arrangement. Also, the amount of light emitting devices 11 may not be plural as illustrated in FIG. 5 and only a single light emitting device 11 may be mounted on the light emitting device board 13. In the case in which a single light emitting device 11 is mounted on the light emitting device board 13, a position of the light emitting device 11 is not particularly limited, but the light emitting device 11 may be positioned substantially at the center of the light emitting device board 13 in consideration of light distribution characteristics.

The light emitting device board 13 may be a board on which the light emitting device 11 is mounted, and preferably, the light emitting device board 13 may be formed of a material having a high degree of conductivity such as aluminum, nickel, or the like, a glass composite CEM3, a ceramic, or the like. Accordingly, heat generated by the light emitting module 10 may be effectively transmitted to the housing 20 and heat dissipation efficiency of the lighting device 90 may be enhanced. A shape of the light emitting device board 13 is not particularly limited and, preferably, the light emitting device board 13 may have a substantially circular or polygonal shape in order to satisfy the ANSI standard as a standard for a size of bulb-type lighting devices.

Also, in the present example embodiment, as illustrated in FIGS. 3 and 5, the light emitting device board 13 may have notch portions 13a, 13b, and 13c, and the notch portions 13a, 13b, and 13c are respectively combined with protrusions 33a, 33b, and 33c of the globe 30 as described hereinafter. Accordingly, relative positions of the light emitting device board 13 and the globe 30 are fixed.

Here, the amount of notch portions formed in the light emitting device board 13 may be determined to correspond to the amount of protrusions formed in the globe 30, but in this case, two or more notch portions need to be formed. In this manner, since the light emitting device board 13 and the globe 30 are combined in two or more portions thereof, relative positions of the light emitting device board 13 and the globe 30 may be fixed and the light emitting device board 13 and the globe 30 may be prevented from being relatively rotated.

Meanwhile, the light emitting device board 13 is supported by an upper portion of the housing 20 (or by the heat dissipation plate 70), whereby a position of the light emitting device board 13 is fixed.

(Housing 20)

A housing 20 is connected to a socket (not shown) in one end thereof (lower end in FIGS. 1 and 2), and functions as a housing in which a driving circuit (not shown) for driving the light emitting device 11 is accommodated. In the present example embodiment, a driving circuit may be installed within a hollow body portion of the housing 20.

Also, the housing 20 serves as a so-called heat sink, dissipating heat generated by the light emitting module 10 and heat generated by the driving circuit. In order to implement the heat dissipation function, the housing 20 may be formed of a resin having a high degree of thermal conductivity. In the present example embodiment, the housing 20 is formed of a resin, rather than a metal, so as to reduce a weight of the lighting device 90 and, since a resin may have insulating properties, there is no need to take measures for insulation in a caulking portion when the housing 20 is connected to a socket. Thus, in a case in which an increase in weight of the lighting device 90 is not problematic, a metal such as aluminum, copper, or the like, may be used as a material of the housing 20. However, in the case in which the housing 20 is formed of a metal, insulation measures need to be taken in the caulking portion of the socket.

Also, in order to further increase the heat dissipation effect, a recess may be formed in a surface of the housing 20 or a plurality of fins may be installed in a surface of the housing 20 to increase a surface area of the housing 20.

In this respect, in the present example embodiment, the housing 20 may have a plurality of fins 29 formed in an outer circumferential surface of a substantially hollow vessel-like body portion with openings formed in both ends thereof. With the plurality of fins 29, a surface area of an outwardly exposed surface of the housing 20 (an area of the surface used to dissipate heat) may be increased to enhance a heat dissipation effect. Meanwhile, alternatively, in order to enhance the heat dissipation effect, for example, a plurality of recesses (not shown) may be formed in the outer circumferential surface of the body portion of the housing 20, in addition to the fins 29.

Also, the housing 20 is installed on one side (on the side where the light emitting device 11 is not disposed) of the light emitting device board 13 based on a ring configured according to a disposition of the light emitting device 11 in a central axis direction, as a reference. Accordingly, the housing 20 may dissipate heat generated by the driving circuit or the light emitting module 10 outwardly therefrom.

Also, in the present example embodiment, the housing 20 includes a resin 21, and a metal member 23 insertedly positioned within the resin 21. The housing 20 may be formed by integrally insert-molding the resin 21 and the metal member 23. This is because, the resin 21 alone has low thermal conductivity, relative to a metal such as aluminum, copper, or the like, and thus, in order to increase thermal conductivity, the metal member 23 such as aluminum, copper, or the like, is inserted into the resin 21. Thus, if heating of the light emitting module 10 or the driving circuit is suppressed through management of performance thereof to have a sufficient heat dissipation effect, the metal member 23 may not need to be inserted.

Also, in the case of inserting the metal member 23, preferably, the metal member 23 is disposed to be in contact with the heat dissipation plate 70 (without the heat dissipation plate 70, the metal member 23 is disposed to be in contact with the light emitting device board 13) in order for heat generated by the light emitting module 10 to be easily transmitted to the housing 20.

(Globe 30)

The globe 30 has a substantially globular shape to cover the light emitting module 10, and serves to control a color of light (luminous color of the light emitting device 11) output from the light emitting device 11 and to diffuse light from a surface thereof to broaden a light distribution angle of the lighting device 90.

In order to allow for the role of controlling a luminous color of the light emitting device 11, the globe 30 is provided with a phosphor or a light diffuser according to a luminous color of the light emitting device 11. In detail, in a case in which the light emitting device 11 is an LED emitting blue light, the globe 30 may be formed of a material containing a phosphor or may have a surface coated with a phosphor. A wavelength of light output from the light emitting device 11 and arriving at the globe 30 is converted by the phosphor of the globe 30 to emit white light.

Here, light wavelength-converted by the phosphor has a high degree of light diffusion, so even in the case that light distribution of light output from the light emitting device 11 is insufficient, a desirable light distribution may be obtained by light diffusion when light is emitted by the phosphor. Thus, a problem of the related art in which a globe is formed of a material having a high degree of diffusion to broaden a light distribution angle only to result in a degradation of light transmittance such that a member such as the light emitting module within the globe seen therethrough may be resolved. Also, since the blue LED is combined with a phosphor, light having characteristics close to those of natural light may be emitted.

In order to further broaden the light distribution angle of the lighting device 90, the globe 30 may be formed of a material further containing a light diffuser in addition to the phosphor, or a light diffuser may be further coated on the surface of the globe 30 in addition to the phosphor.

Meanwhile, in a case in which the light emitting device 11 is an LED emitting white light, the globe 30 may be formed of a material containing a light diffuser or may have a surface coated with a light diffuser. Also, in this case, the light output from the light emitting device 11 may be diffused from the surface of the globe 30 by the light diffuser, thus broadening a light distribution angle of the lighting device 90.

Figure 6:
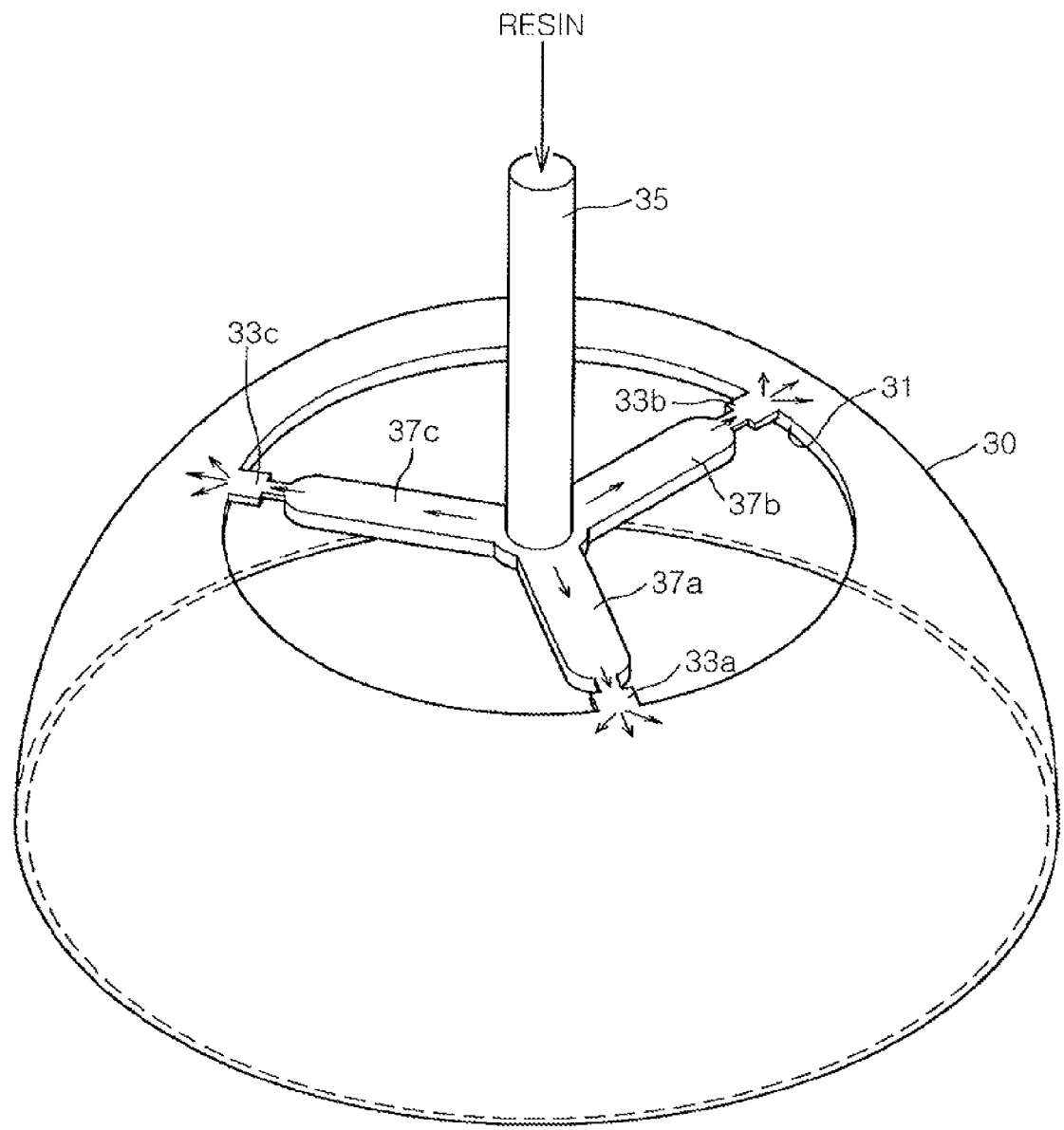
FIG. 6 is a view illustrating a method of molding a globe according to the first example embodiment.

A characteristic configuration of the globe 30 according to the present example embodiment will be described with reference to FIGS. 4 and 6. FIG. 6 is a view illustrating a method of molding the globe 30 formed of a resin material according to the present example embodiment.

As illustrated in FIG. 4, the globe 30 according to the present example embodiment has protrusions 33a, 33b, and 33c respectively combined with the notch portions 13a, 13b, and 13c of the light emitting device board 13 as described above. The protrusions 33a, 33b, and 33c are formed by retaining at least a portion of a gate unit used in molding the globe 30, rather than cutting it away. The protrusions 33a, 33b, and 33c are installed along the circumference of an opening 31 formed in the globe 30 (end portion of the side connected to the light emitting device board 13). In this manner, in the present example embodiment, since the gate unit used in molding a resin is used, the material of the globe 30 is the resin.

Here, a method of molding the globe 30 will be described with reference to FIG. 6. Meanwhile, FIG. 6 illustrates an example of a spoke gate appropriate for allowing the globe 30 to have a substantially globular shape. As illustrated in FIG. 6, when the globe 30 is molded, a melted resin is injected from a nozzle, and the resin passes through a sprue 35, runners 37a, 37b, and 37c (the amount of runners is not limited to three), and passes through gates 33a, 33b, and 33c as inlets with respect to a cavity part (frame) which becomes a molded part. Various types of gate are provided, and among them, the most appropriate gates are selected to obtain a product having desired exterior qualities, strength, precision, and any other purposes.

The gates 33a, 33b, and 33c prevent a back flow by blocking a flow path until when the molten resin introduced to the molding frame of the globe 30 is cooled and solidified, and reduce residual stress such as a deformation, breaking, warping, or the like, of the molded part occurring in the vicinity of the gates 33a, 33b, and 33c. In general, after the resin molding, the gates are cut away by using a gate cutter, or the like. The gate portions which are useless after molding may be formed to be as small as possible. In particular, in the case in which the gates are formed along the circumference of the circular opening 31 as illustrated in FIG. 6, if the gates have a relatively large width (width D in FIG. 4), it may be difficult to cut away the gate portions not to be retained. Conversely, if the gates are formed to have an excessively small width, a flow speed at the gate portions is lowered to easily cause defective molding such as welding, a gate flow, or the like, which leads to a degradation of quality of a product.

In contrast, in the present example embodiment, as illustrated in FIG. 4, at least a portion of the gates 33a, 33b, and 33c used in molding the globe 30 is left (in the example of FIG. 4, all of the gates 33a, 33b, and 33c are left), and the left gates 33a, 33b, and 33c are used as the positioning protrusions (ribs) 33a, 33b, and 33c with respect to the light emitting device board 13, as is. Namely, since the gates 33a, 33b, and 33c are not required to be cut away, even though the gates 33a, 33b, and 33c have a large width D, the problem in which the gates are difficult to cut away does not arise. Also, since the gates 33a, 33b, and 33c have the large width D, occurrence of defective molding such as welding, a gate flow, or the like, may be prevented. Thus, a degree of freedom of a size and a shape of the gates 33a, 33b, and 33c may be enhanced. In particular, in the case in which the gates 33a, 33b, and 33c are formed along the circumference of the circular opening 31, the effect is significant.

In this manner, since degrees of freedom in terms of the size and the shape of the gates 33a, 33b, and 33c are enhanced, fluidity of the resin in the gate portions may be improved in molding the globe 30 and defective molding such as welding, a gate flow, or the like, is reduced, and thus, product quality of the globe 30 may be enhanced.

Also, in order to evenly supply the resin to the frame in molding the globe 30, preferably, the gates 33a, 33b, and 33c are disposed at equal intervals. In this case, the protrusions 33a, 33b, and 33c of the globe 30 may also be disposed at equal intervals as a matter of course.

Also, since the gates 33a, 33b, and 33c are used as the positioning protrusions 33a, 33b, and 33c with respect to the light emitting device board 13 and also as protrusions 33a, 33b, and 33c for fixing a rotation of the globe 30, as is, a space for newly installing a member such as a positioning and rotation fixing rib, or the like, may be omitted in the globe 30.

Also, in the present example embodiment, two or more protrusions 33a, 33b, and 33c need to be installed. In this manner, by installing the plurality of protrusions 33a, 33b, and 33c for positioning with respect to the light emitting device board 13 and fixing a rotation of the globe 30, precision of positioning of the globe 30 may be enhanced. In terms of enhancement of precision of positioning of the globe 30, preferably, three or more protrusions are provided, but in this case, since a space spare for installing the globe 30 on the light emitting device board 13 is eliminated, the number of protrusions may be appropriately determined according to the purpose of the lighting device 90.

(Heat Dissipation Plate 70)

The heat dissipation plate 70 is installed to be in contact with both the light emitting device board 13 and the housing 20, and serves to transmit heat mainly generated by the light emitting module 10 to the housing 20. The heat dissipation plate 70 is formed of a metal having a high degree of thermal conductivity such as aluminum, copper, or the like, to implement the role of heat transmission.

Figure 7:
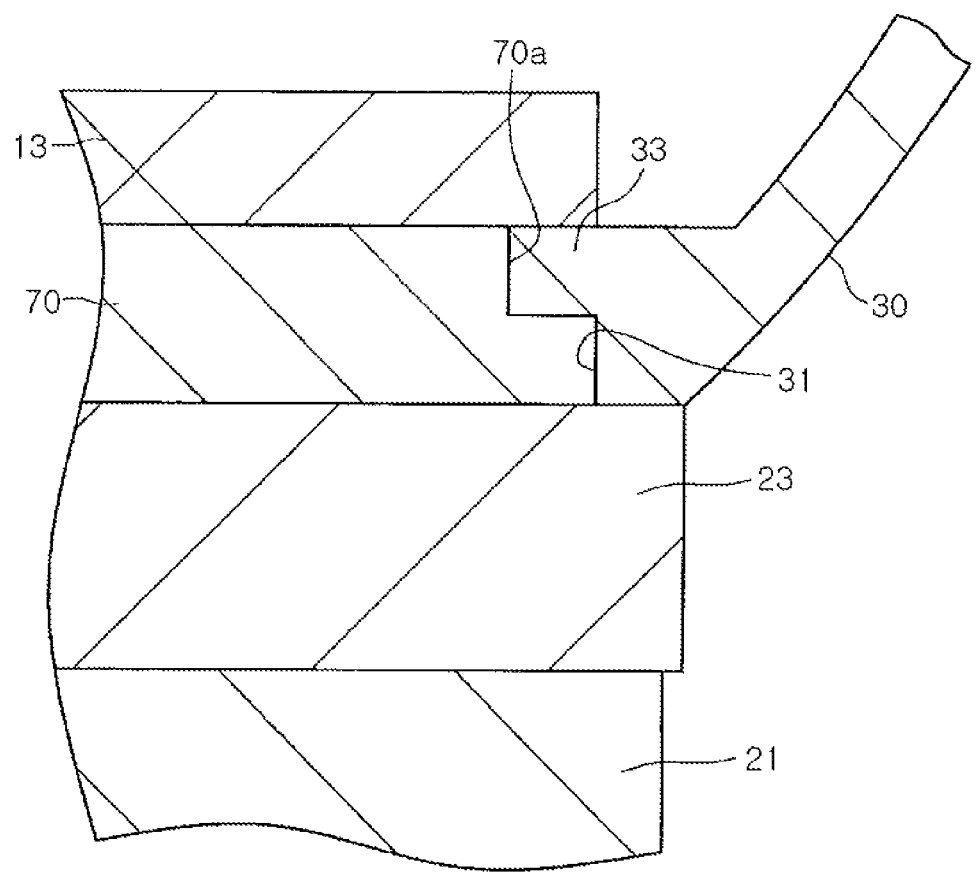
FIG. 7 is a partial cross-sectional view illustrating a modified example of a lighting device according to the present example embodiment, as a configuration corresponding to portion 'P' of FIG. 2.

Also, in the lighting device 90 according to the present example embodiment, the notch portions combined with the protrusions 33a, 33b, and 33c of the globe 30 may be installed in the heat dissipation plate 70 as illustrated in FIG. 7, rather than in the light emitting device board 13. In this case, since positioning is made between the globe 30 and the heat dissipation plate 70, the light emitting device board 13 may need to be fixed to the heat dissipation plate 70 by screw fixing, or the like.

Meanwhile, the notch portions combined with the protrusions 33a, 33b, and 33c of the globe 30 may be installed in both of the heat dissipation plate 70 and the light emitting device board 13, but in this case, positioning needs to be made among three members of the globe 30, the light emitting device board 13, and the heat dissipation plate 70, potentially making assembling slightly complicated.

Also, if heat dissipation efficiency of the lighting device 90 is sufficiently high and precision of positioning between the light emitting device board 13 and the globe 30 is secured, the heat dissipation plate 70 may not necessarily be installed.

(Other Components)

The lighting device 90 according to the present example embodiment may include any other member as needed. For example, in order to enhance light distribution characteristics of the lighting device 90, the lighting device 90 may have a reflector (not shown) for reflecting light output from the light emitting device 11 to distribute light in a direction toward the socket.

So far, the example embodiment of the present disclosure has been described in detail with reference to the accompanying drawings, but the present example embodiment may be variously modified in the implementation thereof. For example, in the aforementioned example embodiment, the cross-sections taken in the direction perpendicular with respect to a central axis of the light emitting device board 13, the housing 20, the globe 30, and the heat dissipation plate 70 has a circular shape, but the present disclosure is not limited thereto. For example, a each of the members may have a polygonal or oval cross-sectional shape.

Also, in the aforementioned example embodiment, only the single light emitting device group including a plurality of light emitting devices 11 disposed in an annular arrangement on the light emitting device board 13 is provided, but the present disclosure is not limited thereto. For example, a plurality of light emitting groups may be installed in a concentric circle on the light emitting device board 13.

<Second Example Embodiment>

[Configuration of Lighting Device According to Second Example Embodiment]

Figure 8A:
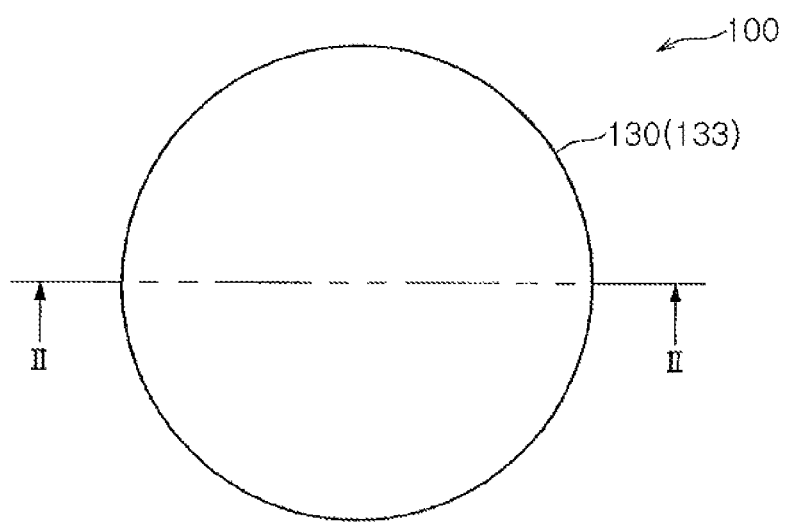
FIG. 8A is a top view A and FIG. 8B is a front view B illustrating an overall configuration of a lighting device according to a second example embodiment of the present disclosure.
Figure 8B:
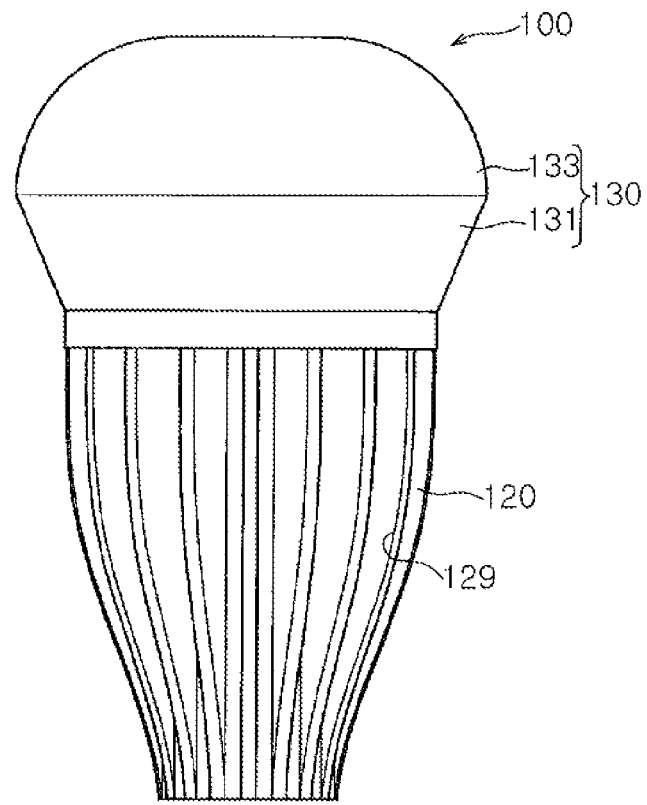
Figure 9:
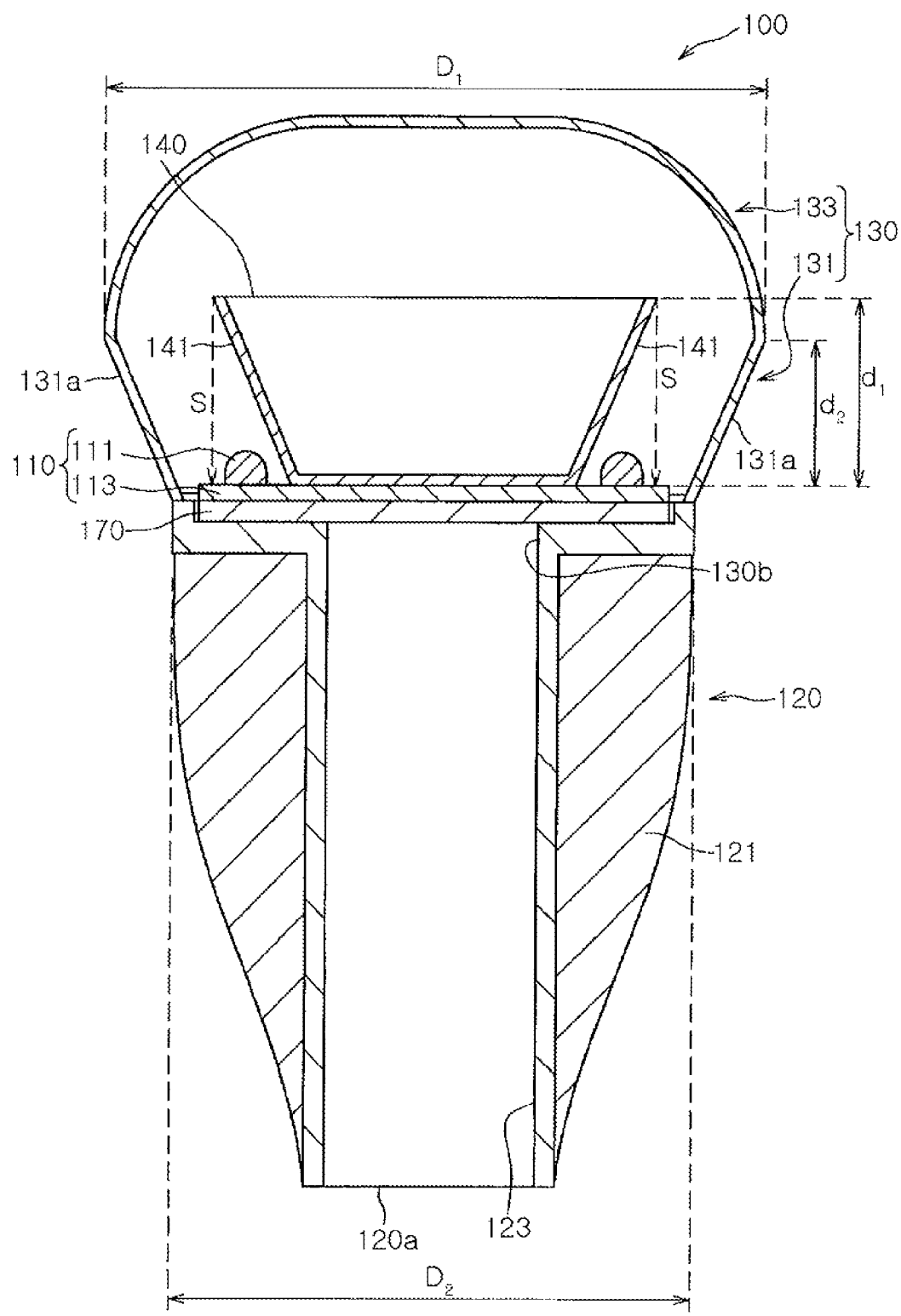
FIG. 9 is a cross-sectional view of the lighting device according to the second example embodiment of the present disclosure, taken along line II-II of FIG. 8A.
Figure 10:
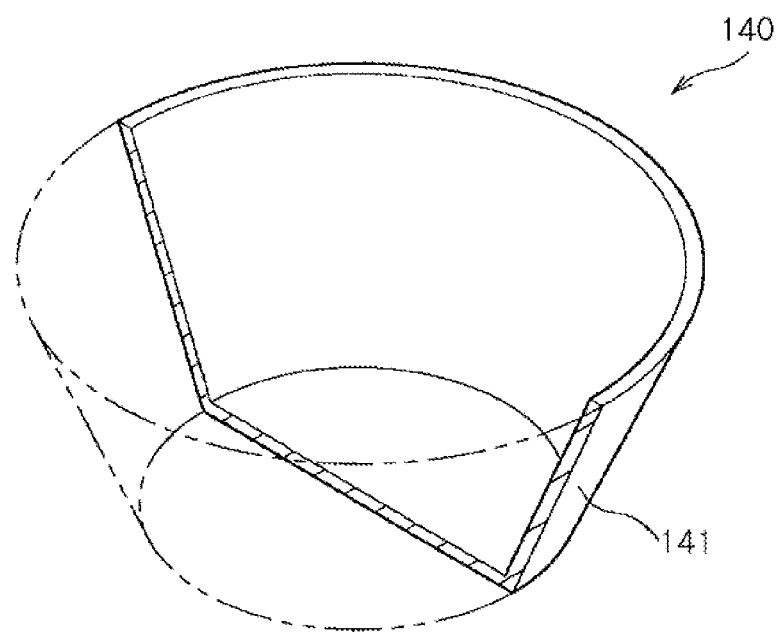
FIG. 10 is a cross-sectional perspective view of a partial notch illustrating a configuration of a reflector according to the second example embodiment of the present disclosure.
Figure 11:
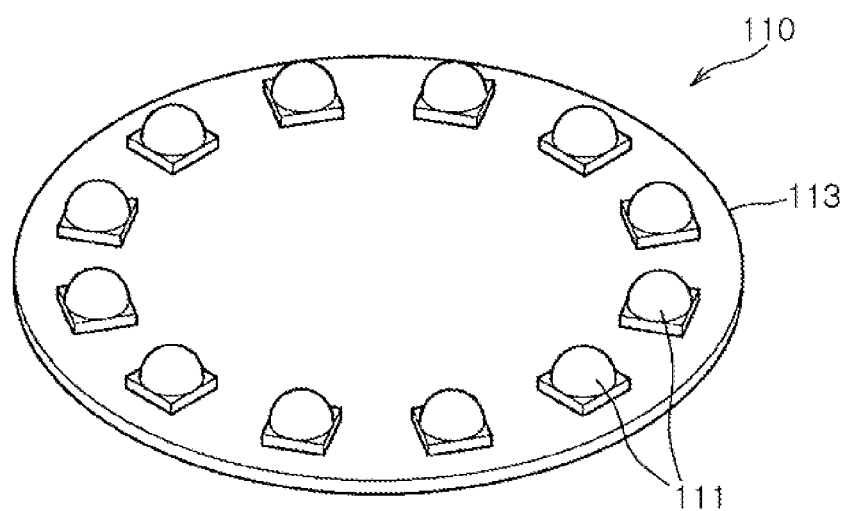
FIG. 11 is a perspective view illustrating a configuration of a light emitting module according to the second example embodiment of the present disclosure.

A configuration of a lighting device according to a second example embodiment of the present disclosure will be described in detail with reference to FIGS. 8 through 11. FIG. 8A is a top view and FIG. 8B is a front view illustrating an overall configuration of a lighting device according to a second example embodiment of the present disclosure. FIG. 9 is a cross-sectional view of the lighting device according to the second example embodiment of the present disclosure, taken along line II-II of FIG. 8A. FIG. 10 is a cross-sectional perspective view of a partial notch illustrating a configuration of a reflector according to the second example embodiment of the present disclosure. FIG. 11 is a perspective view illustrating a configuration of a light emitting module according to the second example embodiment of the present disclosure.

As illustrated in FIGS. 8 and 9, a lighting device 100 according to the present example embodiment includes a light emitting module 110, a housing 120, a reflector 140, a globe 130, and a heat dissipation plate 170.

(Light Emitting Module 110)

The light emitting module 110 is a member including a light emitting device 111 and a light emitting device board 113 and is a light source of the lighting device 100.

The light emitting device 111 is a semiconductor light emitting device such as a light emitting diode (LED), or the like, and outputs light. A luminous color of the light emitting device 111 may vary according to a material of the globe 130 as described hereinafter. In detail, in a case in which the globe 130 is formed of a material (resin, or the like) containing a phosphor, the light emitting device 111 is an LED (for example, a blue LED) emitting light exciting the phosphor, and a wavelength of light is converted in the globe 130 to emit white light.

Meanwhile, in a case in which the globe 130 is formed of a material (resin, or the like) containing a light diffuser, the light emitting device 111 emits white light (6500K to 20000K). Light output from the light emitting device 111 is reflected by the reflector 140 or directly reaches the globe 130 and diffused from the globe 130 so as to be emitted outwardly.

Also, as illustrated in FIG. 11, the light emitting device 111 is provided in plural, and the plurality of light emitting devices 111 are disposed in an annular arrangement on one surface of the light emitting device board 113. Here, the annular arrangement includes an oval annular arrangement and a polygonal annular arrangement, as well as a circular annular arrangement as illustrated in FIG. 11.

The light emitting device board 113 may be a board on which the light emitting device 111 is mounted, and preferably, the light emitting device board 113 may be formed of a material having a high degree of conductivity such as aluminum, nickel, or the like, a glass composite CEM3, a ceramic, or the like. Accordingly, heat generated by the light emitting module 110 may be effectively transmitted to the housing 120 and heat dissipation efficiency of the lighting device 100 may be enhanced. A shape of the light emitting device board 113 is not particularly limited and, preferably, the light emitting device board 113 may have a substantially circular or polygonal shape in order to satisfy the aforementioned ANSI standard.

Also, as the light emitting device board 113 is inserted between a lower portion of the reflector 140 and an upper portion of the housing 120 (or the heat dissipation plate 170), a position of the light emitting device board 113 is fixed.

(Housing 120)

The housing 120 functions as a housing in which a driving circuit (not shown) for driving the light emitting device 111 is accommodated. In the present example embodiment, a driving circuit may be installed within a hollow body portion of the housing 120.

Also, the housing 120 is connected to a socket (not shown) in one end thereof (a lower end in FIGS. 8 and 9), and serves as a so-called heat sink, dissipating heat generated by the light emitting module 110 and heat generated by the driving circuit. In order to implement the heat dissipation function, the housing 120 may be formed of a resin having a high degree of thermal conductivity. In the present example embodiment, the housing 120 is formed of a resin, rather than a metal, so as to reduce a weight of the lighting device 100 and, also, since the resin has insulating properties, there is no need to take measures for insulation in a caulking portion when the housing is connected to a socket. Thus, in a case in which an increase in weight of the lighting device 100 is not problematic, a metal such as aluminum, copper, or the like, may be used as a material of the housing 120. However, in the case in which the housing 120 is formed of a metal, insulation measures need to be taken in the caulking portion of the socket.

Also, in order to further increase the heat dissipation effect, a recess may be formed in a surface of the housing 120 or a plurality of fins may be installed in a surface of the housing 120 to increase a surface area of the housing 120.

In this respect, in the present example embodiment, the housing 120 may have a plurality of fins 129 formed in an outer circumferential surface of a substantially hollow vessel-like body portion with openings 120a and 120b formed in both ends thereof. With the plurality of fins 129, a surface area of an outwardly exposed surface of the housing 120 (an area of the surface used to dissipate heat) may be increased to enhance a heat dissipation effect. Meanwhile, alternatively, in order to enhance the heat dissipation effect, for example, a plurality of recesses (not shown) may be formed in the outer circumferential surface of the body portion of the housing 120, in addition to the fins 129.

Also, the housing 120 is installed on one side (on the side where the light emitting device 111 is not disposed) of the light emitting device board 113 based on a ring configured according to a disposition of the light emitting device 111 in a central axis direction, as a reference. Accordingly, the housing 120 may dissipate heat generated by the driving circuit or the light emitting module 110, outwardly therefrom.

Also, in the present example embodiment, the housing 120 includes a resin 121 and a metal member 123 insertedly positioned within the resin 121. The housing 120 is formed by integrally insert-molding the metal member 123 with the resin 121. This is because, the resin 121 alone has low thermal conductivity, relative to a metal such as aluminum, copper, or the like, and thus, in order to increase thermal conductivity, the metal member 123 such as aluminum, copper, or the like, is inserted into the resin 121. Thus, if heating of the light emitting module 110 or the driving circuit is suppressed through management of performance thereof to have a sufficient heat dissipation effect, the metal member 123 may not need to be inserted.

Also, in the case of inserting the metal member 123, preferably, the metal member 123 is disposed to be in contact with the heat dissipation plate 170 (without the heat dissipation plate 170, the metal member 123 is disposed to be in contact with the light emitting device board 113) in order for heat generated by the light emitting module 110 to be easily transmitted to the housing 120.

(Reflector 140)

The reflector 140 is supported by a surface of the light emitting device board 113 in which the light emitting device 111 are disposed (hereinafter, referred to as a "surface of the light emitting device 111"), and reflects light output from the light emitting device 111. In the present example embodiment, the reflector 140 is formed of a material having a high level of light reflectivity and serves to reflect light from the light emitting device 111 in a direction toward a socket (in a direction toward the housing 120) and expand a light distribution angle (or a beam angle) of the lighting device 100 in the direction toward the socket.

In order to implement such a function, the reflector 140 has a reversed circular truncated conical shape. Namely, as illustrated in FIGS. 9 and 10, the reflector 140 is installed to be protruded from the surface of the light emitting device board 113 on the light emitting device 111 side such that the reflector 140 has a diameter increased in a direction away from the light emitting device board 113, forming a circular truncated conical shape. Also, a lateral circumferential surface of the reflector 140 having the circular truncated conical shape is formed as a reflective surface 141 from which light output from the light emitting device 111 is reflected. Thus, only the reflective surface 141 of the reflector 140 may be formed of a material having a high degree of light reflectivity and other portions thereof may be formed of a material without light reflectivity.

Also, as indicated by the arrows S of FIG. 9, when the reflector 140 is projected from a position where the diameter of the reflector 140 is extended (in the example of FIG. 9, from the upper side of the reflector in a vertical direction) to the light emitting device board 113, preferably, at least a portion of the light emitting device 111 exists within the projection region. By setting the positional relationship between the reflector 140 and the light emitting device 111 in this manner, light output from the light emitting device 111 may mostly reach the reflective surface 141 of the reflector 140, and accordingly, a proportion of emitted light in the direction toward the socket may be increased. Thus, a light distribution angle of the lighting device 100 may be expanded.

(Globe 130)

The globe 130 has a substantially globular shape to cover the light emitting module 110 and the reflector 140 and serves to control a color of light (luminous color of the light emitting device 111) output from the light emitting device 111, or light reflected from the reflector 140, and diffuse light from a surface thereof to broaden a light distribution angle of the lighting device 100.

In order to allow for the role of controlling a luminous color of the light emitting device 111, the globe 130 includes a phosphor or a light diffuser according to a luminous color of the light emitting device 111. In detail, in a case in which the light emitting device 111 is an LED emitting blue light, the globe 130 may be formed of a material containing a phosphor or may have a surface coated with a phosphor. For example, in a case in which the globe 130 is formed of a resin, the resin may contain fluorescent pigment, or in a case in which the globe 130 is formed of glass, the globe 130 may have a surface coated with fluorescent pigment. A wavelength of light reflected by the reflector 140 or output from the light emitting device 111 and arriving at the globe 130 is converted by the phosphor of the globe 130 to emit white light.

Here, light wavelength-converted by the phosphor has a high degree of light diffusion, so even in the case that light distribution of light reflected by the reflector 140 is insufficient, a desirable light distribution may be obtained by light diffusion when light is emitted by the phosphor. Thus, a problem of the related art in which a globe is formed of a material having a high degree of diffusion to broaden a light distribution angle only to result in a degradation of light transmittance such that a member such as the light emitting module within the globe is seen therethrough may be resolved. Also, since the blue LED is combined with a phosphor, light having characteristics close to those of natural light may be emitted.

Also, in order to further broaden the light distribution angle of the lighting device 100, the globe 130 may be formed of a material further containing a light diffuser in addition to the phosphor, or a light diffuser may be further coated on the surface of the globe 130 in addition to the phosphor.

Meanwhile, in a case in which the light emitting device 111 is an LED emitting white light, the globe 130 may be formed of a material containing a light diffuser or may have a surface coated with a light diffuser. Also, in this case, light output from the light emitting device 111, or light reflected from the reflector 140, may be diffused from the surface of the globe 130 by the light diffuser, thus broadening a light distribution angle of the lighting device 100.

In order to broaden the light distribution angle of the lighting device 100, as illustrated in FIG. 9, a maximum diameter $D_1$ of the globe 130 needs to be greater than a maximum diameter $D_2$ of the housing 120. If the maximum diameter D2 of the housing 120 is too large, relative to the maximum diameter D1 of the globe 130, a region from which light is emitted in the direction toward the socket from the surface of the globe 130 is blocked by the housing 120 is increased, reducing the light distribution angle of light in the direction of the socket.

Here, as illustrated in FIGS. 8 and 9, the globe 130 according to the present example embodiment includes two portions; namely, a globe neck portion 131 and a globe head portion 133. The globe neck portion 131 and the globe head portion 133 may be separately formed to integrally formed, physically.

(Globe Neck Portion 131)

The globe neck portion 131 is a portion of the globe 130 connected to the housing 120 and having a sloped surface 131a according to the slope of the reflective surface 141 of the reflector 140. Since the globe neck portion 131 has the sloped surface 131a sloped according to the reflective surface 141 of the reflector 140, light output from the light emitting device 111 and reflected from the reflective surface 141 may easily reach the globe neck portion 131, increasing an amount of light distributed in the direction of the socket. This effect may be particularly conspicuous when the reflective surface 141 of the reflector 140 and the sloped surface 131a of the globe neck portion 131 are substantially parallel. Thus, preferably, the reflective surface 141 of the reflector 140 and the sloped surface 131a of the globe neck portion 131 are substantially parallel.

Also, as illustrated in FIG. 9, preferably, a length d1 in a central axis direction of the ring configured according to the disposition of the light emitting devices 111 in the reflector 140 is greater than a length d2 in a central axis direction of the globe neck portion 131. Since the shape and the positional relationship between the reflector 140 and the globe neck portion 131 are formed in this manner, a proportion of light output from the light emitting device 111 to reach the sloped surface 131a of the globe neck portion 131 may be increased, thus increasing an amount of light distributed in the direction toward the socket.

Meanwhile, an opening (not shown) is formed in a lower portion of the globe neck portion 131 (an end portion of the globe neck portion opposite to the side connected to the globe head portion 133), and the globe neck portion 131 may be connected to the housing 120 in the opening.

(Globe Head Portion 133)

The globe head portion 133 is a substantially hemispherical portion connected to the globe neck portion 131. The globe head portion 133 mainly diffuses light which has been output from the light emitting device 111 and directly reached the globe 130, without contacting the reflector 140. While the globe neck portion 131 serves to increase an amount of light distributed in the direction toward the socket, the globe head portion 133 serves to increase an amount of light distributed in a direction toward a top portion of the globe 130.

(Others)

A structure for diffusing light may be installed on a surface of the globe 130. As the structure for diffusing light, for example, a concavo-convex surface formed on the surface of the globe 130 may be considered. In this case, the concavo-convex surface may have a random structure or a regular structure.

(Heat Dissipation Plate 170)

The heat dissipation plate 170 is installed to be in contact with both of the light emitting device board 113 and the housing 120 and mainly serves to transmit heat generated by the light emitting module 110 to the housing 120. In order to implement the role of heat transmission, the heat dissipation plate 170 may be formed of a metal having a high degree of thermal conductivity, such as aluminum (Al), copper (Cu), or the like.

Also, a pin (not shown) for preventing an error of position of the reflector 140 may be installed in the heat dissipation plate 170, and in this case, the heat dissipation plate 170 may serve as a reference of positions of the light emitting device board 113, the reflector 140, and the globe 130, as well as serving to transmit heat.

Meanwhile, if heat dissipation efficiency of the lighting device 100 is sufficiently high and precision of positioning among the light emitting device board 113, the reflector 140, and the globe 130 is secured, the heat dissipation plate 170 may not be installed.

[Operational Effect of Lighting Device According to Second Example Embodiment]

Figure 12:
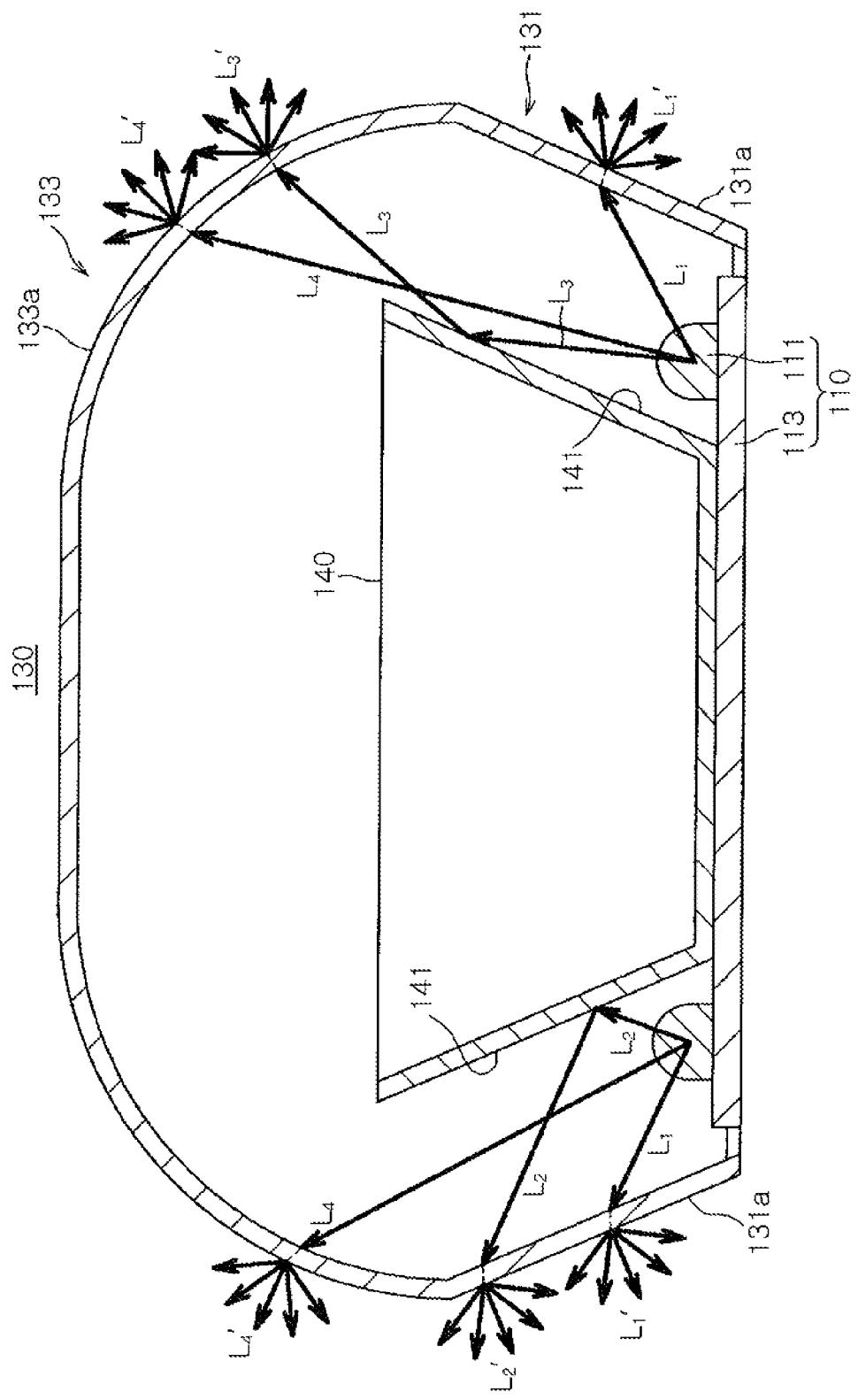
FIG. 12 is a view illustrating directionality of light in the lighting device according to the second example embodiment of the present disclosure.

Next, an operational effect, namely, an effect of enhancing light distribution characteristics, of the lighting device 100 according to the present example embodiment will be described with reference to FIG. 12. FIG. 12 is a view illustrating directionality of light in the lighting device 100 according to the present example embodiment.

In the lighting device 100 according to the present example embodiment, as illustrated in FIG. 12, light output from the light emitting device 111 mainly passes through four paths. A first path is a path L1 along which light emitted from the light emitting device 111 directly reaches the globe neck portion 131. A second path is a path L2 along which light emitted from the light emitting device 111 is reflected from the reflective surface 141 of the reflector 140 to reach the globe neck portion 131. A third path is a path L3 long which light emitted from the light emitting device 111 is reflected from the reflective surface 141 of the reflector 140 to reach the globe head portion 133. A fourth path is a path L4 along which light emitted from the light emitting device 111 directly reaches the globe head portion 133.

In the case of passing along the first path, light L1 output from the light emitting device 111 may directly be made incident to the globe neck portion 131, without contacting the reflector 140 and diffused from a surface of the globe neck portion 131. Diffused light L1' is diffused in various directions (mainly from a horizontal direction to the socket direction). As described above, in a case in which the light emitting device 111 is a blue LED and the globe 130 contains a phosphor or in a case in which the surface of the globe 130 is coated with a phosphor, a degree of light diffusion is high, and thus, the diffused light L1' may be diffused in a wider range. Also, in a case in which the globe 130 contains a light diffuser or in a case in which the surface of the globe 130 is coated with a light diffuser, a diffusion range of the diffused light L1' may be increased (this is the same hereinafter).

In case of passing along the second path, light L2 output from the light emitting device 111 is reflected from the reflective surface 141 of the reflector 140, and the reflective light L2 is made incident to the global neck portion 131 and diffused from a surface of the globe neck portion 131. The diffused light L2' is emitted in various directions.

Here, as described above, the reflector 140 has the reversed circular truncated conical shape, the globe neck portion 131 has the sloped surface 131a in accordance with the reflective surface 141 of the reflector 140, and the maximum diameter D1 of the globe 130 is greater than the maximum diameter D2 of the housing 120. Thus, when light output from the light emitting device 111 passes along the first and second paths, light output from the light emitting device 111 may be emitted in the direction toward the socket. Namely, since the reflector 140 has the reversed circular truncated conical shape having a diameter increased in a direction away from the light emitting device board 113 (in a direction opposite to the direction of the socket) and the lateral circumferential surface of the reflector 140 is the light reflective surface 141, light L2 output from the light emitting device 111 may be reflected by the light reflective surface 141 from a horizontal direction to the direction toward the socket, and the reflective light L2 may be further diffused from the globe neck portion 131. During the light diffusion, since the maximum diameter D1 of the globe 130 is greater than the maximum diameter D2 of the housing 120, the housing 120 does not block the diffused light L1' and L2' diffused from the surfaces of the globe neck portion 131, the diffused light L1' and L2' may be emitted in a wider range from the horizontal direction to the direction toward the socket. Also, since the globe neck portion 131 has the sloped surface 131a which is configured such that a diameter thereof is increased in accordance with the reflective surface 141 as the sloped surface 131a is spaced apart from the light emitting device board 113, it is easy to distribute light L1 and L2 that has reached the globe neck portion 131, from the horizontal direction to the direction toward the socket. In particular, in a case in which the reflective surface 141 of the reflector 140 and the sloped surface 131a of the globe neck portion 131 are substantially parallel, light L2 may easily reach the globe neck portion 131, and thus, light distribution in the direction toward the socket may be further increased.

Also, in case of passing along the third path, light L3 output from the light emitting device 111 is reflected from the reflective surface 141 of the reflector 140 and the reflected light L3 is made incident to the globe head portion 133 and diffused from a surface of the globe head portion 133. The diffused light L3' may be emitted in various directions.

In case of passing along the fourth path, light L4 output from the light emitting device 111 is directly made incident to the globe head portion 133, without contacting the reflector 140, and diffused from a surface of the globe head portion 133. Also, in this case, diffused light L4' is diffused in various directions.

Here, in the case in which light output from the light emitting device 111 passes along the first and second paths, a diffused amount of light in a direction toward the top portion of the globe 130 is smaller than that in the horizontal direction. However, since light output from the light emitting device 111 passes along the third and fourth paths, a diffused amount of light in the direction toward the top portion of the globe 130, relative to the horizontal direction, may be sufficiently secured.

As described above, in the lighting device 100 according to the present example embodiment, since light output from the light emitting device 111 passes along the four paths, a wide light distribution angle may be implemented. In detail, the lighting device 100 may accomplish very high light distribution characteristics with a difference in intensity of light emission of, for example, ±10% within a range of a light distribution angle of 300 deg, and thus, the lighting device 100 may have performance equal to that of an incandescent lamp, and thus, it may be used as a substitute of an incandescent lamp.

The effect of wide light distribution may be conspicuous when the length d1 in the central axis direction of the ring configured according to the disposition of the light emitting devices 111 in the reflector 140 is greater than the length d2 of the globe neck portion 131 in the central axis direction. When the light emitting device 111 is a semiconductor device such as an LED, or the like, it has strong directivity, so light output from the light emitting device 111 may easily take the third path L3 and the fourth path L4. However, in the case in which the length d1 in the central axis direction of the ring configured according to the disposition of the light emitting devices 111 in the reflector 140 is greater than the length d2 of the globe neck portion 131 in the central axis direction, light output from the light emitting device 111 may easily take the second path L2, and thus, light distribution in the direction toward the socket from the horizontal direction may be increased. Thus, light distribution may be easily designed such that a large amount of light may be stably obtained within a wider range.

So far, the example embodiment of the present disclosure has been described, but the present example embodiment may be variously modified and implemented. For example, in the aforementioned example embodiment, the cross-sections of the light emitting device board 113, the reflector 140, the globe 130, and the heat dissipation plate 170 taken in a direction perpendicular with respect to the central axis C have a circular shape, but the present disclosure is not limited thereto. For example, a cross-section of each member may have a polygonal or oval shape.

Also, in the aforementioned example embodiment, only a single light emitting device group configured by disposing the plurality of light emitting devices 111 in an annular arrangement on the light emitting device board 113 is provided, but the present disclosure is not limited thereto. For example, a plurality of light emitting device groups may be installed in a concentric shape.

<Third Example Embodiment>

[Configuration of Lighting Device According to Third Example Embodiment]

Figure 13:
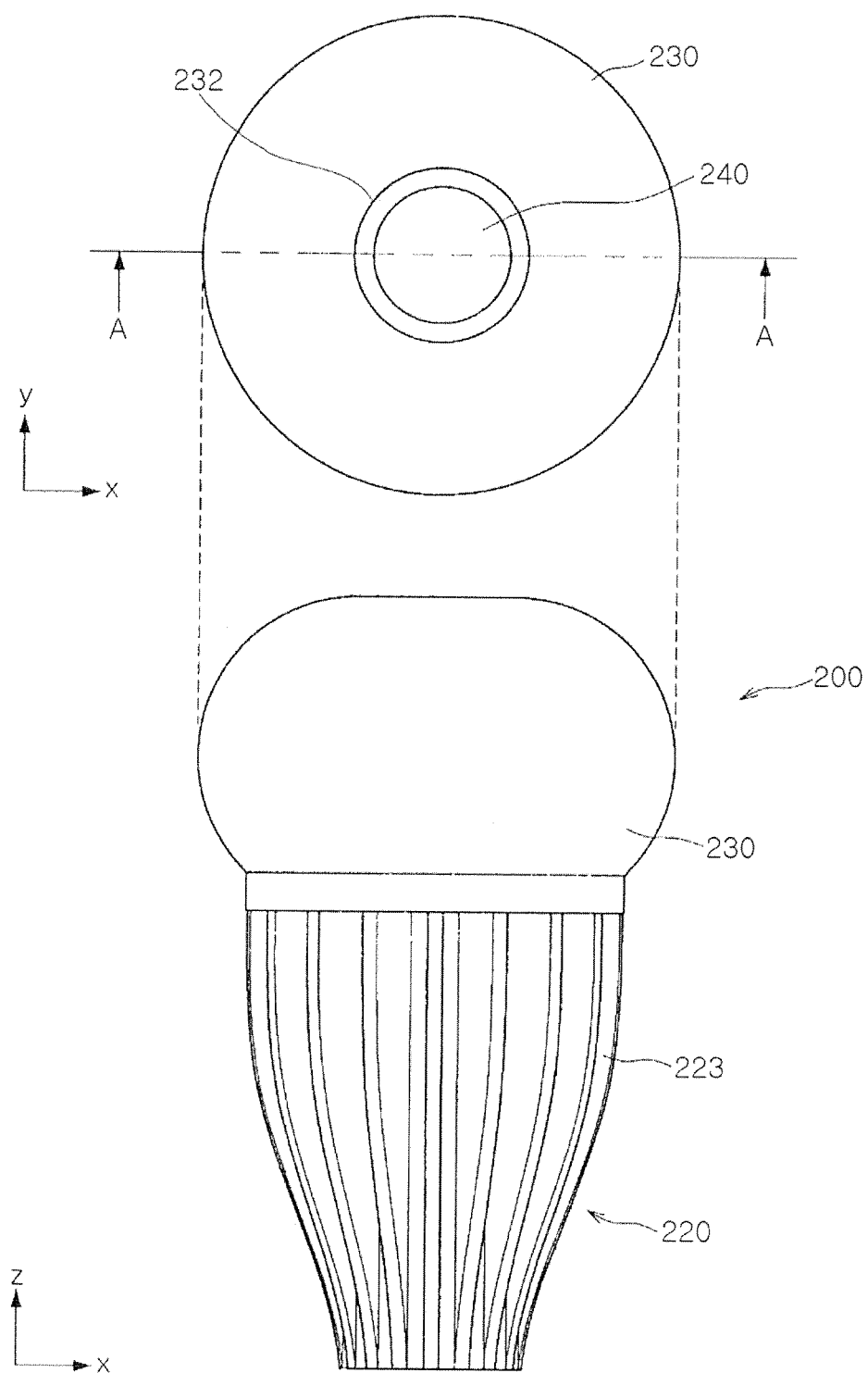
FIG. 13 includes a plan view and a side view illustrating a lighting device regarding a third example embodiment of the present disclosure.

A configuration of a lighting device 200 regarding a third example embodiment of the present disclosure will be described with reference to FIGS. 13 and 14. FIG. 13 includes a plan view and a side view illustrating a lighting device regarding a third example embodiment of the present disclosure, and FIG. 14 is a cross-sectional view of the lighting device of FIG. 13 taken along line A-A.

Figure 14:
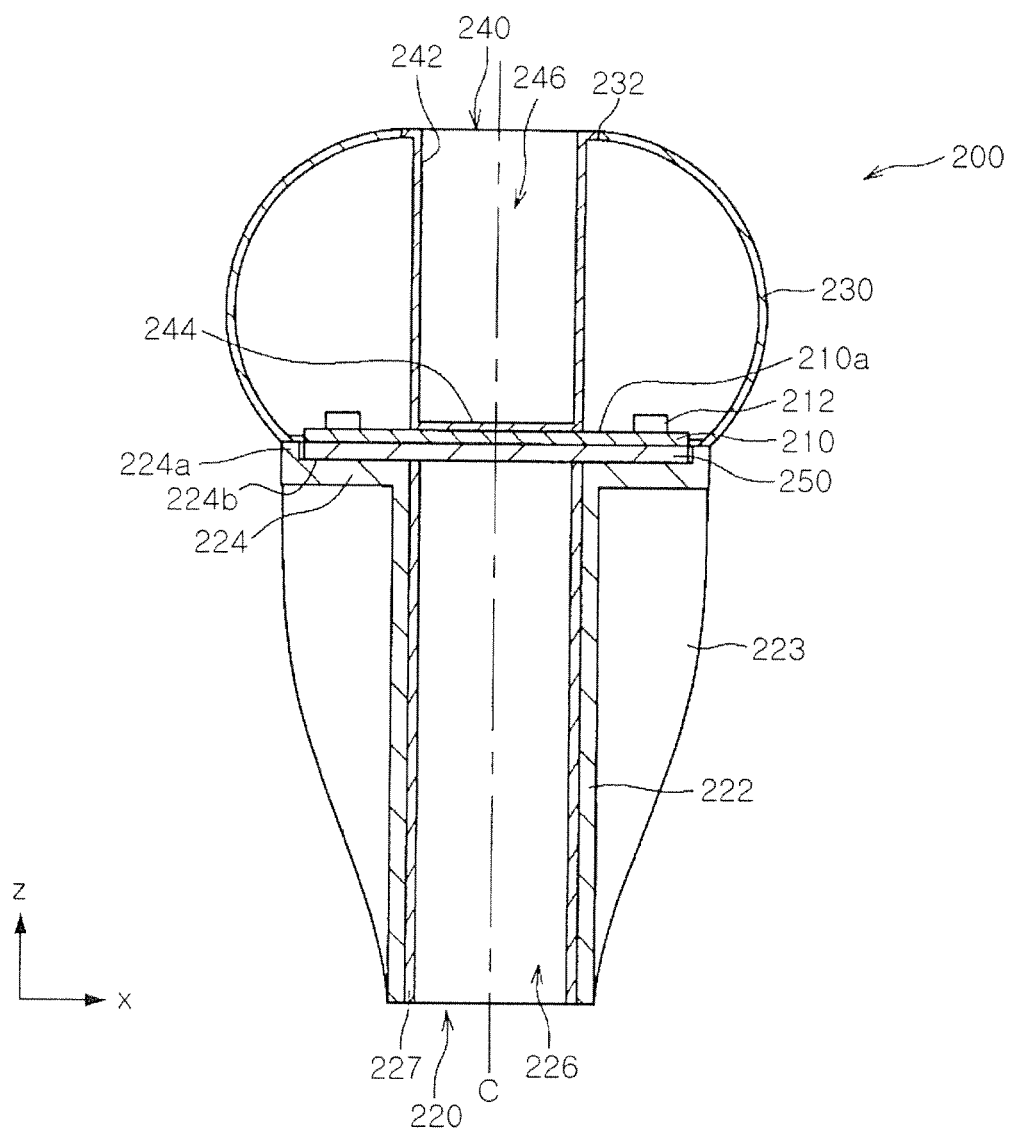
FIG. 14 is a cross-sectional view of the lighting device of FIG. 13 taken along line A-A.

As illustrated in FIGS. 13 and 14, the lighting device 200 according to the present example embodiment includes a light emitting device 212 outputting light, a light emitting device board 210 on which the light emitting device 212 is mounted, a first heat sink 220 in which the light emitting device board 210 is installed, a globe 230 covering the light emitting device board 210 installed in the first heat sink 220, and a second heat sink 240 installed in a central portion of the globe 230. A disk type metal board 250 is installed between the light emitting device board 210 and the first heat sink 220 in order to increase a heat dissipation effect.

As the light emitting device 212, for example, an LED may be used. In the lighting device 200 regarding the present example embodiment, a plurality of light emitting devices 212 (for example, twelve light emitting devices) may be disposed at equal intervals in an annular arrangement on the light emitting device board 210. The light emitting device board 210 may be, for example, an aluminum board, and the light emitting device board 210 has a disk shape to correspond to a shape of the first heat sink 220 fixed through a metal board 250. Also, in the present example embodiment, the light emitting devices 212 and the light emitting device board 210 having the light emitting devices 212 mounted thereon will be referred to as heating elements. The heating elements include at least the light emitting device 212, while the light emitting device board 210 may not necessarily be considered to be a heating element. Also, in addition to the heating elements including the light emitting devices 212, a power source circuit (not shown) may be a heat source of the lighting device 200.

The first heat sink 220 is a member for dissipating heat from heat sources of the lighting device 200. As illustrated in FIGS. 13 and 14, the first heat sink 220 includes a plurality of fins 223, a resin heat dissipation portion, formed on a cylindrical body portion 222. In the present example embodiment, in the heat sink 220, the body portion 222 and a flange portion 224 as described hereinafter are formed of a metal such as aluminum, or the like, and the fins 223 are formed of a resin material such as plastic, or the like. Namely, the first heat sink 220 is a composite member. A detailed configuration of the body portion 222 of the first heat sink 220 and operational effects obtained due to the formation of the composite member will be described hereinbelow.

A socket (not shown) is installed in an end portion of the fins 223, one end of the body portion 222 (end portion in a negative direction side of the z axis), and the flange portion 224 is installed in the other end of the body portion 222 (end portion in a positive direction side of the z axis) to maintain the light emitting device board 210. A rim portion 224a is formed in an outer circumference of the flange portion 224 and protruded from a side where the light emitting device board 210 is disposed in a direction in which the body portion 222 is elongated (basic axis (C): z direction) to surround the outer circumference of the light emitting device board 210. The light emitting device board 210 is disposed on an upper surface 224b of the flange portion 224 with the metal board 250 interposed therebetween. An aluminum board, for example, may be used as the metal board 250.

A power source circuit (not shown) may be installed in an inner space 226 of the body portion 222 of the first heat sink 220. In a case in which the body portion 222 is formed of a metal, a resin layer 227 formed of a resin material is installed in an inner surface of the body portion 222 in order to insulate the power source circuit from the body portion 222. Alternatively, in the case in which the body portion 222 is formed of a metal, the power source circuit may be accommodated in the inner space 226 through an insulating case (not shown) so as to be insulated from the body portion 222.

The first heat sink 220 dissipates heat from the heating element including the light emitting device 212 transmitted through the light emitting device board 210 and the metal board 250 from the light emitting device 212, and also dissipates heat from the power source circuit. By installing the plurality of fins 223 in the outer circumferential surface of the body portion 222, a heat dissipation area may be increased to enhance heat dissipation efficiency.

The globe 230 is a cover member covering the light emitting device board 210 installed in the first heat sink 220 and allowing light output from the light emitting device 212 to be transmitted therethrough. The globe 230 may be formed of, for example, glass, resin, or the like, having transmittance. The globe 230 is formed to have a substantially hemispherical curved surface and has an opening 232 formed in a central portion thereof. The center of the opening 232 lies on the basic axis C which passes through the center of the plurality of light emitting devices 212 disposed in an annular arrangement on the light emitting device board 210 and is perpendicular with respect to the light emitting device board 210. A second heat sink 240 is inserted into the opening 232.

The second heat sink 240 is a member dissipating heat from the heating element including the light emitting device 212. As illustrated in FIG. 14, the second heat sink 240 includes a cylindrical portion 242 and a bottom portion 244. One open end of the cylindrical portion 242 in the positive direction side of the z axis is connected to the opening 232 of the globe 230. The bottom portion 244 is installed to be in contact with an upper surface 210a of the light emitting device board 210 in order to easily transmit heat from the heating element. The second heat sink 240 may also be formed of a metal such as, for example, aluminum, or the like, and may be formed of a resin material such as plastic, or the like. By installing the second heat sink 240, a heat dissipation area may be further increased to enhance heat dissipation efficiency.

[Configuration of Heat Sink as Composite Member According to Third Example Embodiment]

As described above, the first heat sink 220 regarding the present example embodiment is a composite member including the body portion 222 and the flange portion 224 formed of a metal such as aluminum, or the like, and the pins 223, a heat dissipation portion, formed of a resin material such as plastic, or the like. Since the first heat sink 220 is configured as a composite member, high heat dissipation efficiency may be maintained and material costs may be reduced.

Here, a technique of forming a composite member formed of a metal and a resin material is disclosed in, for example, Patent Document 1 (Japanese Registration Patent No. 4541153) and Patent Document 2 (Japanese Registration Patent No. 4292514). However, in these disclosures, an insert-molded metal is anodized, limiting the metal to aluminum, so other metals may not be used.

Figure 15:
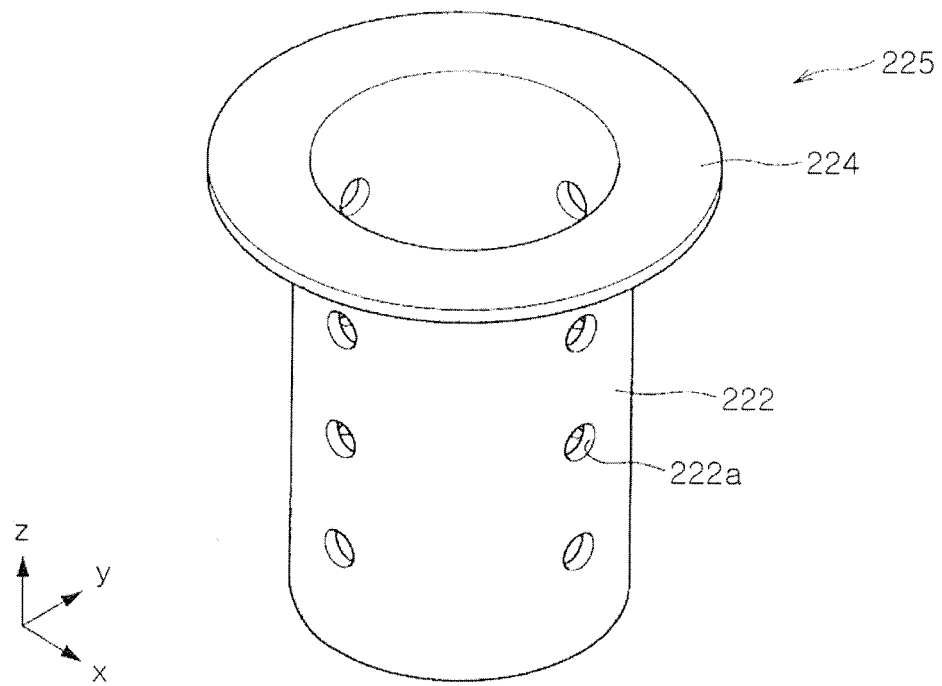
FIG. 15 is a perspective view illustrating a body portion and a flange portion formed of a metal in a first heat sink regarding the third example embodiment of the present disclosure.
Figure 16:
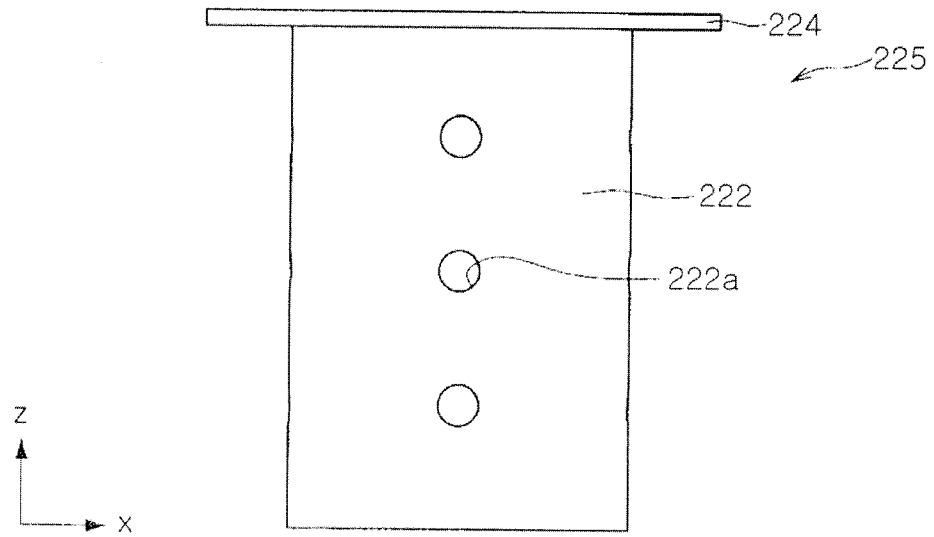
FIG. 16 is a side view of FIG. 15.

Thus, in the present example embodiment, in order to use other materials as well as aluminum, as metal materials for insert molding, as illustrated in FIGS. 15 and 16, a plurality of through holes 222a are formed as a holding portion in which a resin material and a metal material are held in the body portion 222 formed of a metal material.

FIG. 15 is a perspective view illustrating the body portion 222 and the flange portion 224 formed of a metal in the first heat sink 220 regarding the present example embodiment of the present disclosure. FIG. 16 is a side view of FIG. 15. Hereinafter, the body portion 222 and the flange portion 224 formed of a metal will be referred to as a metal unit 225. As illustrated in FIGS. 15 and 16. For example, three through holes 222a are formed in a length direction (z direction) and four through holes 222a are formed in a circumferential direction of the first heat sink 220 on the body portion 222 of the first heat sink 220 formed of a metal, totaling twelve through holes 222a. The through holes 222a are formed at equal intervals in the length direction and the circumferential direction.

When the fins 223 formed of a resin material and a surface portion (no reference numeral) covering an outer circumferential surface of the body portion 222 are insert-molded, in the present example embodiment, the resin material is introduced into the through holes 222a of the body portion 222, cooled, and solidified. Accordingly, adhesive strength between the metal material and the resin material is enhanced. Since the resin material introduced into the through hole 222a formed in advance is cooled and solidified to form a composite member, there is no need to perform a secondary surface treatment or secondary processing. Thus, manufacturing costs may be reduced.

By forming the through holes 222a in the body portion 222, insert molding may be performed without sacrificing fluidity of the resin material. Mechanical stress is generated in a junction between the metal material and the resin material in a refrigerating cycle of insert molding due to a difference in coefficients of linear expansion between the metal material and the resin material. However, in the present example embodiment, since the resin material is introduced into the through holes 222a formed in the body portion 222, shear strength of the resin material in the junction between the resin material introduced into the through holes 222a and the metal material may be sufficiently secured. Accordingly, product reliability may be sufficiently maintained.

Figure 17:
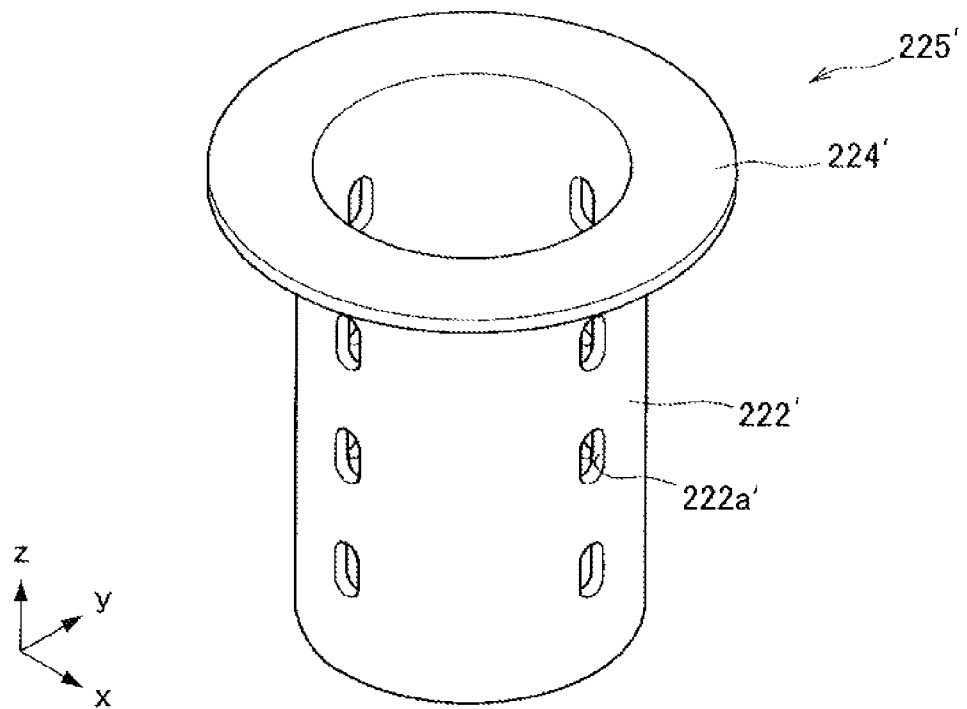
FIG. 17 is a perspective view illustrating a modified example of a metal unit of the first heat sink regarding the third example embodiment of the present disclosure.
Figure 18:
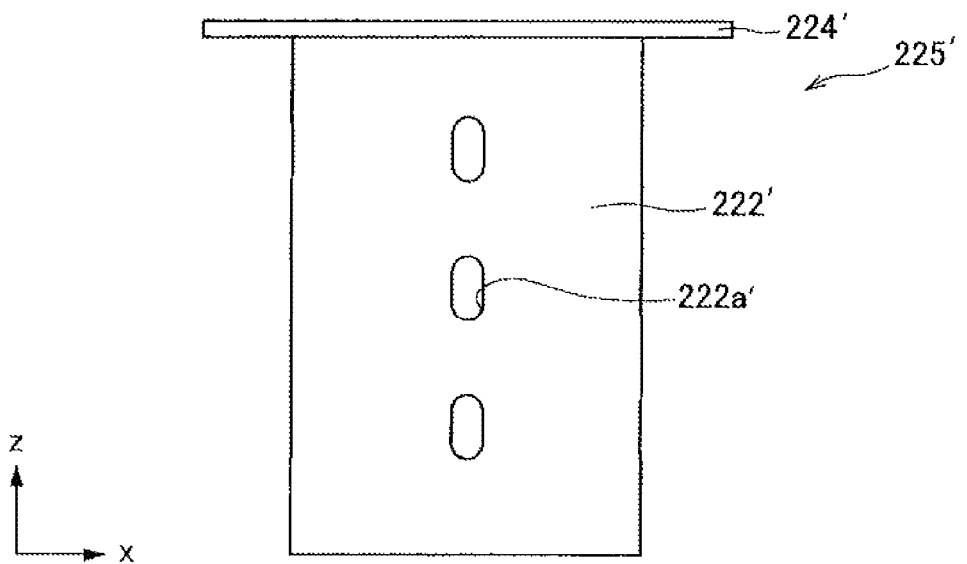
FIG. 18 is a side view of FIG. 17.

Here, in order to secure sufficient shear strength in the junction between the metal material and the resin material, as illustrated in FIGS. 17 and 18, preferably, through holes 222a' may have a substantially oval shape having a diameter greater in a length direction of a body portion 222' and in a direction of flow of the resin material. As illustrated in FIGS. 17 and 18, the through holes 222a' may not have an overall shape but have a polygonal shape having a diameter greater in the length direction of the body portion and the direction of flow of the resin material. Since the through holes 222a' have the substantially oval or polygonal shape having a diameter greater in the length direction of the body portion or the direction of flow of the resin material, even though burrs, or the like, may be generated when the through holes 222a' are formed in the metal material, a degradation of fluidity of the resin material may be prevented.

Figure 19:
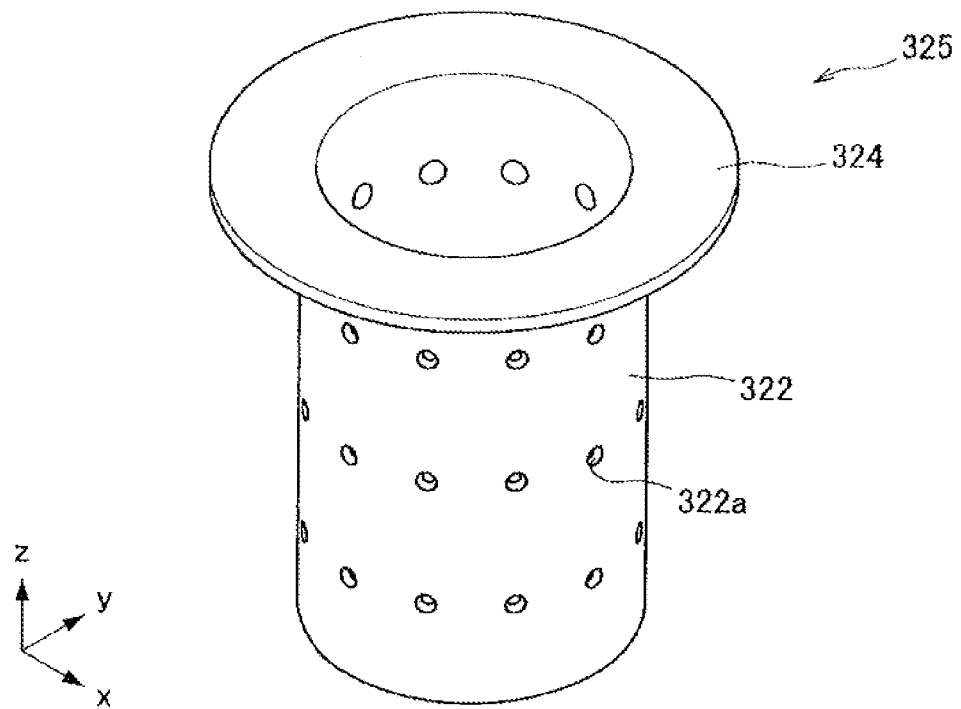
FIG. 19 is a perspective view illustrating another modified example of the metal unit of the first heat sink regarding the third example embodiment of the present disclosure.
Figure 20:
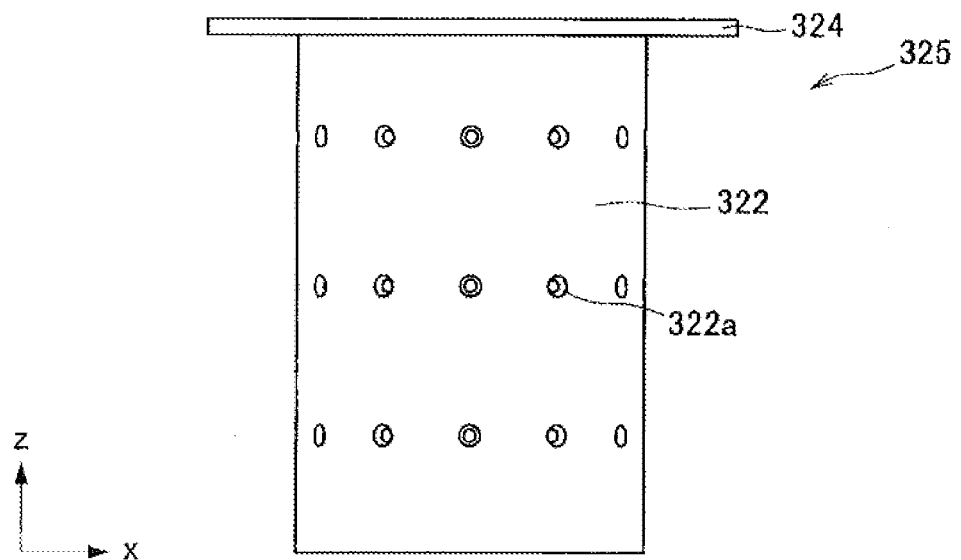
FIG. 20 is a side view of FIG. 19.

Also, the through holes formed in the metal unit 325 of the first heat sink 220 may be tapered through holes 322a having an opening area increased from an inner circumference to an outer circumference of the body portion 322 as illustrated in FIGS. 19 and 20. Alternatively, a plurality of concave portions, without penetrating through an inner space, may be formed on the outer circumferential surface of the body portion 222 of the first heat sink 220 regarding the present example embodiment.

The amount of through holes formed in the metal unit 225, 225' and 325 may not be limited to that illustrated in FIGS. 15 to 20, and at least two or more through holes may be formed in the circumferential direction. In this case, the through holes may be formed to face the basic axis C. The amount and size of the through holes may be appropriately determined such that the body portion is not excessively opened to degrade heat dissipation efficiency.

So far, the configuration of the lighting device 200 regarding the third example embodiment of the present disclosure and the first heat sink 220 as a composite member of a metal material and a resin material has been described. According to the present example embodiment, a plurality of through holes 222a are formed in the body portion 222 of the metal unit 225. By insert-molding the metal portion 225 having the through holes 222a formed therein and the resin material forming the fins 223, selection of metal materials is not limited and mechanical strength of the junction therebetween may be secured without preventing fluidity of the resin material. Thus, product reliability may be secured and, since a secondary surface treatment or secondary processing of the metal material is not required, manufacturing costs may be reduced.

<Configuration of Heat Sink According to Other Application Examples>

Figure 21:
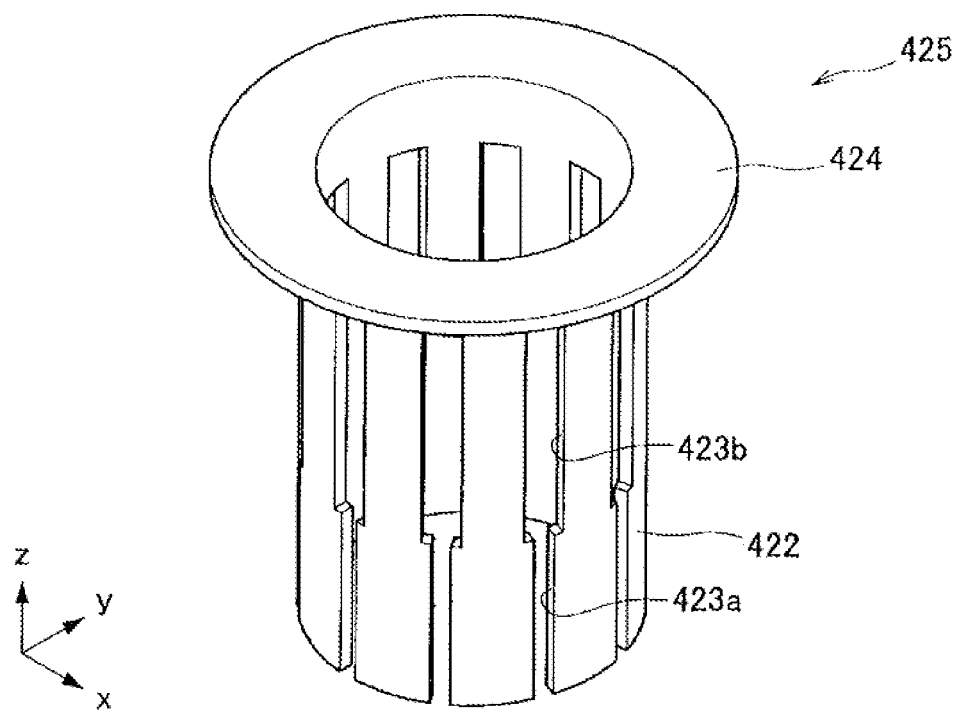
FIG. 21 is a perspective view illustrating a body portion and a flange portion formed of a metal in the first heat sink regarding another application example of the third example embodiment of the present disclosure.
Figure 22:
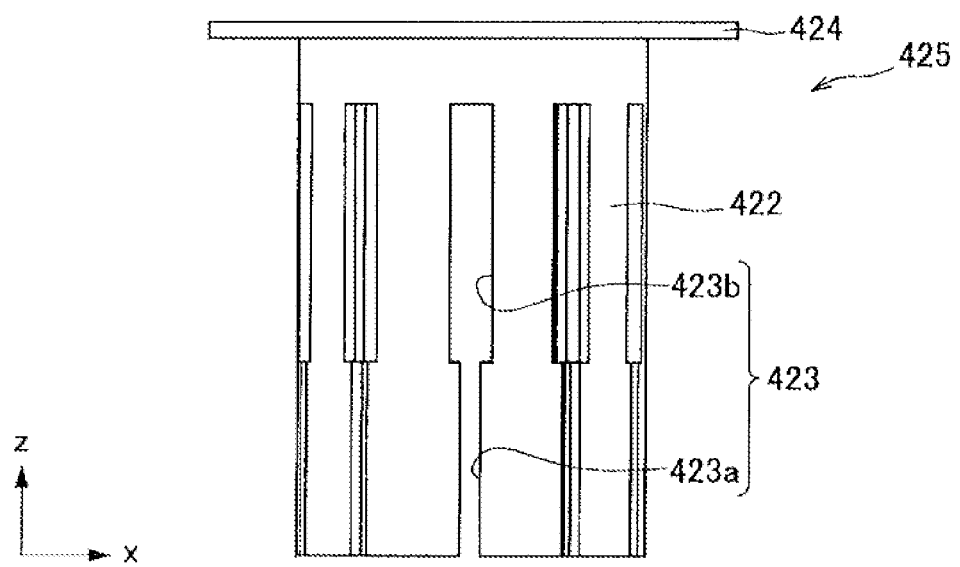
FIG. 22 is a side view of FIG. 21.

Hereinafter, a heat dissipation member of a lighting device regarding other application examples of the third example embodiment of the present disclosure will be described. The lighting device regarding the present example embodiment may have a configuration identical to that of the lighting device 200. Compared to the foregoing example, the lighting device regarding the present example embodiment may have a metal portion configured to be different from that of the first heat sink. Hereinafter, a configuration of a metal portion 425 of the first heat sink of the lighting device regarding the present example embodiment will be described. FIG. 21 is a perspective view illustrating a body portion 422 and a flange portion 424 formed of a metal material in the first heat sink regarding the present example embodiment of the present disclosure. FIG. 22 is a side view of FIG. 21.

The first heat sink regarding the present example embodiment is also a composite member including the body portion 422 and the flange portion 424 (both will be referred to as a 'metal portion 425') formed of a metal material such as aluminum, or the like, and fins formed of a resin material such as plastic, or the like. By configuring the first heat sink as the composite member, high heat dissipation efficiency may be maintained and material costs may also be reduced.

As illustrated in FIGS. 21 and 22, the metal portion 425 according to the present example embodiment is a holding portion in which a resin material and a metal material are held, and a plurality of slits 423 are formed in the body portion 422. In the body portion 422 formed of a metal material of the first heat sink regarding the present example embodiment, for example, nine slits 423 extending in the length direction (z direction) of the first heat sink are formed at equal intervals in the circumferential direction. Each of the slits 423 includes a narrow slit portion 423a opened in the side opposite to the flange portion 424 and a broad slit portion 423b formed to continue from the narrow slit portion 423a and having a width greater than that of the narrow slit portion 423a in the circumferential direction.

When the fins formed of a resin material and a surface portion (no reference numeral) covering an outer circumferential surface of the body portion 422 are insert-molded, a resin material is introduced to the respective slits 423 of the body portion 422, cooled, and solidified. Accordingly, adhesive strength between the metal material and the resin material is enhanced. Although the body portion 422 is not formed of a metal material, the slits 423 may be formed in the body portion 422, and thus, a metal material selected as a material of the metal unit 425 of the first heat sink may be insert-molded. Also, since the resin material introduced to the slits 423 formed in advance is cooled and solidified to form a composite member, there is no need to perform a secondary surface treatment or secondary processing. Thus, manufacturing costs may be reduced.

By forming the slits 423 in the body portion 422, insert molding may be performed without sacrificing fluidity of the resin material. Mechanical stress is generated in a junction between the metal material and the resin material in a refrigerating cycle of insert molding due to a difference in coefficients of linear expansion between the metal material and the resin material. However, in the present example embodiment, since the resin material is introduced to the slits 423 formed in the body portion 422, shear strength of the resin material in the junction between the resin material introduced to the slits 423 and the metal material may be sufficiently secured. Accordingly, product reliability may be sufficiently maintained.

Figure 23:
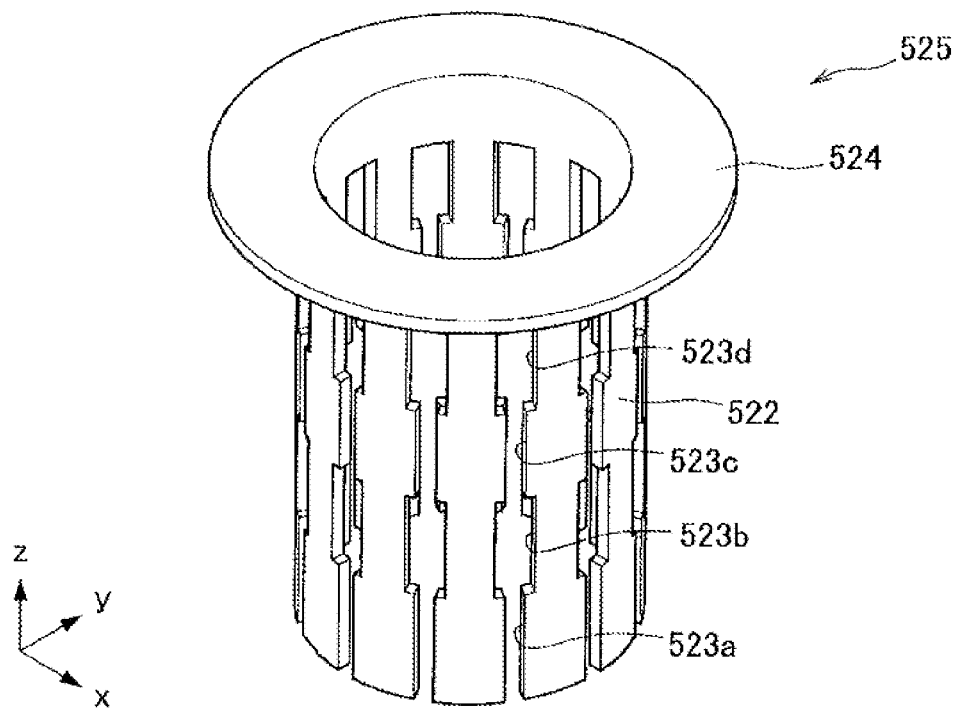
FIG. 23 is a perspective view illustrating a modified example of the metal unit of the first heat sink regarding another application example of the third example embodiment.
Figure 24:
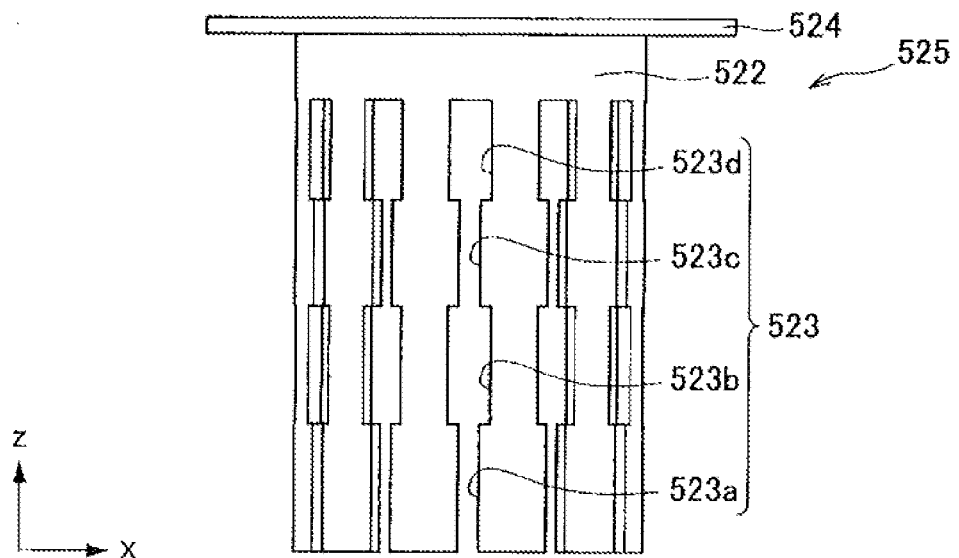
FIG. 24 is a side view of FIG. 23.

The shape of the slits formed in the body portion of the metal unit is not limited to that of examples illustrated in FIGS. 21 and 22 and the slits may have, for example, a shape such as illustrated in FIGS. 23 and 24. In this example, twelve slits 523 extending in the length direction (z direction) of the first heat sink are formed at equal intervals in a body portion 522 of a metal unit 525 in the circumferential direction.

Each of the slits 523 includes a first narrow slit portion 523a opened in side opposite to a flange portion 524, a first wide slit portion 523b continued from the first narrow slit portion 523a and having a width greater than that of the first narrow slit portion 523a in a circumferential direction, a second narrow slit portion 523c continued from the first wide slit portion 523b and a second wide slit portion 523d continued from the second narrow slit portion 523c. Widths of the first narrow slit portion 523a and the second narrow slit portion 523c and widths of the first wide slit portion 523b and the second wide slip portion 523d in the circumferential direction may be equal.

In this manner, the shape and number of the slits 523 may be appropriately determined such that the body portion is not excessively opened to degrade heat dissipation efficiency.

So far, the first heat sink as a composite member of a metal material and a resin material installed in the lighting device regarding another application example of the third example embodiment has been described. According to the present example embodiment, a plurality of slits 523 are formed in the body portion 522 of the metal unit 525 of the first heat sink. The metal unit 525 with the slits 523 formed therein and a resin material for forming fins are insert-molded, whereby mechanical strength of the junction between the metal material and the resin material may be secured without limiting selection of a metal material and without preventing fluidity of a resin material. Thus, product reliability may be secured, and also, since a secondary surface treatment or secondary processing does not need to be performed, manufacturing costs may be reduced.

So far, the example embodiment of the present disclosure has been described in detail, but the present example embodiment may be variously modified to be implemented. For example, in the foregoing example embodiment, a plurality of through holes or a plurality of slits are formed as a holding portion for holding the resin material and the metal material in the body portion, but the present disclosure is not limited thereto.

Figure 25:
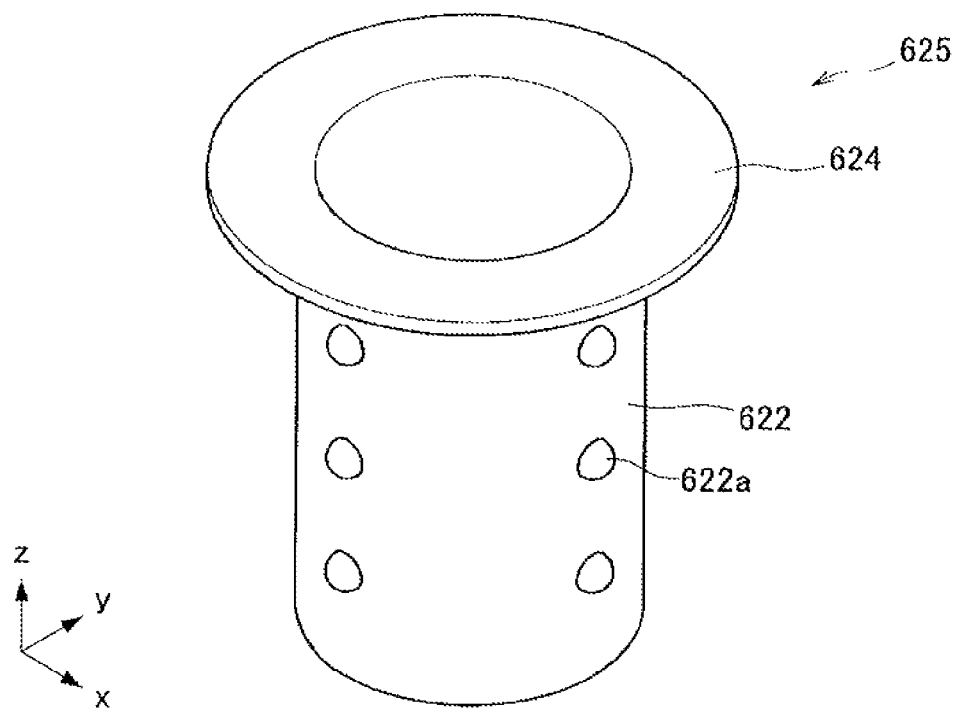
FIG. 25 is a perspective view illustrating a modified example of the body portion and the flange portion formed of a metal in the first heat sink of another application example.
Figure 26:
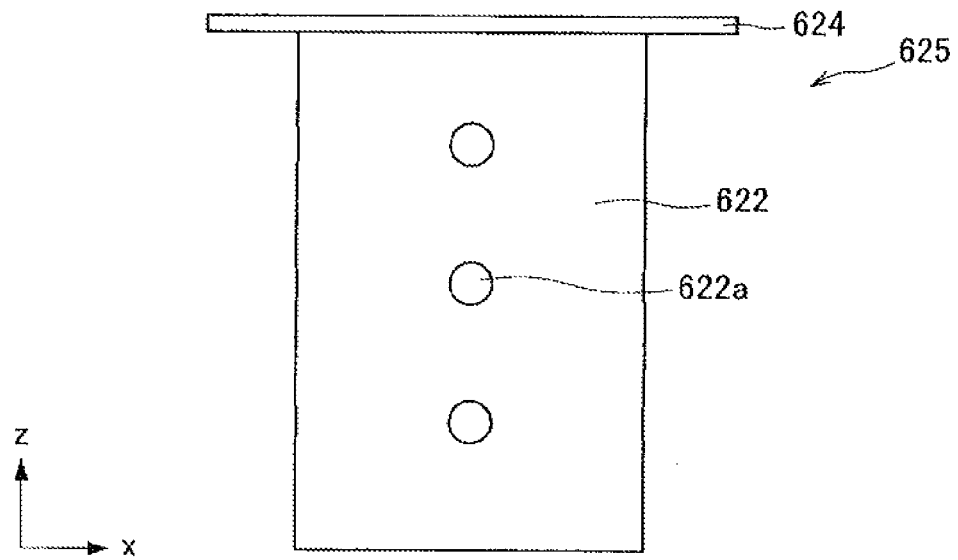
FIG. 26 is a side view of FIG. 25.

For example, as illustrated in FIGS. 25 and 26, a plurality of hemispherical protrusions 622a may be installed on an outer circumferential surface of a body portion 622 of a metal unit 625 of the first heat sink. Also, a step portion having a diameter decreased in the outer circumference direction of the body portion 222 of the first heat sink 220 in the length direction from one end connected to the globe 230 toward the other end may be installed as a holding portion. In addition, a plurality of holding portions having different configurations as in the foregoing example embodiment or the modified example may be combined to be installed. Even with these holding portions, selection of a metal material is not limited and mechanical strength of the junction between the metal material and the resin material may be secured without preventing fluidity of the resin material. Thus, product reliability may be secured, and also, since a secondary surface treatment or secondary processing does not need to be performed, manufacturing costs may be reduced.

Also, in the foregoing example embodiment, the cross-section of the body portions of the first heat sink 220 and the second heat sink 240 taken in the direction perpendicular with respect to the basic axis C has a cylindrical shape, but the present disclosure is not limited thereto and the shape of the body portions may have a polygonal or oval shape.

In the foregoing example embodiment, the plurality of light emitting devices 212 are disposed in an annular arrangement on the light emitting device board 210, but the present disclosure is not limited thereto and only a single light emitting device 212 may be disposed on the light emitting device board 210. Also, when the light emitting device board 210 is installed on the flange portion 224 of the first heat sink 220 or on the outer circumferential surface of the second heat sink 240, only a single light emitting device group including a plurality of light emitting devices 212 disposed in an annular arrangement may be disposed, or a plurality of light emitting device groups may be disposed on a concentric circle.

<Fourth Example Embodiment>

[Configuration of Lighting Device According to Fourth Example Embodiment]

Figure 27:
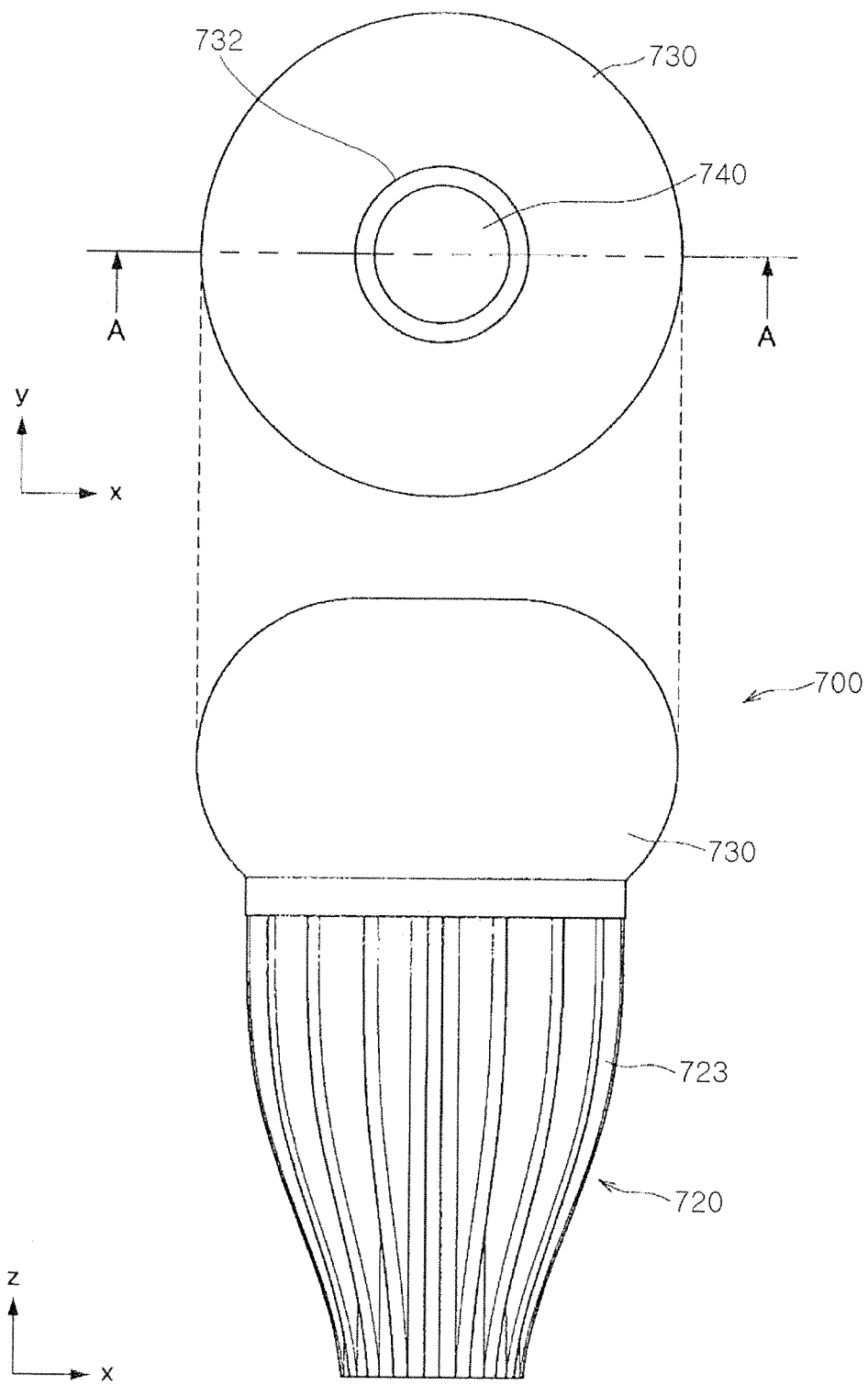
FIG. 27 includes a plan view and a side view illustrating a lighting device according to a fourth example embodiment of the present disclosure.
Figure 28:
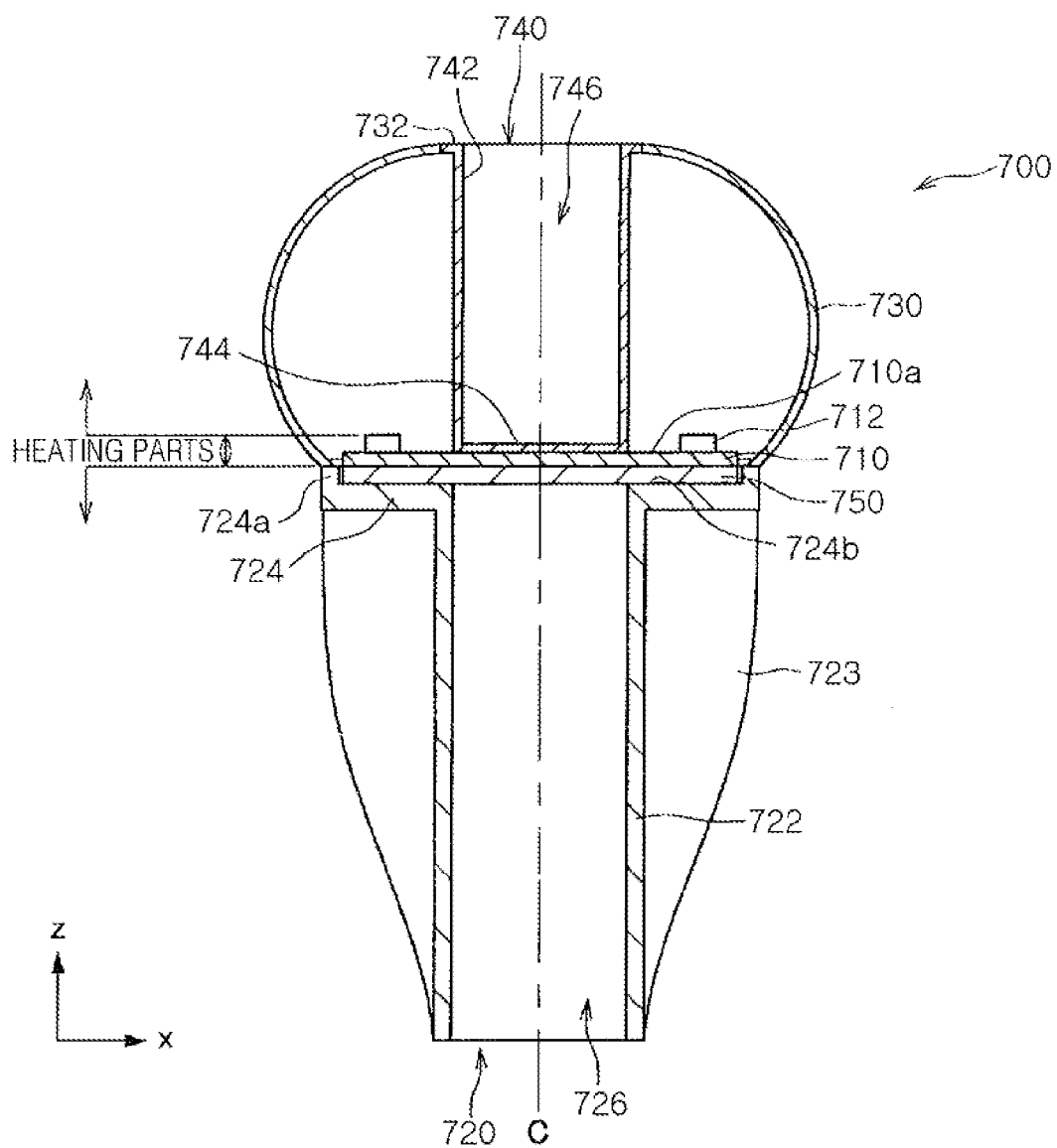
FIG. 28 is a cross-sectional view of the lighting device of FIG. 27 taken along line A-A.
Figure 29:
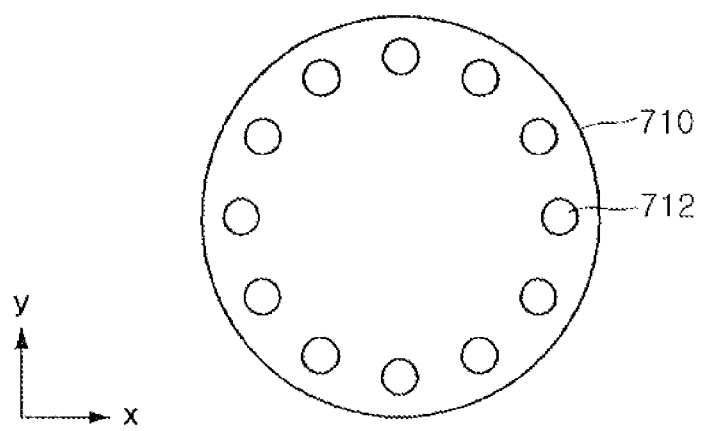
FIG. 29 is a plan view illustrating a disposition of light emitting devices on a light emitting device board.

First, a configuration of a lighting device 700 according to a fourth example embodiment of the present disclosure will be described with reference to FIGS. 27 through 29. FIG. 27 includes a plan view and a side view illustrating the lighting device 700 according to a fourth example embodiment of the present disclosure. FIG. 28 is a cross-sectional view of the lighting device 700 of FIG. 27 taken along line A-A. FIG. 29 is a plan view illustrating a disposition of light emitting devices 712 on a light emitting device board 710.

As illustrated in FIGS. 27 and 28, the lighting device 700 includes a light emitting device 712 outputting light, a light emitting device board 710 on which the light emitting device 712 is mounted, a first heat sink 720 on which the light emitting device board 710 is mounted, a globe 730 covering the light emitting device board 710 mounted on the first heat sink 720, and a second heat sink 740 installed in a central portion of the globe 730. A disk-type metal board 750 is installed between the light emitting device board 710 and the first heat sink 720 in order to enhance a heat dissipation effect.

A light emitting diode (LED), for example, may be used as the light emitting device 712. In the lighting device 700 according to the present example embodiment, as illustrated in FIG. 29, a plurality of light emitting devices 712 (for example, twelve light emitting devices) are disposed at equal intervals in an annular arrangement on the light emitting device board 710. The light emitting device board 710 may be, for example, an aluminum board, and the light emitting device board 710 has a disk shape to correspond to a shape of the first heat sink 720 fixed with the metal board 750 interposed therebetween. Meanwhile, in the present example embodiment, the light emitting devices 712 and the light emitting device board 710 having the light emitting devices 712 mounted thereon will be referred to as a heating element. The heating element includes at least the light emitting device 712, and the light emitting device board 710 may not necessarily be considered to be a heating element. Also, in addition to the heating elements including the light emitting devices 712, a power source circuit (not shown) may be a heat source of the lighting device 700.

The first heat sink 720 is a member for dissipating heat from a heat source of the lighting device 700. As illustrated in FIGS. 27 and 28, the first heat sink 720 has a plurality of fins 723 formed on a cylindrical body portion 722. The body portion 722 may be formed of, for example, a metal material such as aluminum, or the like, or a resin material such as plastic, or the like, and the body portion 722 and the fins 723 may be formed of different materials.

A socket (not shown) may be installed in an end portion of the body portion 722 (end portion in a negative direction side of the z axis), and a flange portion 724 is installed in the other end of the body portion 722 (end portion in a positive direction side of the z axis) to maintain the light emitting device board 710. A rim portion 724a is formed in an outer circumference of the flange portion 724 and protruded toward a side where the light emitting device board 710 is disposed in a direction in which the body portion 722 is elongated (basic axis (C): z direction) to surround the outer circumference of the light emitting device board 710. The light emitting device board 710 is disposed on an upper surface 724b of the flange portion 724 with the metal board 750 interposed therebetween. An aluminum board, for example, may be used as the metal board 750.

A power source circuit (not shown) is installed in an inner space 726 of the body portion 722 of the first heat sink 720. In a case in which the body portion 722 is formed of a metal, the power source circuit may be accommodated in the inner space 726 with an insulating case (not shown) interposed therebetween so as to be insulated from the body portion 722.

The first heat sink 720 dissipates heat from the heating element including the light emitting device 712 transmitted through the light emitting device board 710 and the metal board 750 from the light emitting device 712, and also dissipates heat from the power source circuit. By installing the plurality of fins 723 in the outer circumferential surface of the body portion 722, a heat dissipation area may be increased and heat dissipation efficiency may be enhanced.

The globe 730 is a cover member covering the light emitting device board 710 installed in the first heat sink 720 and allowing light output from the light emitting device 712 to be transmitted therethrough. The globe 730 may be formed of, for example, glass, resin, or the like, having transmittance. The globe 730 is formed to have a substantially hemispherical curved surface and has opening 732 formed in a central portion thereof. The center of the opening 732 lies on the basic axis C which passes through the center of the plurality of light emitting devices 712 disposed in an annular arrangement on the light emitting device board 710 and is perpendicular with respect to the light emitting device board 710. A second heat sink 740 is inserted into the opening 732.

The second heat sink 740 is a member dissipating heat from the heating element including the light emitting device 712. As illustrated in FIG. 28, the second heat sink 740 includes a cylindrical portion 742 and a bottom portion 744. One open end of the cylindrical portion 742 in the positive direction side of the z axis is connected to the opening 732 of the globe 730. The bottom portion 744 is installed to be in contact with an upper surface 710a of the light emitting device board 710 in order to easily transmit heat from the heating element. The second heat sink 740 may also be formed of a metal such as, for example, aluminum, or the like, or may be formed of a resin material such as plastic, or the like. By installing the second heat sink 740, a heat dissipation area may be further increased and heat dissipation efficiency may be enhanced.

[Heat Dissipation Structure according to Fourth Example Embodiment]

The lighting device 700 according to the present example embodiment includes the first heat sink 720 and the second heat sink 740 as heat dissipation structures for dissipating heat from a heating element including the light emitting device 712 or a power source circuit. Here, the first heat sink 720 is installed on one side of the basic axis C (in the negative direction side of the z axis) based on the heating element as a reference, and the second heat sink 740 is installed on the other side of the basic axis C (in the positive direction side of the z axis) based on the heating element as a reference. In this manner, since the heat sinks 720 and 740 are installed in the vertical direction of the basic axis C based on the heating element as a reference, a heat dissipation area may be increased and heat dissipation efficiency may be enhanced.

Thus, a temperature load with respect to the light emitting device 712 may be reduced and product reliability and luminous efficiency may be enhanced. Also, a degree of freedom of the shape of the heat sinks 720 and 740 dissipating heat from the light emitting device 712 may be increased. In addition, an amount of power supplied to the light emitting device 712 may be increased and an overall velocity of light may also be increased.

In addition, conventionally, heat generated by the heating element including the light emitting device 712 is dissipated by the heat sink (the first heat sink) on the rear side (socket side) of the light emitting device board 710. In this manner, if the heat dissipation structure is installed only in one direction, heat dissipation efficiency may be changed according to a direction in which the lighting device is disposed. In contrast, in the lighting device 700 according to the present example embodiment, since the first heat sink 720 and the second heat sink 740 are respectively installed in the vertical direction of the basic axis C based on the heating element as a reference, a change in heat dissipation efficiency based on an installation direction of the lighting device 700 may be reduced.

So far, the lighting device 700 according to the fourth example embodiment of the present disclosure and the heat dissipation structure thereof have been described. According to the present example embodiment, based on the heating element including the light emitting devices 712 disposed in an annular arrangement, as a reference, the first heat sink is installed on one side of the basic axis C which passes through the center of the light emitting devices 712 and is perpendicular with respect to the light emitting device board 710, and the second heat sink is installed on the other side. Accordingly, a heat dissipation area may be increased and heat efficiency over the heating element may be enhanced.

<Fifth Example Embodiment>

[Configuration of Lighting Device According to Fifth Example Embodiment]

Figure 30:
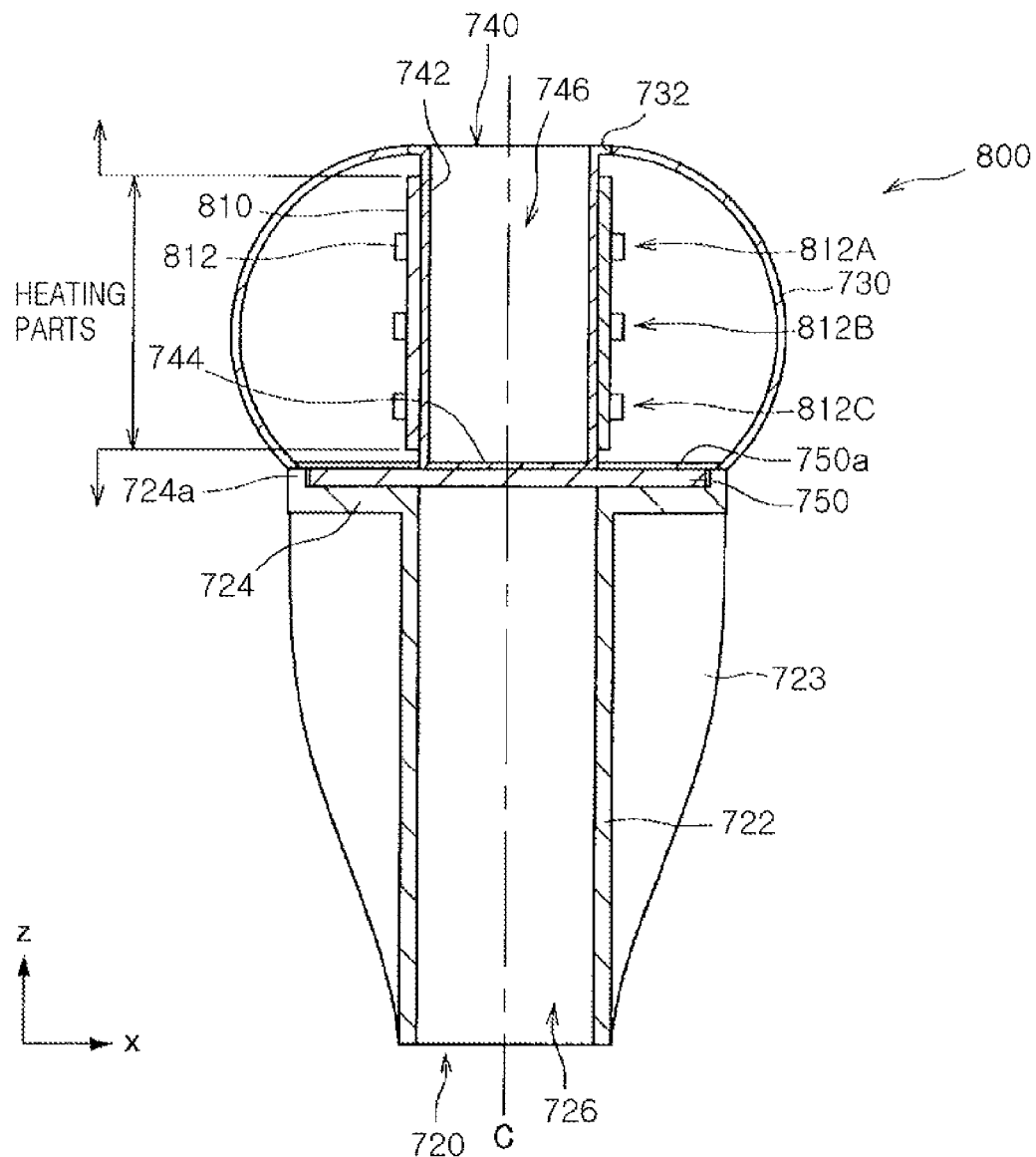
FIG. 30 is a cross-sectional view illustrating a lighting device according to a fifth example embodiment of the present disclosure.

Hereinafter, a configuration of a lighting device 800 according to a fifth example embodiment of the present disclosure will be described with reference to FIG. 30. FIG. 30 is a cross-sectional view illustrating the lighting device 800 according to the fifth example embodiment of the present disclosure. Compared to the lighting device 700 according to the fourth example embodiment, the lighting device 800 according to the present example embodiment is different in that a light emitting device board 810 having a plurality of light emitting devices 812 mounted thereon is installed on an outer circumferential surface of the cylindrical portion 742 of the second heat sink 740. Hereinafter, differences of the lighting device 800 according to the present example embodiment from the lighting device 700 according to the fourth example embodiment will be described in detail, and descriptions of members having the same configuration and same function will be omitted. Also, the exterior of the lighting device 800 according to the present example embodiment is identical to that illustrated in FIG. 27, and FIG. 30 may be understood as a cross-sectional view taken along line A-A when it is assumed that FIG. 27 illustrates the lighting device 800 according to the present example embodiment.

As illustrated in FIG. 30, the lighting device 800 according to the present example embodiment includes light emitting devices 812 outputting light, a light emitting device board 810 having the light emitting devices 812 mounted thereon, a first heat sink 720, a globe 730, and a second heat sink 740 on which the light emitting device board 810 is mounted and installed in a central portion of the globe 730. Also, a disk-type metal board 750 is installed between the first heat sink 720 and the second heat sink 740 to enhance a heat dissipation effect. Here, the first heat sink 720, the globe 730, the second heat sink 740, and the metal board 750 are identical to those of the lighting device 700 according to the fourth example embodiment, so a detailed description thereof will be omitted.

In the lighting device 800 according to the present example embodiment, the light emitting device board 810 having the plurality of light emitting devices 812 mounted thereon is installed on the outer circumferential surface of the cylindrical portion 742 of the second heat sink 740. The light emitting device board 810 may be, for example, an aluminum board and may have a cylindrical shape continued along the outer circumference of the second heat sink 740 or may be configured as a plurality of laminar boards discontinuously disposed along the outer circumference of the second heat sink 740. For example, the light emitting devices 812, LEDs, form a group of light emitting devices disposed in an annular arrangement on a plane perpendicular with respect to the basic axis C that passes through the center of the first heat sink 720 and the second heat sink 740 and is elongated in a direction in which the first and second heat sinks 720 and 740 are extendedly installed. A single light emitting device group is configured by disposing a plurality of light emitting devices 812 (for example, twelve light emitting devices) at equal intervals in an annular arrangement on the light emitting device board 810.

In the lighting device 800 according to the present example embodiment, as illustrated in FIG. 30, three light emitting device groups 812A, 812B, and 812C disposed in an annular arrangement are disposed in the direction of the basic axis C. In the present example embodiment, the light emitting devices 812 and the light emitting device board 810 having the light emitting devices 812 mounted thereon will be referred to as heating elements. The heating elements include at least the light emitting device 812, while the light emitting device board 810 may not necessarily be considered to be a heating element. Also, in addition to the heating elements including the light emitting devices 812, a power source circuit (not shown) installed in the inner space 726 of the first heat sink 720 may be a heat source of the lighting device 800, like in the first example embodiment.

[Heat Dissipation Structure according to Fifth Example Embodiment]

Similar to that of the fourth example embodiment, the lighting device 800 according to the present example embodiment includes the first heat sink 720 and the second heat sink 740 as heat dissipation structures for dissipating heat from a heating element including the light emitting device 812 or a power source circuit. Also, in the present example embodiment, the first heat sink 720 is installed on one side of the basic axis C (in the negative direction side of the z axis) based on the heating element as a reference, and the second heat sink 740 is installed on the other side of the basic axis C (in the positive direction side of the z axis) based on the heating element as a reference. In this manner, since the heat sinks 720 and 740 are installed in the vertical direction of the basic axis C based on the heating element as a reference, a heat dissipation area may be increased and heat dissipation efficiency may be enhanced.

Thus, a temperature load with respect to the light emitting device 812 may be reduced and product reliability and luminous efficiency may be enhanced. Also, a degree of freedom of the shape of the heat sinks 720 and 740 dissipating heat from the light emitting devices 812 may be increased. In addition, an amount of power supplied to the light emitting device 812 may be increased and an overall velocity of light may also be increased. Also, in the lighting device 800 according to the present example embodiment, as illustrated in FIG. 30, since the first heat sink 720 and the second heat sink 740 are respectively installed in the vertical direction of the basic axis C based on the heating element as a reference, a change in heat dissipation efficiency according to an installation direction of the lighting device 800 may be reduced. Also, since the light emitting device board 810 having the light emitting devices 812 mounted thereon are in contact with the cylindrical portion 742 of the second heat sink 740, heat from the heating elements may be effectively dissipated by the second heat sink 740.

<Sixth Example Embodiment>

[Configuration of Lighting Device According to Sixth Example Embodiment]

Figure 31:
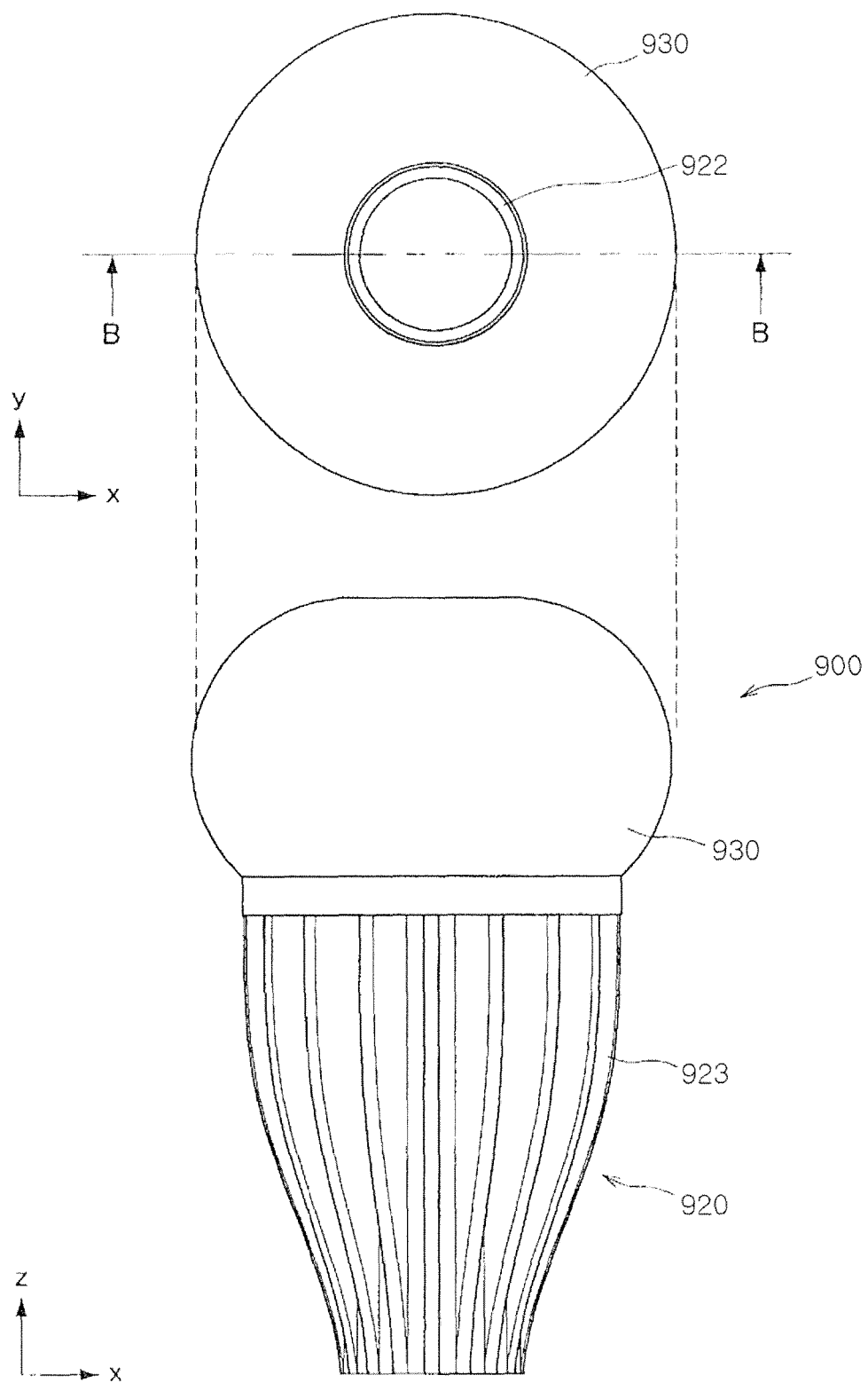
FIG. 31 is a cross-sectional view illustrating a lighting device according to a sixth example embodiment of the present disclosure.
Figure 32:
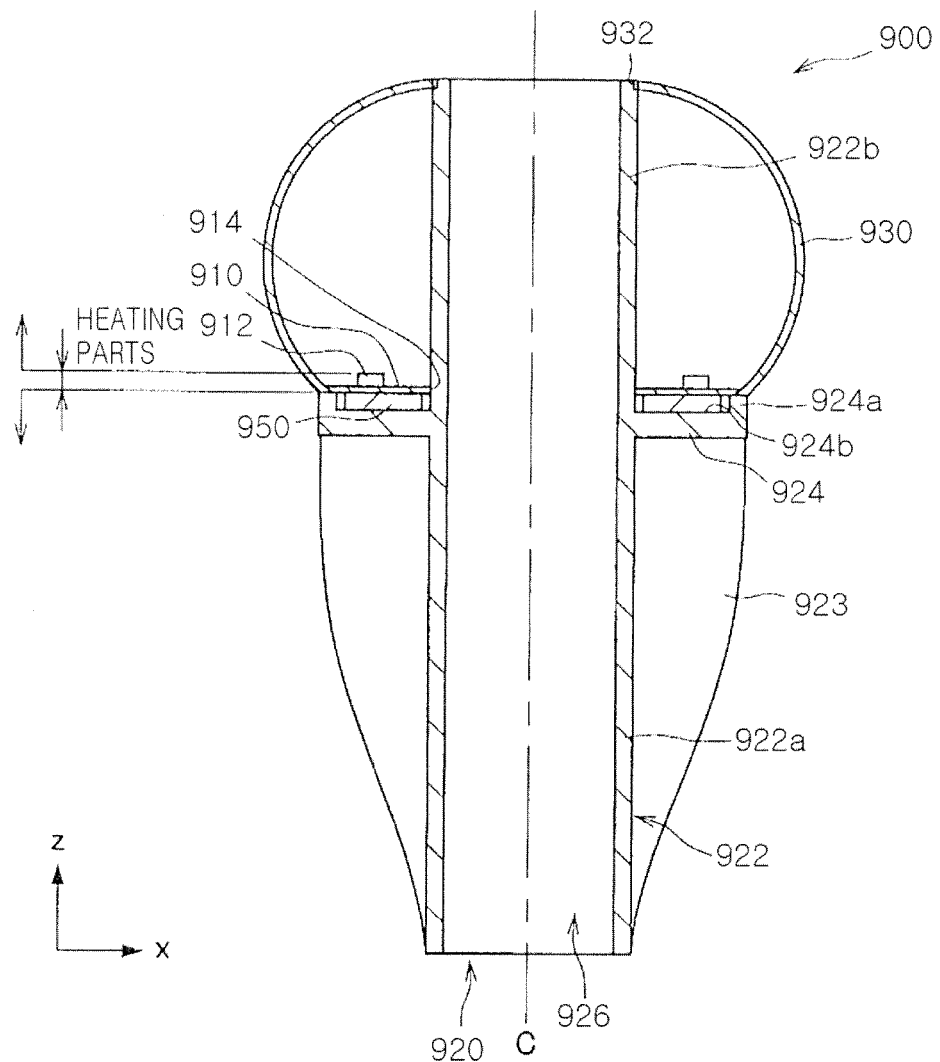
FIG. 32 is a cross-sectional view of the lighting device of FIG. 31 taken along line B-B.

Hereinafter, a configuration of a lighting device 900 according to a sixth example embodiment of the present disclosure will be described with reference to FIGS. 31 and 32. FIG. 31 is a cross-sectional view illustrating the lighting device 900 according to a sixth example embodiment of the present disclosure. FIG. 32 is a cross-sectional view of the lighting device 900 of FIG. 31 taken along line B-B. Compared to the lighting device 700 according to the fourth example embodiment, the lighting device 900 according to the present example embodiment is different in that first and second heat sinks are integrally formed. Hereinafter, differences of the lighting device 900 according to the present example embodiment from the lighting device 700 according to the fourth example embodiment will be described in detail and a detailed description of members having the same configuration and same function will be omitted.

As illustrated in FIGS. 31 and 32, the lighting device 900 according to the present example embodiment includes light emitting devices 912 emitting light, a light emitting device board 910 having the light emitting devices 912 mounted thereon, a heat sink 920, and a globe 930. Also, a metal board 950 is installed between the light emitting device board 910 and the heat sink 920 in order to enhance a heat dissipation effect.

For example, a plurality of light emitting devices 912 (for example, twelve light emitting devices), LEDs, are disposed at equal intervals on the light emitting device board 910. The light emitting device board 910 is, for example, an aluminum board, and is an annular member having a through hole 914 insertedly passing through a body portion 922 (922a and 922b) of the heat sink 920. In the present example embodiment, the light emitting devices 912 and the light emitting device board 910 having the light emitting devices 912 mounted thereon will be referred to as heating elements. The heating elements include at least the light emitting device 912, while the light emitting device board 910 may not necessarily be considered to be a heating element. Also, in addition to the heating elements including the light emitting devices 912, a power source circuit (not shown) installed in the inner space 926 of the heat sink 920 may be a heat source of the lighting device 900, like in the fourth example embodiment.

The heat sink 920 is a member dissipating heat from a heat source of the lighting device 900. The heat sink 920 according to the present example embodiment includes a cylindrical body portion 922 and a flange portion 924 installed in a direction (z direction) in which the body portion 922 is elongated, to support the light emitting device board 910. Here, based on the flange portion 924 as a reference, the side (the negative direction side of the z axis) of the body portion 922 where the socket (not shown) is installed will be referred to as a first body portion 922a and the side (the positive direction side of the z axis) where the light emitting device board 910 is installed will be referred to as a second body portion 922b. The first body portion 922a corresponds to the first heat sink 720 of the fourth example embodiment, and the second body portion 922b corresponds to the second heat sink 740 of the fifth example embodiment. As illustrated in FIGS. 31 and 32, the first body portion 922a of the heat sink 920 includes a plurality of fins 923. The heat sink 920 may be formed of a metal material such as aluminum, or the like, or a resin material such as plastic, or the like, for example. The body portion 922 and the fins 923 may be formed of different materials.

The flange portion 924 supports the light emitting device board 910. A rim portion 924a is formed in an outer circumference of the flange portion 924 and protruded toward a side where the light emitting device board 910 is disposed in a direction in which the body portion 922 is elongated (z direction) to surround the outer circumference of the light emitting device board 910. The light emitting device board 910 is disposed on an upper surface 924b of the flange portion 924 with the metal board 950 interposed therebetween. An aluminum board, for example, may be used as the metal board 950.

A power source circuit (not shown) is installed, for example, in an inner space 926 of the first body portion 922a of the heat sink 920. In a case in which the body portion 922 is formed of a metal, the power source circuit may be accommodated in the inner space 926 with an insulating case (not shown) interposed therebetween so as to be insulated from the body portion 922. The heat sink 920 dissipates heat from the heating element including the light emitting device 912 transmitted through the light emitting device board 910 and the metal board 950 from the light emitting device 912, and also dissipates heat from the power source circuit. By installing the plurality of fins 923 in the outer circumferential surface of the body portion 922, a heat dissipation area may be increased and heat dissipation efficiency may be enhanced.

The globe 930 is a cover member covering the light emitting device board 910 installed in the second body portion 922b side of the heat sink 920 and allowing light output from the light emitting device 912 to be transmitted therethrough. The globe 930 may be formed of, for example, glass, resin, or the like, having transmittance. The globe 930 is formed to have a substantially hemispherical curved surface and has opening 932 formed in a central portion thereof. The center of the opening 932 lies on the basic axis C which passes through the center of the plurality of light emitting devices 912 disposed in an annular arrangement on the light emitting device board 910 and is perpendicular with respect to the light emitting device board 910. The basic axis C is a central axis of the body portion 922 of the heat sink 920. The opening 932 is connected to the second body portion 922b of the heat sink 920.

[Heat Dissipation Structure according to Sixth Example Embodiment]

The lighting device 900 according to the present example embodiment includes the heat sink 920 as a heat dissipation structure for dissipating heat from a heating element including the light emitting device 912 or a power source circuit. Here, as illustrated in FIG. 32, in the heat sink 920, the first body portion 922a is installed on one side of the basic axis C (in the negative direction side of the z axis) based on the heating element as a reference, and the second body portion 922b is installed on the other side of the basic axis C (in the positive direction side of the z axis). In this manner, since the heat sink 920 is installed in the vertical direction of the basic axis C based on the heating element as a reference, a heat dissipation area may be increased and heat dissipation efficiency may be enhanced.

Thus, a temperature load with respect to the light emitting device 912 may be reduced and product reliability and luminous efficiency may be enhanced. Also, a degree of freedom of the shape of the heat sink 920 dissipating heat from the light emitting devices 912 may be increased. In addition, an amount of power supplied to the light emitting device 912 may be increased and an overall velocity of light may also be increased. Also, a change in heat dissipation efficiency according to an installation direction of the lighting device 900 may be reduced. Also, in the present example embodiment, since the heat sink 920 installed on one side and on the other side of the basic axis C based on the heating element as a reference is integrally formed, an amount of components of the lighting device 900 may be reduced. Accordingly, costs may be reduced and man hours required in manufacturing (or assembly time) may be reduced, and since precision of positioning between or among components when completed is stable, a defect rate may be reduced.

Meanwhile, as illustrated in FIG. 32, the heating element including the light emitting devices 912 is installed in the flange portion 940 of the heat sink 920, but the present disclosure is not limited thereto. For example, the heating element including the light emitting devices may be installed in the second body portion 922b side of the body portion 922 as in the fifth example embodiment illustrated in FIG. 30.

So far, the example embodiment of the present disclosure has been described in detail with reference to the accompanying drawings, but the present disclosure is not limited thereto. For example, in the fifth example embodiment, the plurality of light emitting device groups 812A to 812C are disposed in the direction in which the cylindrical portion 742 of the second heat sink 740 is elongated, but the present disclosure is not limited thereto and at least one light emitting device group may be installed.

Also, in the foregoing example embodiment, the cross-section of the body portions of the first heat sink 720, the second heat sink 740, and the heat sink 920 taken in the direction perpendicular with respect to the basic axis C has a cylindrical shape, but the present disclosure is not limited thereto and the shape of the body portions may have a polygonal or oval shape.

Also, in the foregoing example embodiment, the plurality of light emitting devices are disposed in an annular arrangement on the light emitting device board, but the present disclosure is not limited thereto and only a single light emitting device may be disposed on the light emitting device board. Also, when the light emitting device board is installed on the flange portion of the heat sink, as illustrated in FIG. 32, only a single light emitting device group including a plurality of light emitting devices 912 disposed in an annular arrangement may be disposed, or a plurality of light emitting device groups may be disposed on a concentric circle.

<Seventh Example Embodiment>

[Configuration of Lighting Device According to Seventh Example Embodiment]

Figure 33A:
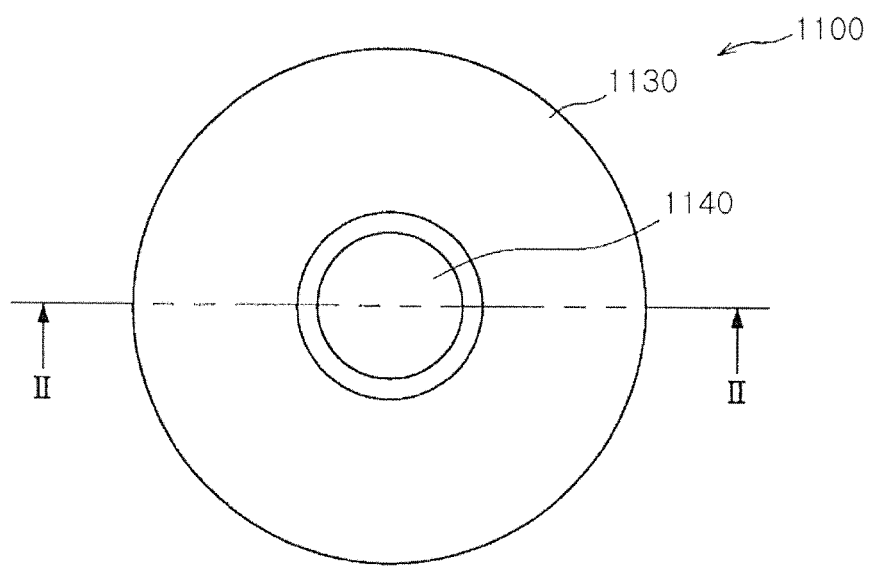
FIG. 33A is a top view and FIG. 33B is a front view illustrating an overall configuration of a lighting device regarding a seventh example embodiment of the present disclosure.
Figure 33B:
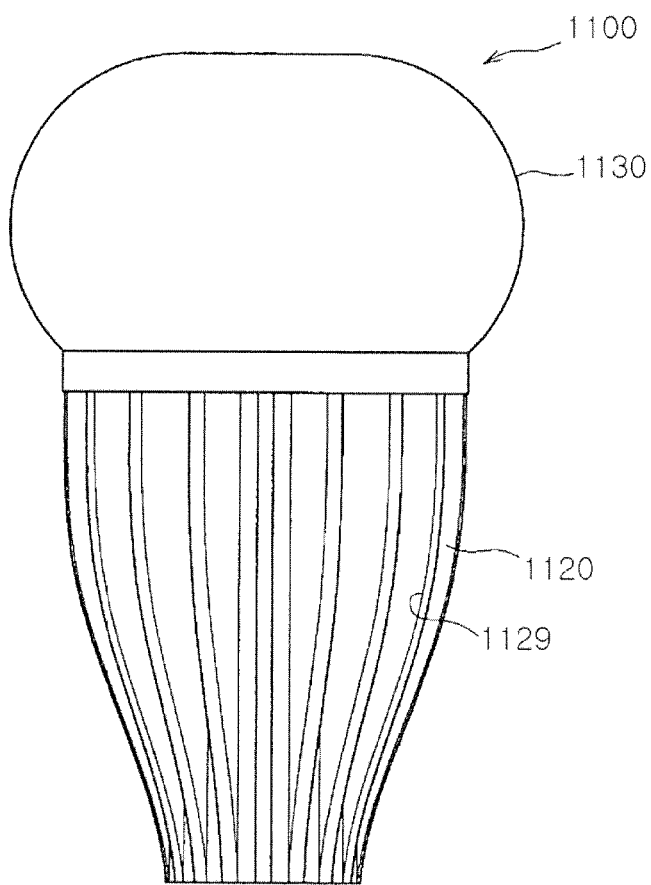
Figure 34:
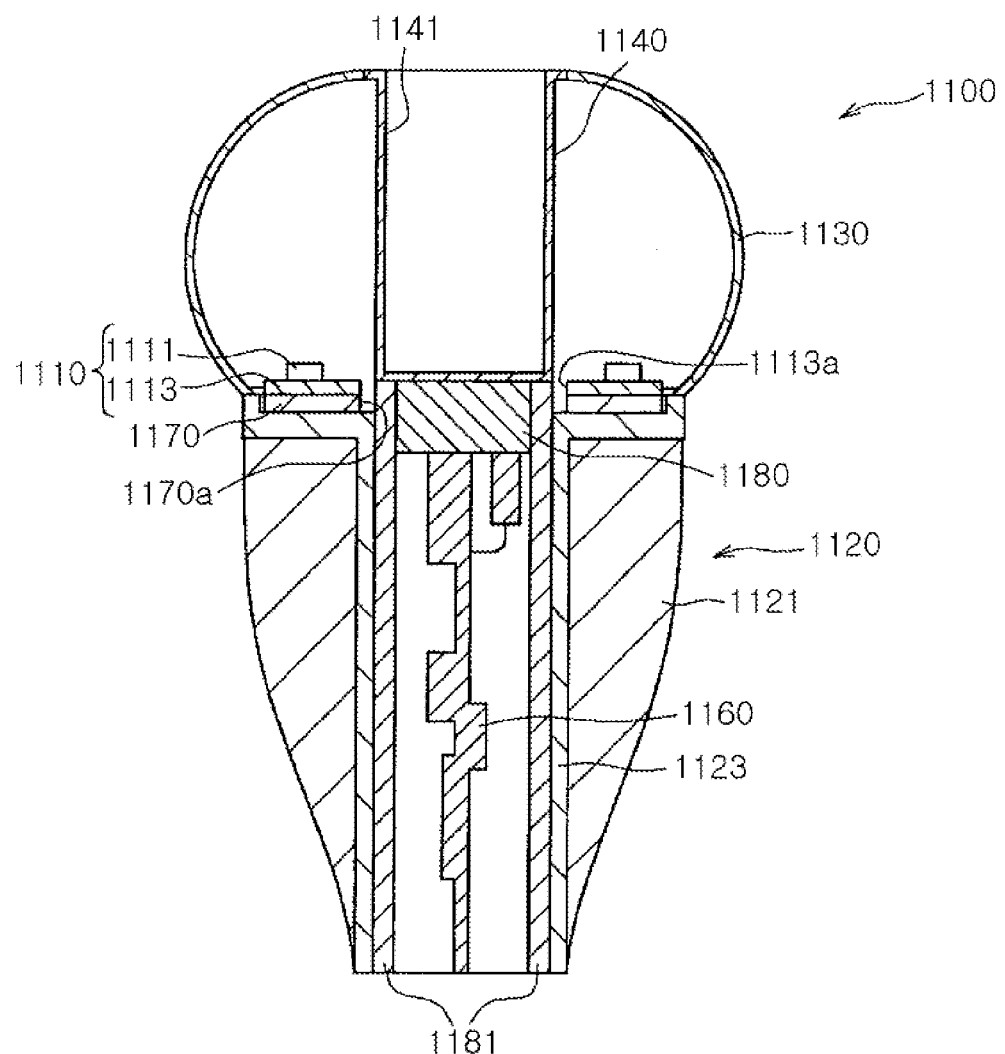
FIG. 34 is a cross-sectional view of the lighting device regarding the seventh example embodiment taken along line II-II of FIG. 33A.
Figure 35A:
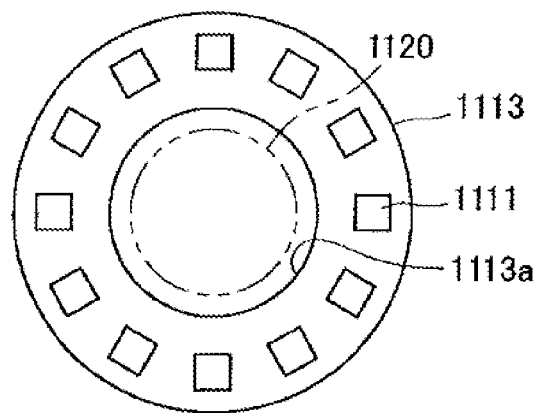
FIG. 35A is a top view illustrating a configuration of a light emitting module regarding the seventh example embodiment.
Figure 35B:
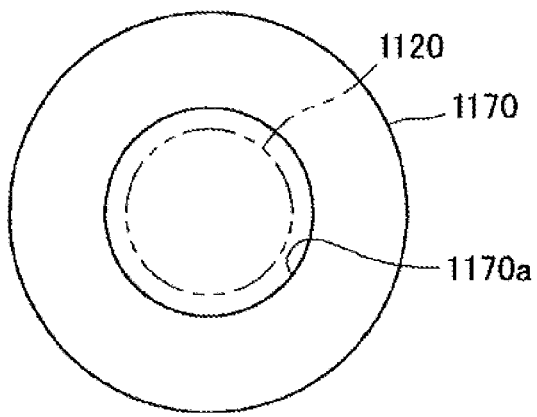
FIG. 35B is a top view illustrating a configuration of a heat dissipation plate regarding the seventh example embodiment.

First, a configuration of a lighting device regarding a seventh example embodiment of the present disclosure will be described with reference to FIGS. 33 through 35. FIG. 33A is a top view and FIG. 33B is a front view illustrating an overall configuration of a lighting device 1100 regarding a seventh example embodiment of the present disclosure. FIG. 34 is a cross-sectional view of the lighting device 1100 regarding the seventh example embodiment taken along line II-II of FIG. 33A. FIG. 35A is a top view illustrating a configuration of a light emitting module 1110 regarding the seventh example embodiment, and FIG. 35B is a top view illustrating a configuration of a heat dissipation plate 1170 regarding the seventh example embodiment.

As illustrated in FIGS. 33 and 34, the lighting device 1100 regarding the present example embodiment mainly includes a light emitting module 1110, a first heat sink 1140 (hereinafter, referred to as an 'upper heat sink'), a second heat sink 1120 (hereinafter, referred to as a 'lower heat sink'), a globe 1130, a driving circuit 1160, a heat dissipation plate 1170, and a heat conduction member 1180.

(Light Emitting Module 1110)

The light emitting module 1110 includes a light emitting device 1111 and a light emitting device board 1113 and serves as a light source of the lighting device 1100.

The light emitting device 1111, a semiconductor light emitting device such as a light emitting diode (LED), or the like, emits light. A luminous color of the light emitting device 1111 may vary according to a material of the globe 1130. In detail, in a case in which the globe 1130 is formed of a material (resin, or the like) containing a phosphor, a luminous color of the light emitting device 1111 is blue and a wavelength of light is converted in the globe 30 to emit white light. Meanwhile, in a case in which the globe 1130 is formed of a material (resin, or the like) containing a light diffuser, the light emitting device 1111 emits white light (6500K to 20000K). Light output from the light emitting device 1111 is reflected by a reflector (not shown) as described hereinafter or directly reaches the globe 1130 and is diffused from the globe 1130 so as to be emitted outwardly.

Also, in the present example embodiment, the light emitting device 1111 is provided in plural, and the plurality of light emitting devices 1111 are disposed in an annular arrangement on one surface of the light emitting device board 1113. Here, the annular arrangement includes an oval annular arrangement and a polygonal annular arrangement, as well as a circular annular arrangement illustrated in FIG. 35A.

The light emitting device board 1113 may be a board on which the light emitting device 1111 is mounted, and preferably, the light emitting device board 1113 may be formed of a material having a high degree of conductivity such as aluminum, nickel, or the like, a glass composite CEM3, a ceramic, or the like. Accordingly, heat generated by the light emitting module 1110 may be effectively transmitted to the lower heat sink 1120, and thus, heat dissipation efficiency of the lighting device 1100 may be enhanced.

A shape of the light emitting device board 1113 is not particularly limited and, preferably, the light emitting device board 1113 may have a substantially circular or polygonal shape in order to satisfy the ANSI standard as described above. Here, as illustrated in FIG. 35A, the light emitting device board 1113 regarding the present example embodiment has an opening 1113a. The shape of the opening 1113a may have a substantially circular, oval, polygonal shape, or the like, and is not particularly limited. However, a size of the opening 1113a must be greater than a lower portion of the upper heat sink 1140, and the light emitting device board 1113 and the upper heat sink 1140 should not be in contact. In this regard, as described hereinafter, in the present example embodiment, the upper heat sink 1140 needs to be installed such that it is thermally blocked from the light emitting module 1110 and only dissipates heat generated by the driving circuit 1160 outwardly.

Also, the light emitting device board 1113 is supported by an upper portion of the lower heat sink 1130 (or the heat dissipation plate 1170), whereby a position of the light emitting device board 1113 is fixed.

(Upper Heat Sink 1140)

The upper heat sink 1140 serves to dissipate heat generated by the driving circuit 1160 outwardly. In order to implement the heat dissipation function, the upper heat sink 1140 is formed of a metal having high thermal conductivity such as aluminum, copper, or the like, or formed of a material such as a resin having high thermal conductivity. Also, in order to further enhance the heat dissipation effect, the upper heat sink 1140 may have a concave portion, a plurality of fins, or the like, to increase a surface area thereof.

In this sense, the upper heat sink 1140 according to the present example embodiment may have a substantially cylindrical hollow shape with an opening 1141 formed in one end thereof. Since the upper heat sink 1140 has the cylindrical hollow portion, a surface area of an outwardly exposed surface of the upper heat sink 1140 (area of the surface used to dissipate heat) is increased to enhance the heat dissipation effect. Also, in order to enhance the heat dissipation effect, in addition to the hollow shape, for example, the upper heat sink 1140 may have a substantially cylindrical or columnar body portion and the body portion may have a plurality of fins exposed outwardly.

Also, the upper heat sink 1140 is installed on one side of the ring configured according to the disposition of the light emitting devices 1111 in the central axis direction, based on the light emitting device board 1113. In this case, the upper heat sink 1140 may be installed to be in contact with the driving circuit 1160 by the medium of the heat conduction member 1180. In this manner, since the upper heat sink 1140 is installed to be in contact with the driving circuit 1160 by way of the heat conduction member 1180, the upper heat sink 1140 may serve to dissipate heat generated by the driving circuit 1160 outwardly. Here, the upper heat sink 1140 may be installed not to be in contact with the light emitting module 1110 as mentioned above, and also, since the upper heat sink 1140 is thermally blocked from the lower heat sink 1120 (by an insulator 1181 as described hereinafter) (or it may not be completely thermally blocked from the lower heat sink 1120, and the rest is the same), the upper heat sink 1140 may effectively dissipate heat generated by the driving circuit 1160, without being affected by heat generated by the light emitting module 1110, enhancing heat dissipation efficiency of the driving circuit 1160.

In FIGS. 33 and 34, the upper heat sink 1140 is illustrated as having a cylindrical shape, but the shape of the upper heat sink 1140 may not be limited thereto and the upper heat sink 1140 may have, for example, a reversed circular truncated conical shape having a diameter increased as it is spaced apart from the light emitting device board 1113.

(Lower Heat Sink 1120)

The lower heat sink 1120 is connected to a socket (not shown) in one end thereof (a lower end in FIGS. 33 through 35) and serves to dissipate heat generated by the light emitting module 1110 outwardly. In order to implement the heat dissipation function, the lower heat sink 1120 may be formed of a resin having high thermal conductivity. In the present example embodiment, the lower heat sink 1120 is formed of a resin, rather than a metal, so as to reduce a weight of the lighting device 1100, and in addition, since a resin has insulating properties, there is no need to take measures for insulation in a caulking portion when the lower heat sink 1120 is connected to a socket. Thus, in a case in which an increase in weight of the lighting device 1100 is not problematic, a metal such as aluminum, copper, or the like, may be used as a material of the lower heat sink 1120. However, in the case in which the lower heat sink 1120 is formed of a metal, insulation measures need to be taken in the caulking portion of the socket.

Also, in order to further increase the heat dissipation effect, a concave portion or a plurality of fins may be installed on the lower heat sink 1120 to increase a surface area of the lower heat sink 1120.

In this respect, in the present example embodiment, the lower heat sink 1120 may have a plurality of fins 1129 formed in an outer circumferential surface of a substantially hollow cylindrical body portion with openings formed in both ends thereof. With the plurality of fins 1129, a surface area of an outwardly exposed surface of the lower heat sink 1120 (an area of the surface used to dissipate heat) may be increased to enhance a heat dissipation effect. Alternatively, in order to enhance the heat dissipation effect, for example, a plurality of concave portions (not shown) may be formed in the outer circumferential surface of the body portion of the lower heat sink 1120, in addition to the fins 1129.

Also, the lower heat sink 1120 is installed on the other side of a ring configured according to a disposition of the light emitting device 1111 in a central axis direction, based on the light emitting device board 1113 as a reference. Accordingly, the lower heat sink 1120 may dissipate heat generated by the driving circuit 1160 or the light emitting module 1110 outwardly therefrom, independently of the upper heat sink 1140.

Thus, heat dissipation efficiency of the lighting device 1100 may be remarkably enhanced, compared to the case in which only a single heat sink is provided.

Here, as described hereinafter, the lower heat sink 1120 may be thermally blocked from the driving circuit 1160 by means of the insulator 1181, and also, thermally blocked from the upper heat sink 1140. Thus, the lower heat sink 1120 may effectively dissipate heat generated by the light emitting module 1110, without being affected by heat generated by the driving circuit 1160, enhancing heat dissipation efficiency of the light emitting module 1110.

In addition, in the present example embodiment, the lower heat sink 1120 includes a resin 1121 and a metal member 1123 insertedly positioned within the resin 1121. The lower heat sink 1120 is obtained by integrally insert-molding the resin 1121 and the metal member 1123. This is because, the resin 1121 alone has low thermal conductivity, relative to a metal such as aluminum, copper, or the like, and thus, in order to increase thermal conductivity, the metal member 1123 such as aluminum, copper, or the like, is inserted into the resin 1121. Thus, if heating of the light emitting module 1110 is suppressed through management of performance of the light emitting module 1110 to have a sufficient heat dissipation effect, the metal member 1123 may not need to be inserted.

Also, in the case of inserting the metal member 1123, preferably, the metal member 1123 is disposed to be in contact with the heat dissipation plate 1170 (without the heat dissipation plate 1170, the metal member 1123 is disposed to be in contact with the light emitting device board 1113) in order for heat generated by the light emitting module 1110 to be easily transmitted to the lower heat sink 1120.

The lower heat sink 1120 may also serve as a case in which the driving circuit 1160 is accommodated, in addition to the heat dissipation function as described above. In the present example embodiment, the driving circuit 1160 is installed within the hollow body portion of the lower heat sink 1120.

Also, in general, in a lighting device using a semiconductor light emitting device such as an LED, or the like, the light emitting module 1110 has a heating value greater than that of the driving circuit 1160. According to the configuration of the lighting device 1100 regarding the present example embodiment, since the light emitting module 1110 having a high heating value is thermally combined with the lower heat sink 1120 having a size (surface area) greater than that of the upper heat sink 1140 and a high radiant value, heat dissipation efficiency may be enhanced, compared to the opposite case.

(Globe 1130)

The globe 1130 is installed to have a substantially spherical shape in order to cover the light emitting module 1110 and serves to control a color (luminous color of the light emitting device 1111) of light output from the light emitting device 1111 and serves to diffuse light from a surface thereof to broaden a light distribution angle of the lighting device 1110.

In order to allow for the role of controlling a luminous color of the light emitting device 1111, the globe 1130 includes a phosphor or a light diffuser according to a luminous color of the light emitting device 1111. In detail, in a case in which the light emitting device 1111 is an LED emitting blue light, the globe 1130 may be formed of a metal containing a phosphor or may have a surface coated with a phosphor. For example, in a case in which the globe 1130 is formed of a resin, the resin may contain fluorescent pigment, or in a case in which the globe 1130 is formed of glass, the globe 1130 may have a surface coated with fluorescent pigment. A wavelength of light output from the light emitting device 1111 and arriving at the globe 1130 is converted by the phosphor of the globe 1130 to emit white light.

Here, light wavelength-converted by the phosphor has a high degree of light diffusion, so even in the case that light distribution of light output from the light emitting device 1111 is insufficient, a desirable light distribution may be obtained by light diffusion when light is emitted by the phosphor. Also, since the blue LED is combined with a phosphor, light having characteristics close to those of natural light may be emitted.

Also, in order to further broaden the light distribution angle of the lighting device 1100, the globe 1130 may be formed of a material further containing a light diffuser in addition to the phosphor, or a light diffuser may be further coated on the surface of the globe 1130 in addition to the phosphor.

Meanwhile, in a case in which the light emitting device 1111 is an LED emitting white light, the globe 1130 may be formed of a material containing a light diffuser or may have a surface coated with a light diffuser. Also, in this case, light output from the light emitting device 1111 may be diffused from the surface of the globe 1130 by the light diffuser, broadening a light distribution angle of the lighting device 1100.

In the present example embodiment, an opening connected to an upper end portion (end portion of the side where the opening 1141 is formed) of the upper heat sink 1140 is formed in a top portion (end portion opposite to the light emitting module 1110 side) of the globe 1130. Accordingly, since the hollow portion of the upper heat sink 1140 is exposed outwardly, heat dissipation efficiency of the lighting device 1100 may be enhanced.

Also, an opening (not shown) is formed in a lower portion (end portion of the light emitting module 1110 side) of the globe 1130, and the globe 1130 is connected to the light emitting device board 1113, the heat dissipation plate 1170, or the lower heat sink 1120 thorough the opening.

(Driving Circuit 1160)

The driving circuit 1160 is a power circuit installed within the lower heat sink 1120 and driving (lighting) the light emitting device 1111 using power supplied from an external source through a socket. The driving circuit 1160 includes a plurality of electronic components mounted on a board, and the plurality of electronic components generate heat when driving the light emitting device 1111. Heat generated by the driving circuit 1160 is transmitted to the upper heat sink 1140 through the heat conduction member 1180 so as to be dissipated outwardly.

Also, the driving circuit 1160 regarding the present example embodiment does not have an electrolytic capacitor for converting an alternating current (AC) into a direct current (DC). A life of LED lighting devices on the market is known as tens of thousands of hours, but in actuality, a life of an electrolytic capacitor is thousands of hours, so before an LED lighting device is no longer of use, the electrolytic capacitor needs to be changed. In contrast, the driving circuit 1160 regarding the present example embodiment does not have an electrolytic capacitor for converting an AC into a DC, so there is no need to replace a component at the time of termination of thousands of hours and a life of the lighting device 1100 may be significantly lengthened.

(Heat Dissipation Plate 1170)

The heat dissipation plate 1170 may be installed to be in contact with the lower heat sink 1120 to transmit heat generated by the light emitting module 1110 to the lower heat sink 1120. In order to implement the role of heat transmission, the heat dissipation plate 1170 may be formed of a metal having a high degree of conductivity, such as aluminum, copper, or the like.

Here, as illustrated in FIG. 35B, the heat dissipation plate 1170 has an opening 1170a formed at the center thereof. The opening 1170a has a substantially circular, oval, or polygonal shape and is not particularly limited in shape. However, the opening 1170a needs to be greater than a lower portion of the upper heat sink 1140, and the heat dissipation plate 1170 and the upper heat sink 1140 need not be in contact. This is because, in the present example embodiment, the upper heat sink 1140 needs to be installed such that it is thermally blocked from the light emitting module 1110 and dissipates only heat generated by the driving circuit 1160 outwardly.

Also, if heat dissipation efficiency of the lighting device 1110 is sufficiently high and precision in determining positions of the light emitting device board 1113, the globe 1130, and the upper heat sink 1140 is secured, the heat dissipation plate 1170 may not necessarily be installed.

(Heat Conduction Member 1180)

The heat conduction member 1180 is formed of a material having thermal conductivity (hereinafter, referred to as a "thermally conductive material") and thermally combine the upper heat sink 1140 and the driving circuit 1160. The thermally conductive material may include a material that may be formed to have a sheet form or a film form, or a material having qualities and a state that may be injected into a frame to fill the same. Such a material may be, for example, a resin having thermal conductivity, and among resins, in particular, a silicon resin or an epoxy resin having high thermal conductivity is desirable.

Also, if the thermal conduction member 1180 is in contact with the lower heat sink 1120 or the light emitting module 1110 to make the upper heat sink 1140 thermally combined with the lower heat sink 1120 and the light emitting module 1110, heat generated by the light emitting module 1110 may be transmitted to the driving circuit 1160 or the upper heat sink 1140. Thus, in the present example embodiment, the insulator 1181 such as a resin, or the like, is provided to cover an inner circumferential surface of the lower heat sink 1120 and further the lower portion of the upper heat sink 1140 or a main surface of the thermal conduction member 1180 to thermally block the upper heat sink 1140 from the lower heat sink 1120 and the light emitting module 1110.

(Other Components)

Besides, the lighting device 1100 regarding the present example embodiment may include other members as needed. For example, in order to enhance light distribution characteristics of the lighting device 1100, the lighting device 1100 may have a reflector (not shown) reflecting light output from the light emitting device 1111 to distribute light in the direction toward a socket.

<Seventh Example Embodiment>

[Operational Effect of Lighting Device According to Seventh Example Embodiment]

Figure 36:
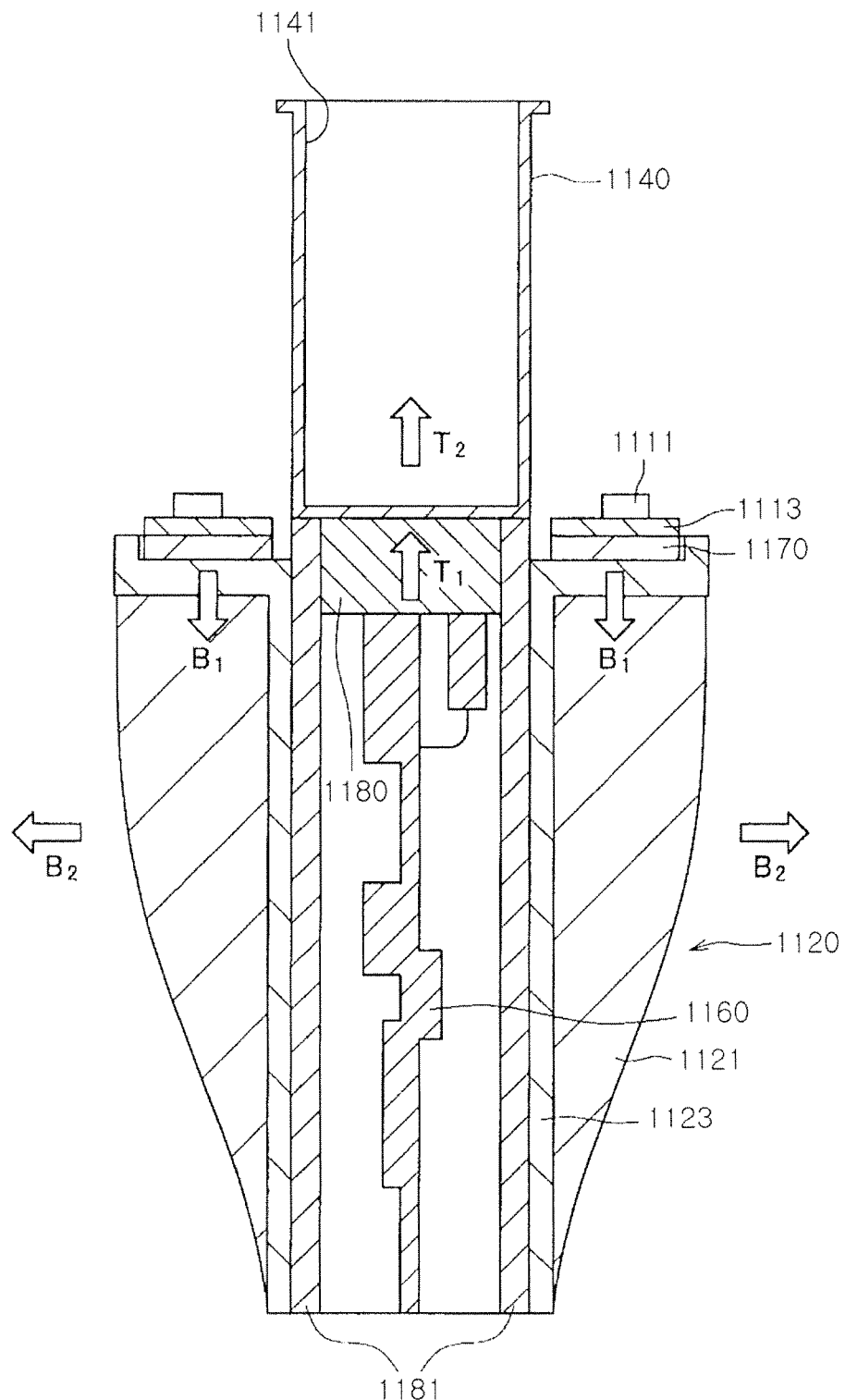
FIG. 36 is a view illustrating a flow of heat in the lighting device regarding the seventh example embodiment.

Hereinafter, operational effects of the lighting device 1100 having the foregoing configuration above will be described. FIG. 36 is a view illustrating a flow of heat in the lighting device 1100 regarding the seventh example embodiment. In FIG. 36, the globe 1130 is omitted for clarification.

The lighting device 1100 has two mainly heating parts (heating elements)). A first one is the light emitting module 1110. When the light emitting device 1111 is driven by the driving circuit 1160 to output light, heat is generated in the light emitting module 1110. Heat generated by each of the light emitting devices 1111 is transmitted to the light emitting device board 1113 on which the light emitting devices 1111 are mounted. Here, the light emitting device board 1113, the heat dissipation plate 1170, and the lower heat sink 1120 (resin 1121 and metal member 1123) are formed of a material having high thermal conductivity.

Thus, heat generated by the light emitting module 1110 (heat generated by the light emitting devices 1111 and transmitted to the light emitting device board 1113) is first transmitted to the heat dissipation plate 1170 in contact with a lower surface of the light emitting device board 1113, passing through the metal member 1123, and transmitted to the resin 1121 as indicated by the arrow B1 of FIG. 36. Heat transmitted to the resin 1121 is dissipated from the fins 1129, or the like, as indicated by the arrow B2.

Meanwhile, a second heating element is the driving circuit 1160. Heat generated by the driving circuit 1160 passes through the heat conduction member 1180 from the driving circuit 1160 and is transmitted to the upper heat sink 1140 as indicated by the arrow T1, and outwardly dissipated from a main surface within the opening 1141 of the upper heat sink 1140 as indicated by the arrow T2.

Here, in the present example embodiment, the upper heat sink 1140 may be thermally combined only with the driving circuit 1160, among the two heating elements, and thermally blocked (isolated) from the light emitting devices 1111 and the lower heat sink 1120. Also, the lower heat sink 1120 may be thermally combined only with the light emitting module 1110, among the two heating elements, and thermally isolated from the driving circuit 1160 and the upper heat sink 1140. For this reason, the lower heat sink 1120 may effectively dissipate heat from the light emitting module 1110, without being affected by heat generated by the driving circuit 1160, improving heat dissipation efficiency of the light emitting module 1110. Conversely, the upper heat sink 1140 may effectively dissipate heat from the driving circuit 1160, without being affected by heat generated by the light emitting module 1110, improving heat dissipation efficiency of the driving circuit 1160.

As described above, even though the lighting device 1100 has two heat dissipation paths including heat dissipation from the upper heat sink 1140 and heat dissipation from the lower heat sink 1120, since the two heat dissipation paths are used to dissipate heat of only any one of the two heating elements, heat dissipation efficiency in each of the heat dissipation paths (in particular, from the upper heat sink 1140) may be enhanced.

[Method of Manufacturing Lighting Device According to Seventh Example Embodiment]

Figure 37:
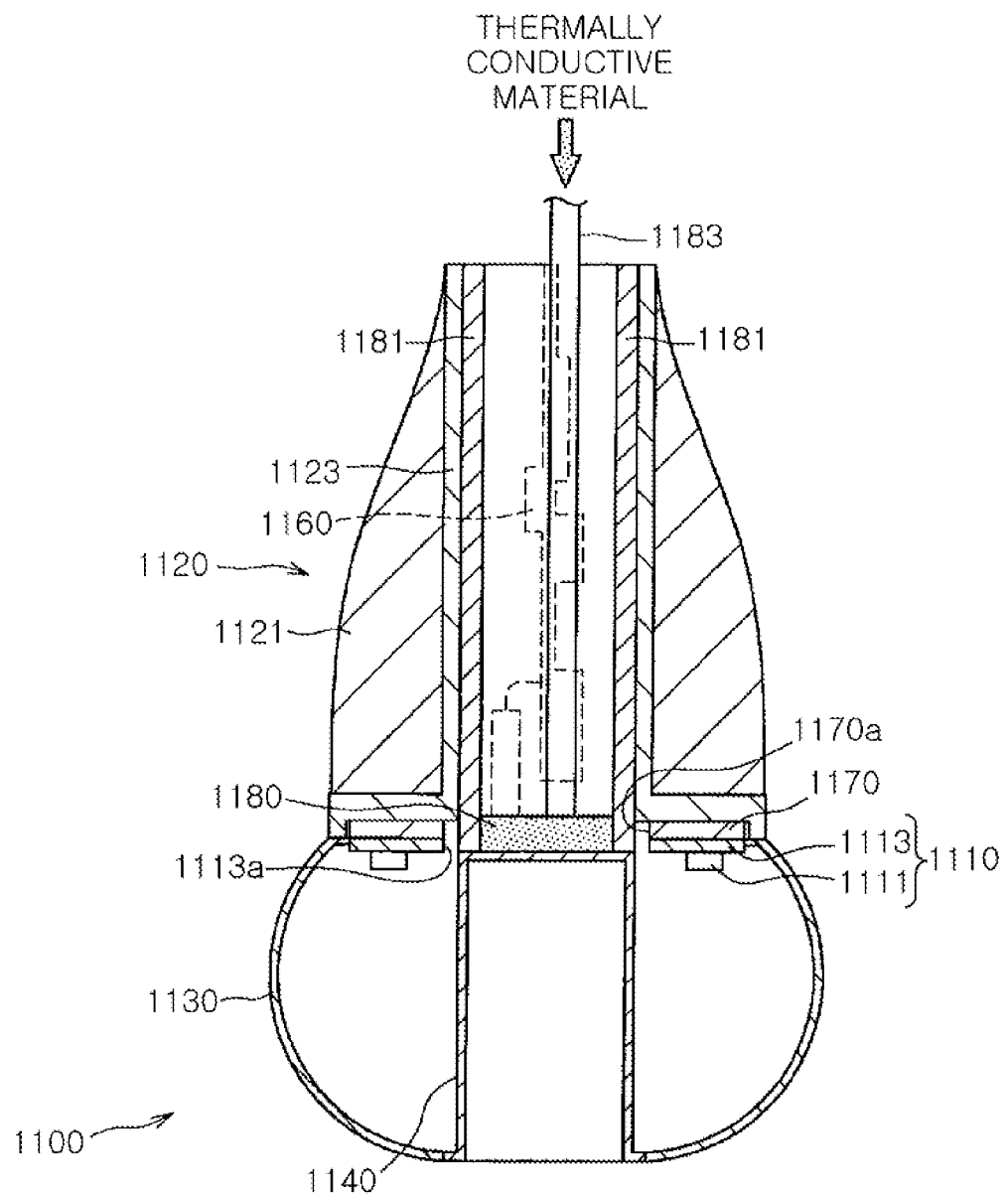
FIG. 37 is a view illustrating an example of a method of manufacturing a lighting device regarding the seventh example embodiment.

A method of manufacturing the lighting device 1100 regarding the present example embodiment will be described in detail with reference to FIG. 37. FIG. 37 is a view illustrating an example of a method of manufacturing the lighting device 1100 regarding the seventh example embodiment.

In assembling the lighting device 1100, first, respective components, namely, the light emitting module 1110, the upper heat sink 1140, the lower heat sink 1120, the globe 1130, the driving circuit 1160, and the heat dissipation plate 1170 as needed, are prepared. Subsequently, the driving circuit 1160 is installed within (hollow portion) the lower heat sink 1120, and the heat dissipation plate 1170 is disposed above the lower heat sink 1120 with the driving circuit 1160 installed therein. The heat dissipation plate 1170 is fixed to the metal member 1123 of the lower heat sink 1120 at this point of time.

Next, the light emitting module 1110 is fixed to the heat dissipation plate 1170. The globe 1130 is disposed to cover the light emitting module 1110, and the upper heat sink 1140 is inserted from the opening of the globe 1130 such that a position of an end portion of the opening of the upper heat sink 1140 and a position of the opening of the globe 1130 are aligned. Also, the insulator 1181 such as a resin, or the like, is disposed on the inner circumferential surface of the lower heat sink 1120 such that an end portion thereof is in contact with a circumferential edge portion of the lower portion of the upper heat sink 1140.

The resultant assembled structure so far is reversed overall and a thermally conductive material in a molten state is injected into the hollow portion of the lower heat sink 1120 from an opening at the socket connection side of the lower heat sink 1120 by using, for example, a nozzle 1183, or the like. After the thermally conductive material is injected until when at least the lower portion of the upper heat sink 1140 and the driving circuit 1160 are thermally combined by the thermally conductive material, and the thermally conductive material is cured to form the thermal conduction member 1180.

Finally, although not shown, a socket is connected to a lower end portion of the lower heat sink 1120, thus manufacturing the lighting device 1100 regarding the present example embodiment.

<Eighth Example Embodiment>

Figure 38:
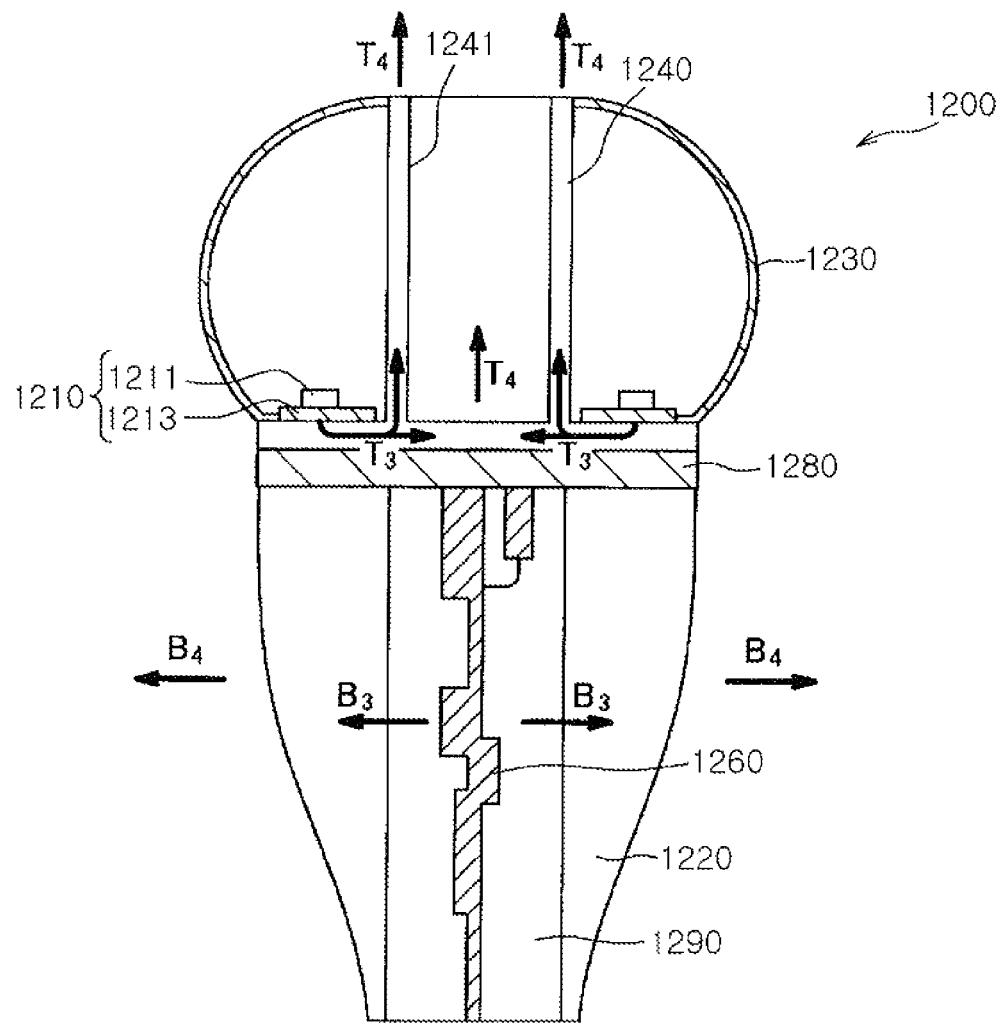
FIG. 38 is a view illustrating an overall configuration of a lighting device and a flow of heat regarding an eighth example embodiment.

Hereinafter, a lighting device regarding the eighth example embodiment of the present disclosure will be described with reference to FIG. 38. FIG. 38 is a view illustrating an overall configuration of a lighting device 1200 and a flow of heat regarding an eighth example embodiment.

In the lighting device 1100 regarding the seventh example embodiment as described above, the upper heat sink 1140 dissipates heat generated by the driving circuit 1160 and the lower heat sink 1140 dissipates heat generated by the light emitting module 1110. In contrast, in the lighting device 1200 regarding the present example embodiment, the upper heat sink 1140 dissipates heat generated by the light emitting module 1110 and the lower heat sink 1120 dissipates heat generated by the driving circuit 1160.

As described above, in general, a quantity of heat generated by the light emitting module 1110 is greater than that generated by the driving circuit 1160, and thus, preferably, the lower heat sink 1120 which may be designed to have a greater surface area structurally dissipates heat generated by the light emitting module. However, for example, if the upper heat sink 1140 is formed of a material (for example, carbon, or the like) having thermal conductivity and heat dissipation efficiency higher than those of aluminum, copper, or the like, to dissipate a large quantity of heat generated by the light emitting module 1110, the upper heat sink 1140 may serve to dissipate heat generated by the light emitting module 1110 while the lower heat sink 1120 may serve to dissipate heat generated by the driving circuit 1160.

In this manner, in the case in which heat generated by the driving circuit having a relatively small amount of heating value is dissipated by the lower heat sink 1120, a size of the lower heat sink 1120 may be reduced, and thus, light output from the light emitting device 1111 may be easily distributed in the direction toward a socket, relative to the horizontal direction. Hereinafter, each component of the lighting device 1200 will be described.

[Configuration of Lighting Device According to Eighth Example Embodiment]

As illustrated in FIG. 38, the lighting device 1200 includes a light emitting module 1210, an upper heat sink 1240, a lower heat sink 1220, a heat conduction member 1290, a globe 1230, a driving circuit 1260, and an insulator 1280.

(Light Emitting Module 1210)

A configuration of the light emitting module 1210 is identical to that of the light emitting module 1110 regarding the seventh example embodiment, so a detailed description thereof will be omitted.

(Upper Heat Sink 1240)

The upper heat sink 1240 serves to dissipate heat generated by the light emitting module 1210 outwardly. In order to implement the heat dissipation function, the upper heat sink 1240 may be formed of a metal, a resin, an inorganic material, or the like, having high thermal conductivity, and in this case, since the upper heat sink 1240 is required to have especially high heat dissipation efficiency, the upper heat sink 1240 may be formed of a material such as carbon, for example. Also, in order to further enhance the heat dissipation effect, the upper heat sink 1240 may have a concave portion, a plurality of fins, or the like, to increase a surface area thereof.

In this sense, the upper heat sink 1240 according to the present example embodiment may have a shape in which a substantially disk-shaped lower portion is connected to an end portion of a substantially cylindrical hollow body portion with an opening 1241 formed in one end thereof. Since the upper heat sink 1240 has the cylindrical hollow portion, a surface area of an outwardly exposed surface of the upper heat sink 1240 (area of the surface used to dissipate heat) may be increased to enhance the heat dissipation effect. Also, in order to enhance the heat dissipation effect, in addition to the hollow shape, for example, the upper heat sink 1140 may have a substantially cylindrical or columnar body portion and the body portion may have a plurality of fins exposed outwardly. Also, the upper heat sink 1240 has the substantially disk-shaped lower portion, and by disposing a light emitting device board 1213 having a doughnut shape according to the eighth example embodiment in the lower portion of the upper heat sink 1240, the upper heat sink 1240 and the light emitting device board 1213 may be in direct contact.

Also, the upper heat sink 1240 is installed on one side of a ring configured according to a disposition of the light emitting device 1211 in a central axis direction, based on the light emitting device board 1213 as a reference. In this case, the upper heat sink 1240 may be installed to be in contact only with the light emitting device board 1213. In this manner, since the upper heat sink 1240 is installed to be in contact only with the light emitting device board 1213, it serves to dissipate heat generated by the light emitting module 1210 outwardly. Here, since the upper heat sink 1240 is thermally isolated from the driving circuit 1260 and the lower heat sink 1220 by the insulator 1280 as described hereinafter, the upper heat sink 1240 may effectively dissipate heat generated by the light emitting module 1210, without being affected by heat generated by the driving circuit 1260, enhancing heat dissipation efficiency of the light emitting module 1210.

Also, in FIG. 38, a body portion of the upper heat sink 1240 has a cylindrical shape, but the shape of the body portion of the upper heat sink 1240 is not limited thereto and the body portion of the upper heat sink 1240 may have, for example, a reversed circular truncated conical shape having a diameter increased as it is spaced apart from the disk-shaped lower portion.

(Lower Heat Sink 1220)

The lower heat sink 1220 is connected to a socket (not shown) in one end thereof (a lower end in FIG. 38) and serves to dissipate heat generated by the driving circuit 1260 outwardly. In order to implement the heat dissipation function, the lower heat sink 1220 may be formed of a resin having high thermal conductivity. In the present example embodiment, the lower heat sink 1220 is formed of a resin, rather than a metal, so as to reduce a weight of the lighting device 1200, and in addition, since a resin has insulating properties, there is no need to take measures for insulation in a caulking portion when the lower heat sink 1220 is connected to a socket. Thus, in a case in which an increase in weight of the lighting device 1200 is not problematic, a metal such as aluminum, copper, or the like, may be used as a material of the lower heat sink 1220. However, in the case in which the lower heat sink 1220 is formed of a metal, insulation measures need to be taken in the caulking portion of the socket.

Also, in order to further increase the heat dissipation effect, a concave portion or a plurality of fins may be installed on the lower heat sink 1220 to increase a surface area of the lower heat sink 1220.

Also, the lower heat sink 1220 is installed on the other side of a ring configured according to a disposition of the light emitting device 1211 in a central axis direction, based on the light emitting device board 1213 as a reference. Accordingly, the lower heat sink 1220 may dissipate heat generated by the driving circuit 1260 outwardly therefrom, independently of the upper heat sink 1240. Thus, heat dissipation efficiency of the lighting device 1200 may be remarkably enhanced, compared to the case in which only a single heat sink is provided.

Here, as described hereinafter, the lower heat sink 1220 is thermally blocked from the light emitting module 1210 by means of the insulator 1280, and also, thermally blocked from the upper heat sink 1240. Thus, the lower heat sink 1220 may effectively dissipate heat generated by the driving circuit 1260, without being affected by heat generated by the light emitting module 1210, enhancing heat dissipation efficiency of the driving circuit 1260.

The lower heat sink 1220 may also serve as a case in which the driving circuit 1260 is accommodated, in addition to the heat dissipation function as described above. In the present example embodiment, the driving circuit 1260 is installed within the hollow body portion of the lower heat sink 1220.

In the present example embodiment, in order to thermally combine the lower heat sink 1220 and the driving circuit 1260, the hollow portion of the lower heat sink 1220 is filled with a thermally conductive material 1290. The thermally conductive material 1290 may include a material that may be formed to have a sheet form or a film form, or a material having qualities and a state that may be injected into a frame to fill the same. Such a material may be, for example, a resin having thermal conductivity, and among resins, in particular, a silicon resin or an epoxy resin having high thermal conductivity is desirable.

(Globe 1230)

A configuration of the globe 1230 is identical to that of the globe 1130 regarding the seventh example embodiment, so a detailed description thereof will be omitted.

(Driving Circuit 1260)

The driving circuit 1260 is a power circuit installed within the lower heat sink 1220 and driving (lighting) the light emitting device 1211 using power supplied from an external source through a socket. The driving circuit 1260 includes a plurality of electronic components mounted on a board, and the plurality of electronic components generate heat when driving the light emitting device 1211. Heat generated by the driving circuit 1260 is transmitted to the lower heat sink 1220 through the heat conduction member 1290 so as to be dissipated outwardly.

Also, other configurations of the driving circuit 1260 are identical to that of the driving circuit 1160 regarding the seventh example embodiment, so detailed descriptions thereof will be omitted.

(Insulator 1280)

The insulator 1280 is formed of a resin without thermal conductivity, or the like, and thermally blocks the upper heat sink 1240 from the lower heat sink 1220 and the driving circuit 1260. If the upper heat sink 1240 is thermally combined with the lower heat sink 1220 and the driving circuit 1260, heat generated by the light emitting module 1210 may be transmitted to the driving circuit 1260 or the lower heat sink 1220. Thus, in the present example embodiment, the substantially disk-shaped insulator 1280 is disposed between a lower portion of the upper heat sink 1240 and the lower heat sink 1220 to thermally block the upper heat sink 1240 from the lower heat sink 1220 and the driving circuit 1260. Also, a shape of the insulator 1280 is not particularly limited and the insulator 1280 may have any shape as long as it can thermally block the upper heat sink 1240 from the lower heat sink 1220 and the driving circuit 1260.

(Other Components)

Besides, the lighting device 1200 regarding the present example embodiment may include other members as needed. For example, in order to enhance light distribution characteristics of the lighting device 1200, the lighting device 1200 may have a reflector (not shown) reflecting light output from the light emitting device 1211 to distribute light in the direction toward a socket.

[Operational Effect of Lighting Device According to Eighth Example Embodiment]

Hereinafter, operational effects of the lighting device 1200 having the foregoing configuration above will be described with reference to FIG. 38.

The lighting device 1200 has two mainly heating parts (heating elements)). A first one is the light emitting module 1210. When the light emitting device 1211 is driven by the driving circuit 1260 to output light, heat is generated in the light emitting module 1210. Heat generated by each of the light emitting devices 1211 is transmitted to the light emitting device board 1213 on which the light emitting devices 1211 are mounted. Here, the light emitting device board 1213 and the upper heat sink 1240 are formed of a material having high thermal conductivity.

Thus, heat generated by the light emitting module 1210 (heat generated by the light emitting devices 1211 and transmitted to the light emitting device board 1213) is transmitted to the lower portion of the upper heat sink 1240 in contact with a lower surface of the light emitting device board 1213 as indicated by the arrow T3. The heat transmitted to the lower portion of the upper heat sink 1240 is outwardly dissipated from the bottom surface within the opening 1241 of the upper heat sink 1240 as is as indicated by the arrow T4. Or, the heat transmitted to the lower portion of the upper heat sink 1240 is transmitted to the body portion of the upper heat sink 1240 as indicated by the arrow T3 and subsequently outwardly dissipated from a portion of an inner circumferential surface of the body portion of the upper heat sink 1240 as indicated by the arrow T4.

Meanwhile, a second heating element is the driving circuit 1260. Heat generated by the driving circuit 1260 is transmitted from the driving circuit 1260 to the lower heat sink 1220 through the thermally conductive material 1290 as indicated by the arrow B3 in FIG. 38, and outwardly dissipated from an outer circumferential surface of the lower heat sink 1220 as indicated by the arrow B4.

Here, in the present example embodiment, the upper heat sink 1240 is thermally combined only with the light emitting module 1210, among the two heating elements, and thermally blocked (isolated) from the driving circuit 1260 and the lower heat sink 1220. Also, the lower heat sink 1220 is only thermally combined with the driving circuit 1260, among the two heating elements, and thermally isolated from the light emitting module 1210 and the upper heat sink 1240. For this reason, the upper heat sink 1240 may effectively dissipate heat from the light emitting module 1210, without being affected by heat generated by the driving circuit 1260, improving heat dissipation efficiency of the light emitting module 1210. Conversely, the lower heat sink 1220 may effectively dissipate heat from the driving circuit 1260, without being affected by heat generated by the light emitting module 1210, improving heat dissipation efficiency of the driving circuit 1260.

As described above, even though the lighting device 1200 has two heat dissipation paths including heat dissipation from the upper heat sink 1240 and heat dissipation from the lower heat sink 1220, since the two heat dissipation paths are only used to dissipate heat from any one of the two heating elements, heat dissipation efficiency in each of the heat dissipation paths may be enhanced.

[Method of Manufacturing Lighting Device According to Eighth Example Embodiment]

A method of manufacturing the lighting device 1200 regarding the present example embodiment will be described in detail.

In assembling the lighting device 1200, first, respective components, namely, the light emitting module 1210, the upper heat sink 1240, the lower heat sink 1220, the globe 1230, the driving circuit 1260, and the insulator 1280 are prepared. Subsequently, the driving circuit 1260 is installed within (hollow portion) the lower heat sink 1220, and the insulator 1280 is disposed above the lower heat sink 1220 with the driving circuit 1260 installed therein. The insulator 1280 is fixed to the lower heat sink 1220 at this point of time.

Next, the upper heat sink 1240 is fixed to the insulator 1280. The light emitting module 1210 is installed on a lower portion of the upper heat sink 1240, and the globe 1230 is installed to cover the light emitting module 1210. In this case, an end portion of the opening of the upper heat sink 1240 and the opening of the globe 1230 are aligned in position.

The resultant assembled structure so far is reversed overall and the thermally conductive material 1290 in a molten state is injected into the hollow portion of the lower heat sink 1220 from an opening at the socket connection side of the lower heat sink 1220 by using, for example, a nozzle, or the like. After the thermally conductive material 1290 is injected until when the hollow portion of the lower heat sink 1220 is filled with the thermally conductive material 1290, the thermally conductive material 1290 is cured.

Finally, although not shown, a socket is connected to a lower end portion of the lower heat sink 1220, thus manufacturing the lighting device 1200 regarding the present example embodiment.

So far, the example embodiments of the present disclosure have been described in detail with reference to the accompanying drawings, but the present disclosure is not limited thereto. For example, in the seventh and eighth example embodiments as described above, the cross-sections taken in the direction perpendicular with respect to a central axis of the light emitting device board, the first heat sink, the second heat sink, the globe, and the heat dissipation plate have a circular shape, but the present disclosure is not limited thereto. For example, a cross-section of each of the members may have a polygonal or oval shape.

Also, in the seventh and eighth example embodiments as described above, only the single light emitting device group including a plurality of light emitting devices disposed in an annular arrangement on the light emitting device board is provided, but the present disclosure is not limited thereto. For example, a plurality of light emitting groups may be installed in a concentric circle on the light emitting device board.

<Ninth Example Embodiment>

[Configuration of Lighting Device According to Ninth Example Embodiment]

Figure 39:
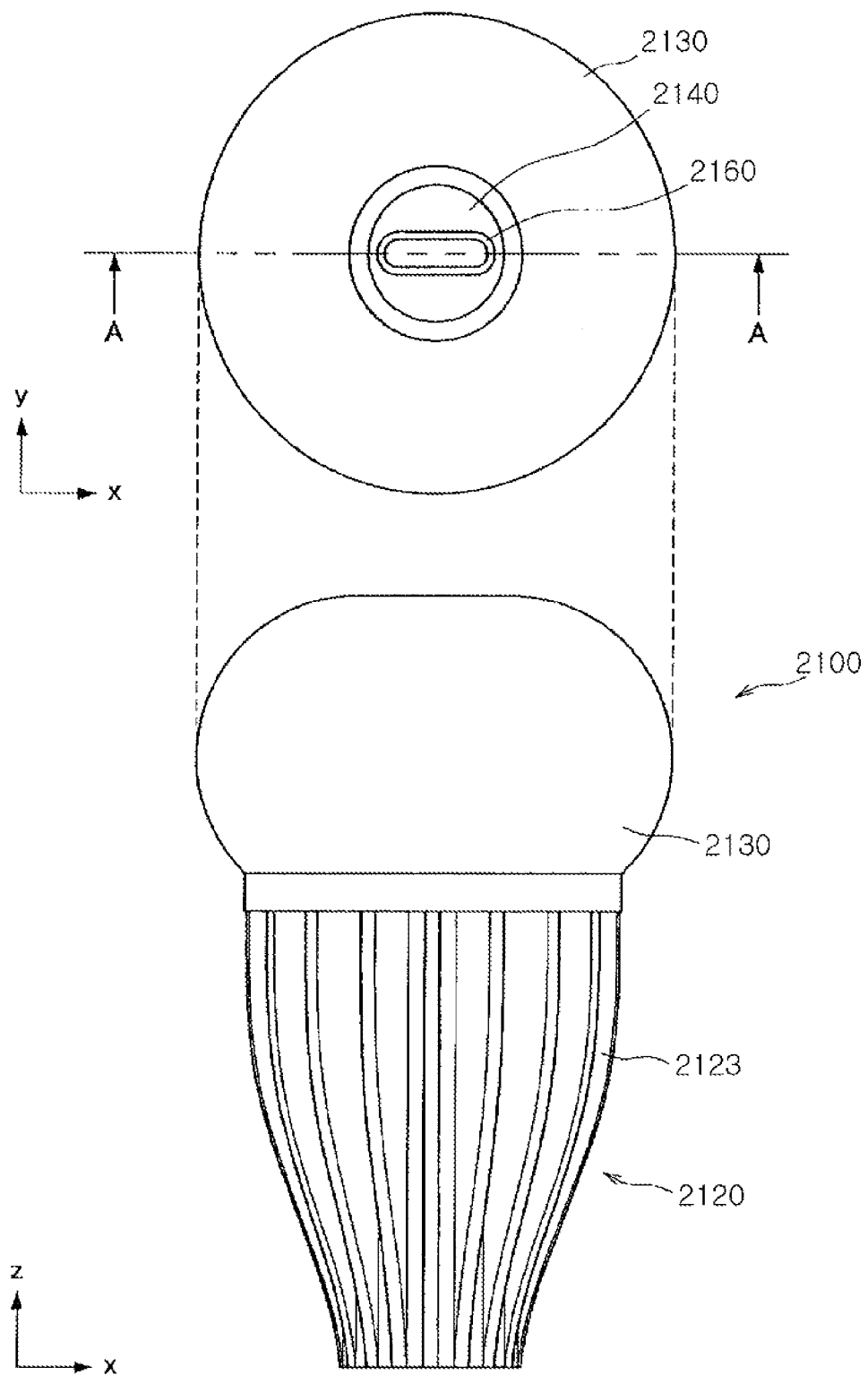
FIG. 39 includes a plan view and a side view illustrating a lighting device according to a ninth example embodiment of the present disclosure.
Figure 40:
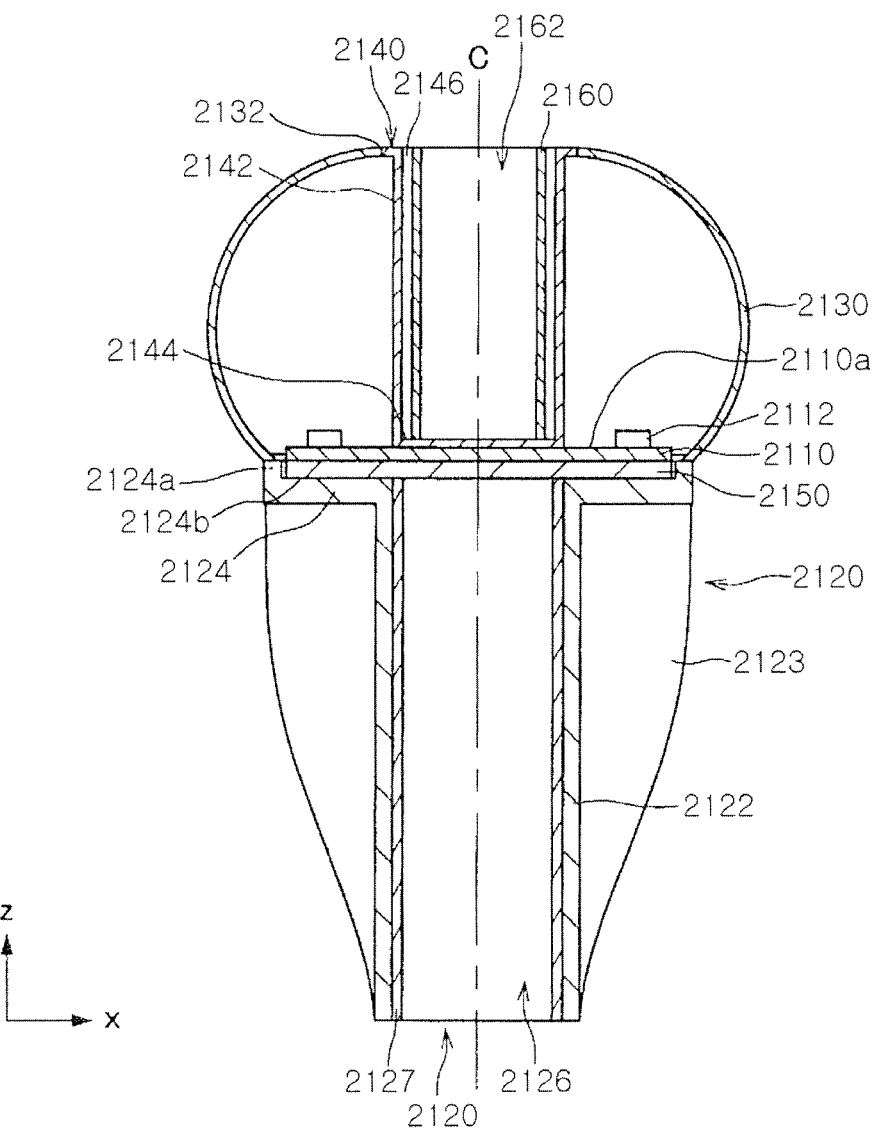
FIG. 40 is a cross-sectional view of the lighting device of FIG. 39 taken along line A-A.
Figure 41:
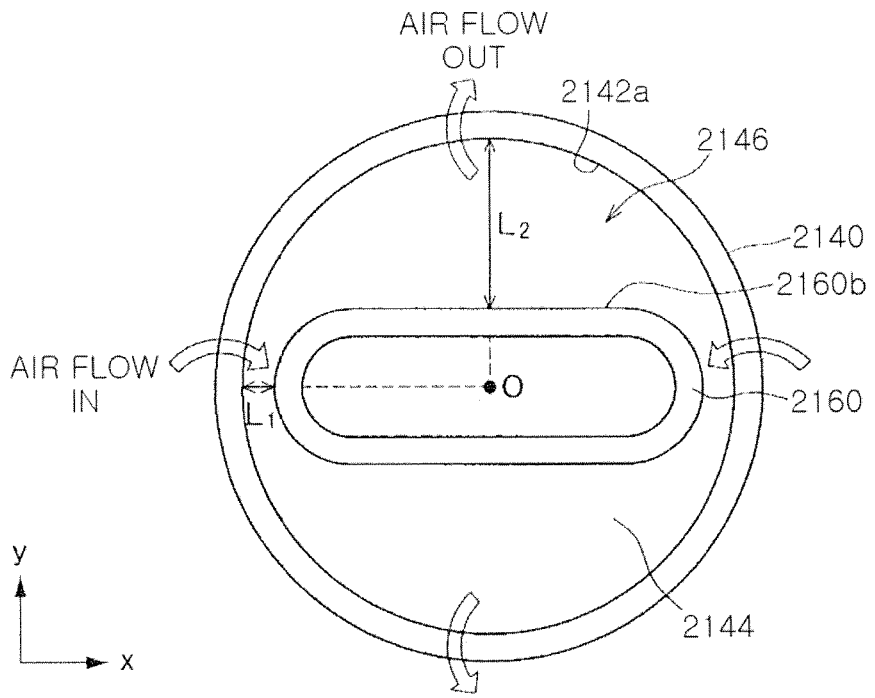
FIG. 41 is a plan view illustrating a second heat sink and a third heat sink according to the ninth example embodiment.

First, a configuration of a lighting device according to a ninth example embodiment of the present disclosure will be described. FIG. 39 includes a plan view and a side view illustrating the lighting device according to a ninth example embodiment of the present disclosure. FIG. 40 is a cross-sectional view of the lighting device of FIG. 39 taken along line A-A. FIG. 41 is a plan view illustrating a second heat sink and a third heat sink according to the ninth example embodiment.

As illustrated in FIGS. 39 and 40, the lighting device 2100 according to the present example embodiment includes a light emitting device 2112 outputting light, a light emitting device board 2110 on which the light emitting device 2112 is mounted, a first heat sink 2120 in which the light emitting device board 2110 is installed, a globe 2130 covering the light emitting device board 2110 installed in the first heat sink 2120, and a second heat sink 2140 and a third heat sink 2160 installed in a central portion of the globe 2130. A disk type metal board 2150 is installed between the light emitting device board 2110 and the first heat sink 2120 in order to increase a heat dissipation effect.

As the light emitting device 2112, for example, an LED may be used. In the lighting device 2100 regarding the present example embodiment, a plurality of light emitting devices 2112 (for example, twelve light emitting devices) are disposed at equal intervals in an annular arrangement on the light emitting device board 2110. The light emitting device board 2110 may be, for example, an aluminum board, and the light emitting device board 2110 has a disk shape to correspond to a shape of the first heat sink 2110 fixed with a metal board 2150 interposed therebetween. Meanwhile, in the present example embodiment, the light emitting devices 2112 and the light emitting device board 2110 having the light emitting devices 2112 mounted thereon will be referred to as heating elements. The heating elements include at least the light emitting device 2112, while the light emitting device board 2110 may not necessarily be considered to be a heating element. Also, in addition to the heating elements including the light emitting devices 2112, a power source circuit (not shown) may be a heat source of the lighting device 2100.

The first heat sink 2120 is a member for dissipating heat from a heat source of the lighting device 2100. As illustrated in FIGS. 39 and 40, the first heat sink 2120 includes a plurality of fins 2123 formed on a cylindrical body portion 2122. The first heat sink 2120 may be formed of a metal material such as, for example, or formed of a resin material such as plastic, or the like. The body portion 2122 and the fins 2123 may be formed of different materials.

A socket (not shown) may be installed in an end portion of the body portion 2122 (end portion in a negative direction side of the z axis), and a flange portion 2124 is installed in the other end of the body portion 2122 (end portion in a positive direction side of the z axis) to maintain the light emitting device board 2110. A rim portion 2124*a* is formed in an outer circumference of the flange portion 2124 and protruded toward a side where the light emitting device board 2110 is installed in a direction in which the body portion 2122 is elongated (basic axis (C): z direction) to surround the outer circumference of the light emitting device board 2110. The light emitting device board 2110 is disposed on an upper surface 2124*b* of the flange portion 2124 with the metal board 2150 interposed therebetween. An aluminum board, for example, may be used as the metal board 2150.

A power source circuit (not shown) is installed in an inner space 2126 of the body portion 2122 of the first heat sink 2120. In a case in which the body portion 2122 is formed of a metal, a resin layer 2127 formed of a resin material is installed in an inner surface of the body portion 2122 in order to insulate the power source circuit from the body portion 2122. Alternatively, in the case in which the body portion 2122 is formed of a metal, the power source circuit may be accommodated in the inner space 2126 with an insulating case (not shown) interposed therebetween so as to be insulated from the body portion 2122.

The first heat sink 2120 dissipates heat from the heating element including the light emitting device 2112 transmitted through the light emitting device board 2110 and the metal board 2150 from the light emitting device 2112, and also dissipates heat from the power source circuit. By installing the plurality of fins 2123 in the outer circumferential surface of the body portion 2122, a heat dissipation area may be increased and heat dissipation efficiency may be enhanced.

The globe 2130 is a cover member covering the light emitting device board 2110 installed in the first heat sink 2120 and allowing light output from the light emitting device 2112 to be transmitted therethrough. The globe 2130 may be formed of, for example, glass, resin, or the like, having transmittance. The globe 2130 is formed to have a substantially hemispherical curved surface and has opening 2132 formed in a central portion thereof. The center of the opening 2132 lies on the basic axis C which passes through the center of the plurality of light emitting devices 2112 disposed in an annular arrangement on the light emitting device board 2110 and is perpendicular with respect to the light emitting device board 2110. A second heat sink 2140 is inserted into the opening 2132.

The second heat sink 2140 is a member (heat sink) dissipating heat from the heating element including the light emitting device 2112. As illustrated in FIG. 40, the second heat sink 2140 includes a cylindrical portion 2142 and a bottom portion 2144. One open end of the cylindrical portion 2142 in the positive direction side of the z axis is connected to the opening 2132 of the globe 2130. The bottom portion 2144 is installed to be in contact with an upper surface 2110*a* of the light emitting device board 2110 in order to easily transmit heat from the heating element. The second heat sink 2140 may also be formed of a metal such as, for example, aluminum, or the like, or may be formed of a resin material such as plastic, or the like. By installing the second heat sink 2140, a heat dissipation area may be further increased and heat dissipation efficiency may be enhanced.

The third heat sink 2160 is a vessel-like hollow member (internal heat sink) insertedly passing through an inner space 2146 of the cylindrical portion 2142 of the second heat sink 2140. As illustrated in FIG. 40, one end of the third heat sink 2160 is in contact with a lower portion 2144 of the second heat sink 2140. Also, the other end of the third heat sink 2160 is in position substantially the same as that of a connection portion of the opening 2132 of the globe 2130 and one end of the second heat sink 2140 in the direction (z direction) in which the second heat sink 2140 is elongated. As illustrated in FIG. 41, a planar shape of the third heat sink 2160 is substantially oval. This is to make a shape of the space 2146 formed by the second heat sink 2140, an inner circumferential surface 2142*a* of the cylindrical portion 2142, and an outer circumferential surface of the third heat sink 2160 at least asymmetrical with respect to a plane parallel to the z axis passing through the center O of the second heat sink 2140. Meanwhile, details of the second heat sink 2140 and the third heat sink 2160 will be described hereinafter.

[Heat Dissipation Structure According to Ninth Example Embodiment]

The lighting device 2100 according to the present example embodiment includes the first heat sink 2120, the second heat sink 2140, and the third heat sink 2160 as heat dissipation structures for dissipating heat from a heating element including the light emitting device 2112 or a power source circuit. Here, the first heat sink 2120 is installed on one side of the basic axis C (in the negative direction side of the z axis) based on the heating element as a reference, and the second heat sink 2140 and the third heat sink 2160 are installed on the other side of the basic axis C (in the positive direction side of the z axis) based on the heating element as a reference. In this manner, since the heat sinks 2120 and 2140 are installed in the vertical direction of the basic axis C based on the heating element as a reference, a heat dissipation area may be increased and heat dissipation efficiency may be enhanced.

Here, as for a heat dissipation structure in the other side (positive direction side of the z axis) of the basic axis C based on the heating element, heat dissipation by the second heat sink 2140 having a circular planar shape has an annular temperature distribution in which temperatures are decreased from an inner circumferential surface of the cylindrical portion 2142 toward the center thereof. In the case in which temperature distribution is equal, heat may remain, making it difficult for convection currents to form in surrounding air. Then, even though heat from the heating unit is outwardly dissipated through the heat sink, heat stays in the vicinity of the lighting device 2100, resulting in failure to obtain a sufficient heat dissipation effect.

Thus, in the present example embodiment, the third heat sink 2160 having a planar shape different from that of the second heat sink 2140 is installed within the second heat sink 2140. Namely, the second heat sink 2140 and the third heat sink 2160 are installed such that distances, passing through the center O of the second heat sink 2140, from an inner circumferential surface 2142*a* of the second heat sink 2140 to an outer circumferential surface 2160*b* of the third heat sink 2160 are unequal. As mentioned above, the third heat sink 2160 has a substantially oval planar surface. The difference in shapes between the second heat sink 2140 and the third heat sink 2160 partially causes a difference in heat dissipation efficiency, and as a result, a temperature distribution of heat dissipation by the respective heat sinks 2140 and 2160 differ. Then, a convection currents are generated in the inner space 2146 formed by the inner circumferential surface 2142*a* of the second heat sink 2140 and the outer circumferential surface 2160*b* of the third heat sink 2160.

In the present example embodiment, as illustrated in FIG. 41, air may easily flow to a portion L1 having a short distance from the inner circumferential surface 2142*a* of the second heat sink 2140 to the outer circumferential surface 2160*b* of the third heat sink 2160. Meanwhile, air may easily flow from a portion L2 having a long distance from the inner circumferential surface 2142*a* of the second heat sink 2140 to the outer circumferential surface 2160*b* of the third heat sink 2160. In this manner, by having the heat dissipation structure in which air is automatically flows to and from the inner space 2146, a stay of heat may be prevented and heat is actively discharged outwardly, thus enhancing heat dissipation efficiency. Also, since the third heat sink 2160 is installed in addition to the second heat sink 2140, a heat dissipation area may be further increased to enhance heat dissipation efficiency.

[Modified Example of Heat Dissipation Structure of Ninth Example Embodiment]

Figure 42:
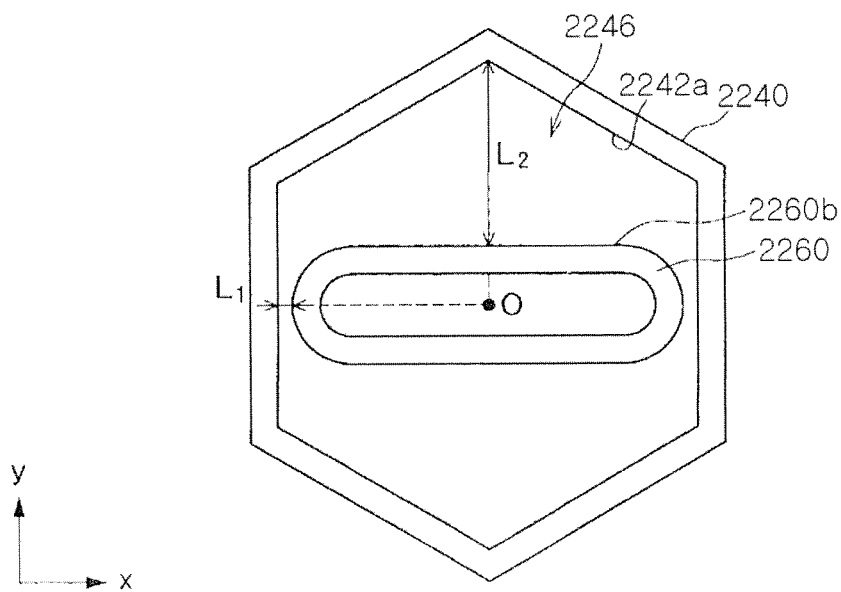
FIG. 42 is a plan view illustrating a modified example of the second heat sink and the third heat sink according to the ninth example embodiment.

In the heat dissipation structure illustrated in FIG. 41 according to the present example embodiment, the second heat sink 2140 has a circular planar shape, but the present disclosure is not limited thereto. FIG. 42 illustrates a modified example of the heat dissipation structure in the other side (the positive direction side of the z axis) based on a heating element as a reference. In the example illustrated in FIG. 42, the second heat sink 2240 has a hexagonal planar shape, while the third heat sink 2260 has a substantially oval planar shape. The second heat sink 2240 may also have any polygonal planar shape, other than the hexagonal shape.

Also, in this case, like the heat dissipation structure illustrated in FIG. 41, air may easily flow to a portion L1 having a short distance from the inner circumferential surface 2242*a* of the second heat sink 2240 to the outer circumferential surface 2260*b* of the third heat sink 2260. Meanwhile, air may easily flow from a portion L2 having a long distance from the inner circumferential surface 2242*a* of the second heat sink 2240 to the outer circumferential surface 2260*b* of the third heat sink 2260. In this manner, by having the heat dissipation structure in which air is automatically flows to and from the inner space 2246, a stay of heat may be prevented and heat is actively discharged outwardly, thus enhancing heat dissipation efficiency.

So far, the lighting device 2100 and the heat dissipation structure thereof according to the ninth example embodiment of the present disclosure. According to the present example embodiment, in the heat dissipation structure on the other side (positive direction side of the z axis) of the basic axis C based on the heating element as a reference, distances, passing through the center O of the second heat sink 2140, between the inner circumferential surface 2142*a* of the second heat sink 2140 and the outer circumferential surface 2160*b* of the third heat sink 2160 are unequal. Accordingly, a current convection occurs in the inner space 2146 to enhance heat dissipation efficiency.

Meanwhile, in the present example embodiment, the third heat sinks 2160 and 2260 have an oval planar shape, but the present disclosure is not limited thereto and may have, for example, a polygonal planar shape.

<Tenth Example Embodiment>

Figure 43:
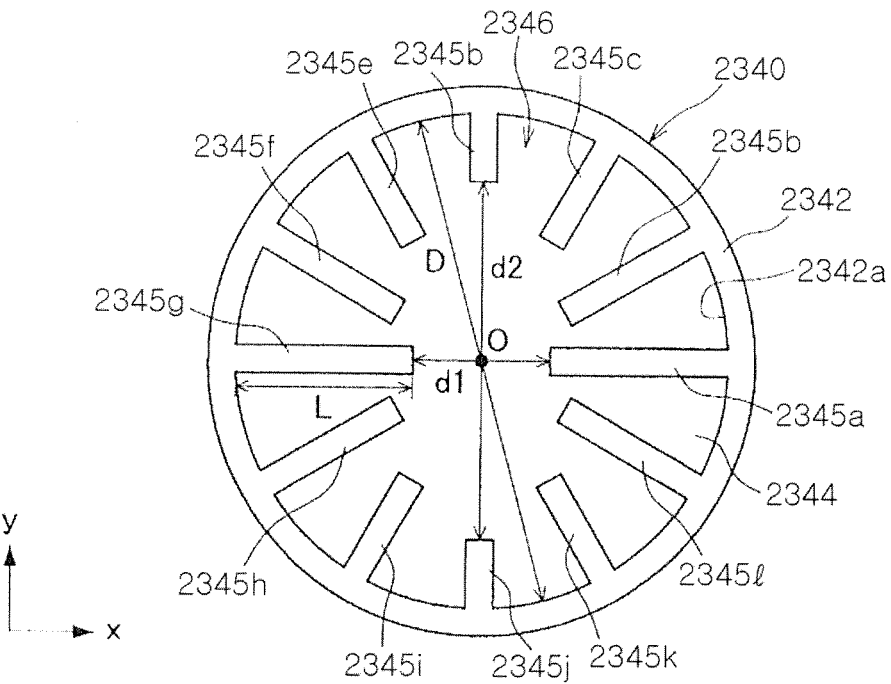
FIG. 43 is a plan view illustrating a second heat sink according to a tenth example embodiment.

Hereinafter, a heat dissipation structure of a lighting device according to a tenth example embodiment of the present disclosure will be described. FIG. 43 is a plan view illustrating a second heat sink 2340 according to the present example embodiment. The second heat sink 2340 according to the present example embodiment may be installed instead of the second heat sink 2140 and the third heat sink 2160 of the lighting device 2100 according to the ninth example embodiment illustrated in FIGS. 39 and 40. Hereinafter, a heat dissipation structure on the other side (the positive direction side of the z axis) based on a heating element as a reference will be described in detail. Meanwhile, a lighting device in which the second heat sink 2340 is installed according to the present example embodiment is identical to the lighting device 2100 according to the ninth example embodiment, so a description thereof herein will be omitted.

[Heat Dissipation Structure According to Tenth Example Embodiment]

The lighting device according to the present example embodiment has a heat dissipation structure for dissipating heat from a heating element including a light emitting device or a power source circuit, and the heat dissipation structure of the lighting device includes the first heat sink 2120 illustrated in FIGS. 39 and 40 and the second heat sink 2340 illustrated in FIG. 43. The configuration of the first heat sink 2120 is identical to that of the ninth example embodiment.

Like the second heat sink 2140 according to the ninth example embodiment, the second heat sink 2340 includes a cylindrical portion 2342 and a bottom portion 2344, and further includes a plurality of fins 2345 (for example, twelve fins 2345*a* to 2345*l*) extending from an inner circumferential surface 2342*a* of the cylindrical portion 2342 toward the center O of the second heat sink 2340. Each of the fins 2345*a* to 2345*l* may have a streamlined shape as that of the fins 2123 of the first heat sink 2120 illustrated in FIGS. 39 and 40 or may be a substantially rectangular plate-like member. Also, in the example illustrated in FIG. 43, the fins 2345 are installed with even intervals therebetween in a circumferential direction, but the present disclosure is not limited thereto and intervals between adjacent fins 2345 may be appropriately modified.

Lengths L of the respective pins 2345*a* to 2345*l* of the second heat sink 2340 in a radial direction are unequal and at least one thereof may be set to be different as illustrated in FIG. 43. In the example illustrated in FIG. 43, lengths of fins facing one another are equal. The lengths L of the fins are decreased in order, starting from the fins 2345*a* and 2345*g* having the largest length, and the fins 2345*b*, 2345*f*, 2345*h* and 2345*l* adjacent thereto, and the fins 2345*c*, 2345*e*, 2345*i* and 2345*k* adjacent thereto, and the fins 2345*d* and 2345*j* have a minimum length L in the radial direction.

By forming the fins 2345 such that they have different lengths L in the radial direction, distances between inner circumferential surfaces 2342*a* passing through the center O of the second heat sink 2340 are different. For example, in regions where the fins 2345 are not formed, the distance between the inner circumferential surfaces 2342*a* equates to a diameter D of the second heat sink 2340. Also, in regions where the fins 2345 are formed, a distance d1 between the fins 2345*a* and 2345*g* having a maximum length L in the radial direction is minimized, and a distance d2 between the fins 2345*d* and 2345*j* having a minimum length L in the radial direction is maximized.

In this manner, the configuration of the inner space 2346 of the second heat sink 2340 is formed to be uneven so as to be at least asymmetrical with respect to a plane parallel to the z axis passing through the center O. Namely, the second heat sink 2340 is formed such that distances between the inner circumferential surfaces 2342*a* of the second heat sink 2340, passing through the center O of the second heat sink 2340, are unequal. Accordingly, a difference in heat dissipation efficiency is formed between heat dissipation portions of the second heat sink 2340, resulting in an uneven temperature distribution of heat dissipation. Accordingly, convection currents occur in the inner space 2345 of the second heat sink 2340. In this manner, by having the heat dissipation structure in which air is automatically flows to and from the inner space 2346, a stay of heat may be prevented and heat is actively discharged outwardly, thus enhancing heat dissipation efficiency.

[Modified Example of Heat Dissipation Structure of Tenth Example Embodiment]

Figure 44:
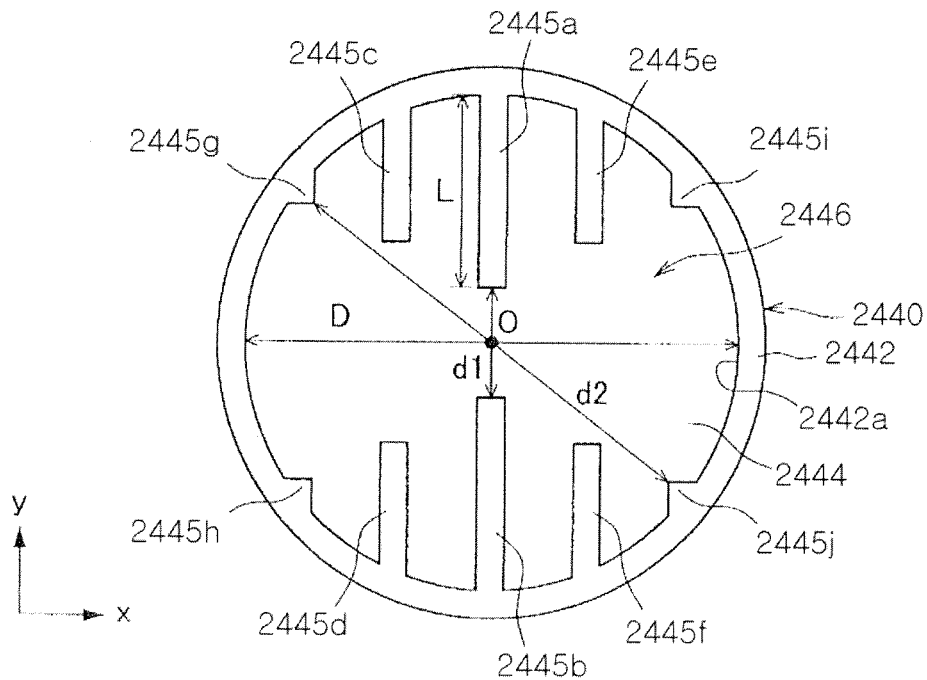
FIG. 44 is a plan view illustrating a modified example of the second heat sink according to the tenth example embodiment.

In the heat dissipation structure illustrated in FIG. 43 of the present example embodiment, the fins 2345 of the second heat sink 2340 are disposed to extend radially toward the center from the inner circumferential surface 2342*a* of the cylindrical portion 2342, but the present disclosure is not limited thereto. FIG. 44 illustrates a modified example of a heat dissipation structure in the other side (positive direction side of the z axis) based on a heating element as a reference. In the example illustrated in FIG. 44, fins 2445 of a second heat sink 2440 are installed to extend in one direction from an inner circumferential surface 2442a of a cylindrical portion 2442.

In detail, as illustrated in FIG. 44, five pairs of fins 2445a to 2445j, i.e., ten fins, facing one another in a y direction are installed to extend and adjacent in an x direction in the inner circumferential surface 2442a of the cylindrical portion 2442. Lengths L of facing fins 2445 are equal, and the lengths L are decreased as the fins are spaced part from the center O of the second heat sink 2440. By forming the fins 2445 such that they have different lengths L in the radial direction, distances between inner circumferential surfaces 2442a passing through the center O of the second heat sink 2440 are different. For example, in regions where the fins 2445 are not formed, the distance between the inner circumferential surfaces 2442a equates to a diameter D of the second heat sink 2440. Also, in regions where the fins 2445 are formed, a distance d1 between the fins 2445a and 2445b having a maximum length L in the radial direction is minimized, and a distance d2 between the fins 2445g and 2445j having a minimum length L in the radial direction is maximized.

In this manner, in the example illustrated in FIG. 44, the configuration of the inner space 2446 of the second heat sink 2440 is formed to be uneven so as to be at least asymmetrical with respect to a plane parallel to the z axis passing through the center O. Accordingly, a difference in heat dissipation efficiency is formed between heat dissipation portions of the second heat sink 2440, resulting in an uneven temperature distribution of heat dissipation. Accordingly, convection currents occur in the inner space 2446 of the second heat sink 2440. In this manner, by having the heat dissipation structure in which air is automatically flows to and from the inner space 2446, a stay of heat may be prevented and heat is actively discharged outwardly, thus enhancing heat dissipation efficiency.

Figure 45:
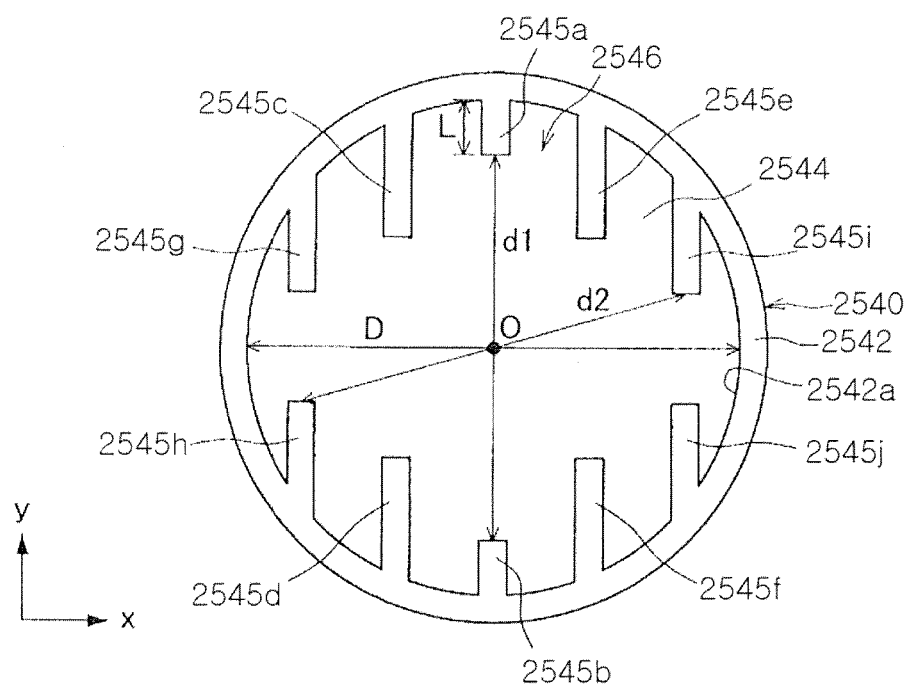
FIG. 45 is a plan view illustrating another modified example of the second heat sink according to the tenth example embodiment.

Also, in a modified example of the second heat sink 2440 of FIG. 44, as illustrated in FIG. 45, fins 2545 installed to extend in one direction from an inner circumferential surface 2542a of a cylindrical portion 2542 of a second heat sink 2540 may be configured such that the length L is increased as the fins are spaced apart from the center O of the second heat sink 2540. Accordingly, in the second heat sink 2540 illustrated in FIG. 45, a distance between the inner circumferential surfaces 2542a passing through the center O in the region where the fins 2545a and 2545b having a minimum length L is maximized (d1) and distances between fins 2545g and 2545h and between fins 2545i and 2545j having a maximum length L is minimized (d2).

In this manner, the configuration of the inner space 2546 of the second heat sink 2540 is formed to be uneven so as to be at least asymmetrical with respect to a plane parallel to the z axis passing through the center O to make convection currents occur in the inner space 2546.

So far, the heat dissipation structure of the lighting device according to the tenth example embodiment of the present disclosure has been described. According to the present example embodiment, in the heat dissipation structure on the other side (positive direction side of the z axis) of the basic axis C based on the heating element as a reference, the plurality of fins 2345 are formed to have different lengths from the inner circumferential surface 2342a of the cylindrical portion 2342 of the second heat sink 2340, and distances between the inner circumferential surfaces 2342a of the inner space 2346 are unequal. Accordingly, convection currents occur in the inner space 2346 to enhance heat dissipation efficiency.

Meanwhile, in the present example embodiment, the second heat sink has a circular planar shape, but the present disclosure is not limited thereto and may have, for example, a substantially oval or polygonal shape.

So far, the example embodiment of the present disclosure has been described in detail with reference to the accompanying drawings, but the present disclosure is not limited thereto. For example, in the foregoing example embodiment, the light emitting device board on which the light emitting devices are mounted in an annular arrangement is placed on the flange portion of the first heat sink, but the present disclosure is not limited thereto. For example, the light emitting device board on which the light emitting devices are mounted may be installed on an outer circumferential surface of the second heat sink. Also, when the light emitting device board is installed on the flange portion or the body portion of the heat sink, as illustrated in FIG. 40, only a single light emitting device group including a plurality of light emitting devices disposed in an annular arrangement may be disposed, or a plurality of light emitting device groups may be disposed in a concentric circle.

Also, in the foregoing example embodiment, the second heat sink has a cylindrical shape in which circles having the same diameter continue in the direction in which the second heat sink is elongated, but the present disclosure is not limited thereto. For example, the second heat sink may have a tapered shape in which an inner diameter thereof is increased toward the opening.

<Consideration of Conditions for Substitution of Light Bulb>

Lighting devices according to the aforementioned example embodiments and various example embodiments as describe hereinafter may be advantageously applied to a bulb-type lighting device. In this context, the inventor of the present application reviewed conditions for the substitution of an incandescent bulb and the results are as follows.

As mentioned above, bulb-type LED lighting devices developed so far are insufficient in heat dissipation efficiency and light distribution characteristics thereof are also insufficient to be used as a substitute for an incandescent bulb. Incandescent bulbs satisfy luminous efficiency (90 lm/W or greater), an amount of light emission (800 lm or greater), color temperature (2700 to 3000 K), color rendering (Ra 90 or greater), light distribution characteristics (300 deg or greater), shape (standard regarding a bulb size conforming to ANSI standards), and the like, but currently, there are no bulb-type lighting devices using semiconductor light emitting devices such as LEDs having performance equal to that of incandescent bulbs in all of the characteristics as mentioned above on the market.

Thus, the inventor of the present application reviewed conditions for realizing a bulb-type lighting device that may substitute the incandescent bulb satisfying all of the characteristics, and discovered that the following characteristics (1) through (3) should be met.

(1) A bulb-type lighting device should satisfy ANSI standards in terms of shape (2) A diameter of a light emitting portion (globe portion) should be greater than a heat sink (a case portion connected to a socket)

(3) The bulb-type lighting device should have high heat dissipation characteristics The condition (1) is essential to substitute an incandescent bulb, condition (2) is necessary to realize excellent light distribution characteristics, and condition (3) is required to realize high efficiency and high output.

Here, in order to increase heat dissipation efficiency, a surface area or a size of a heat sink needs to be increased. Namely, the overall size of a bulb-type lighting device needs to be increased or a size of fins installed in a heat sink needs to be increased. This, however, is difficult to realize within the condition that conforms to ANSI standards, namely, within the conditions by which forms of bulb-type lighting devices are governed. Also, an increase in a size of a heat sink reduces a region for light distribution as much, making it difficult to realize a light distribution angle equal to that of an incandescent bulb.

Based on the foregoing review, the inventor of the present application succeeded in realizing a bulb-type lighting device, whose overall size or a size of fins thereof meet the conditions satisfying ANSI standards, having light distribution characteristics equal to those of incandescent bulbs, by completing a new structure of an optical system and a new heat dissipation structure. Hereinafter, lighting devices regarding various example embodiments will be described in detail.

<Eleventh Example Embodiment>

[Lighting Device According to Eleventh Example Embodiment]

Figure 46:
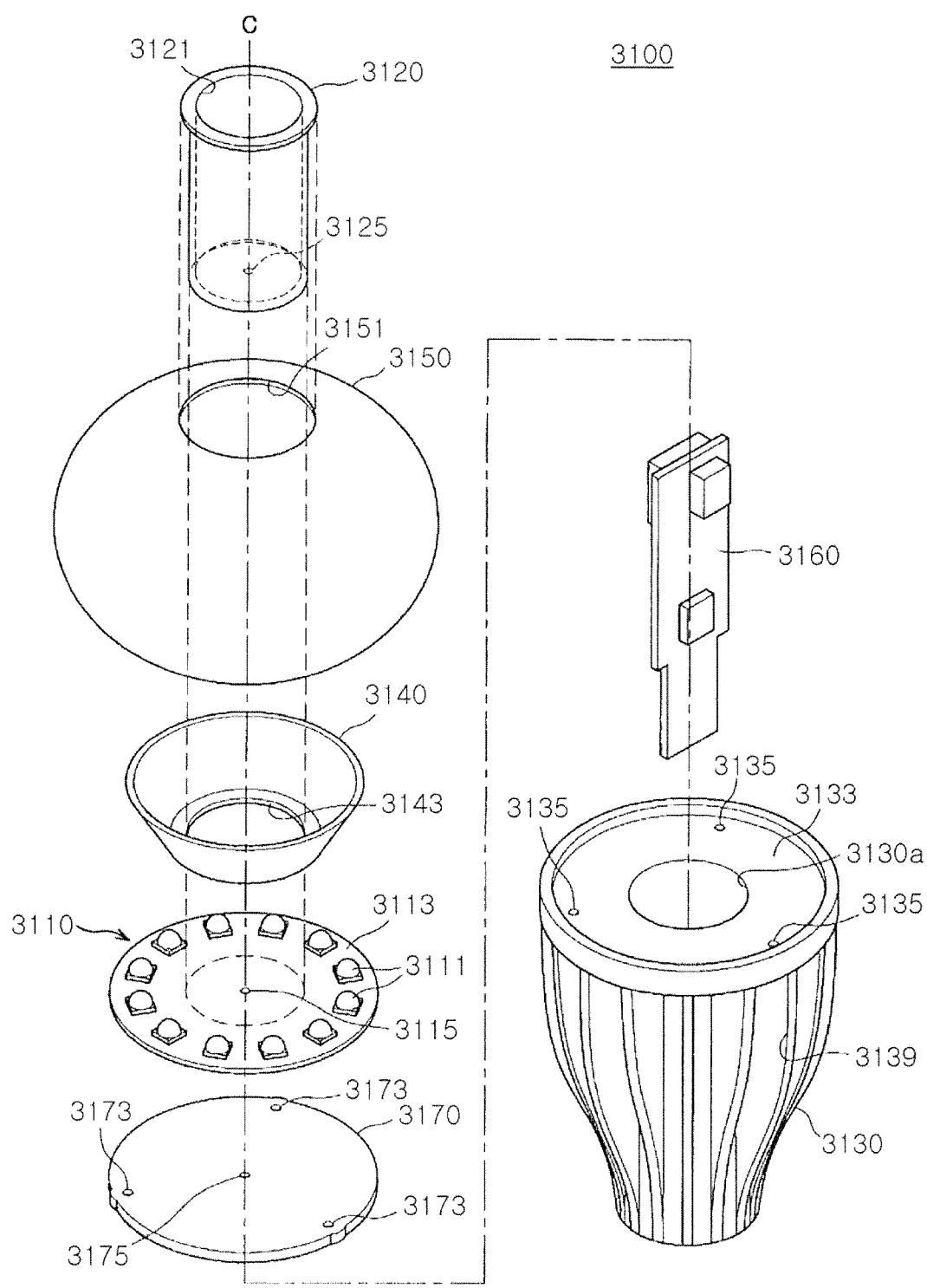
FIG. 46 is an exploded perspective view illustrating an overall configuration of a bulb-type lighting device regarding an eleventh example embodiment of the present disclosure.
Figure 47A:
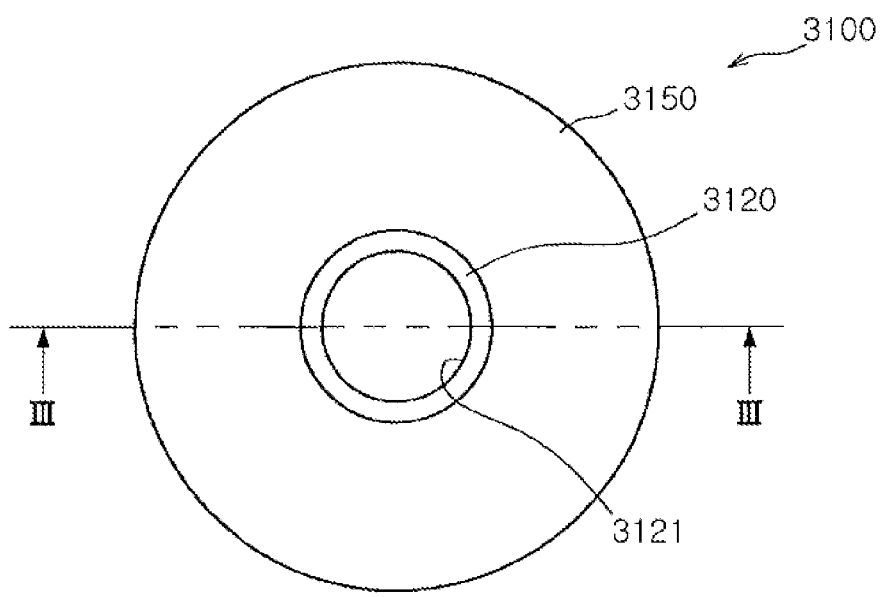
FIG. 47A is a top view and FIG. 47B is a front view illustrating an overall configuration of the lighting device regarding the eleventh example embodiment.
Figure 47B:
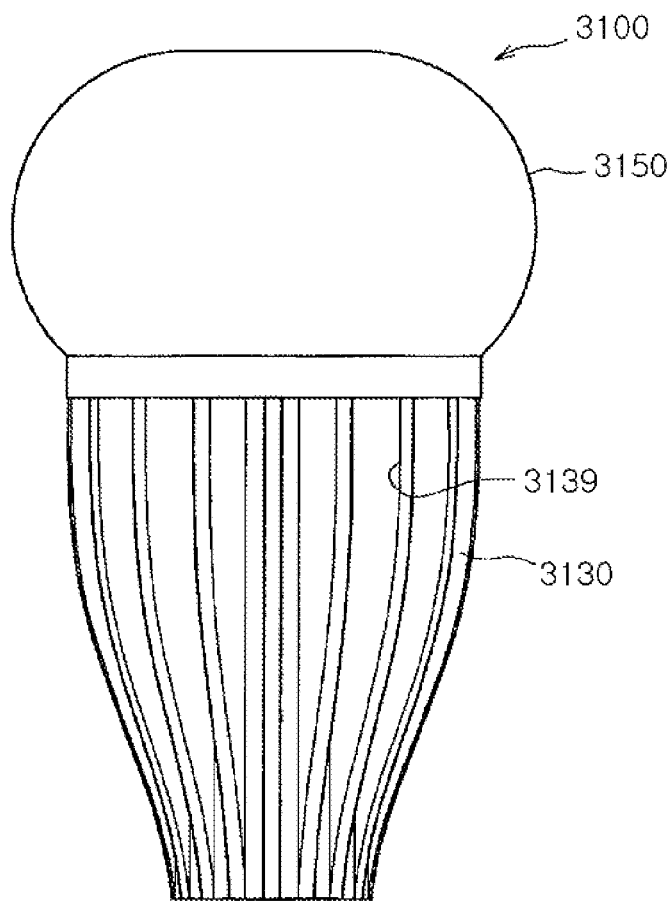
Figure 48:
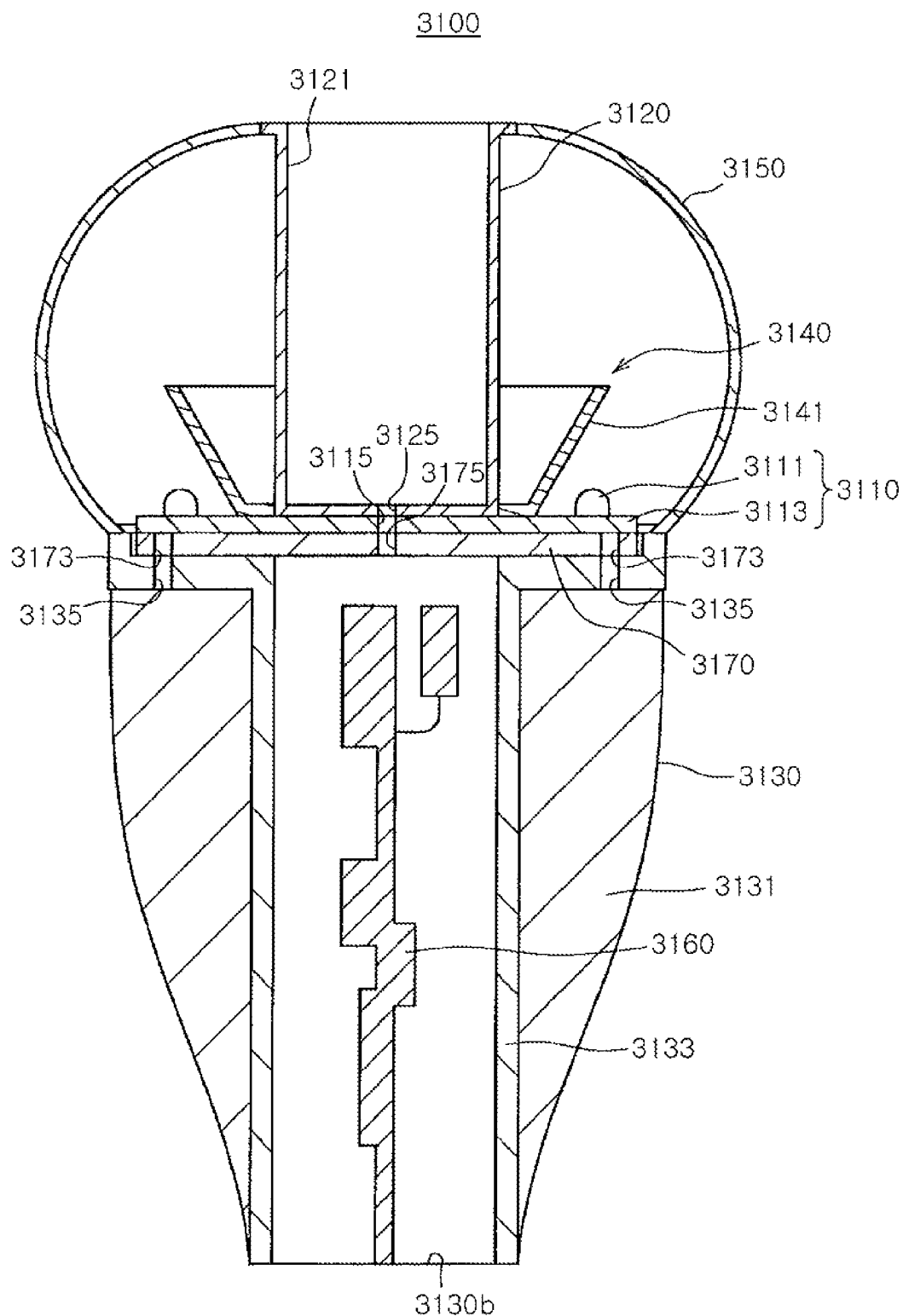
FIG. 48 is a cross-sectional view of the lighting device regarding the eleventh example embodiment taken along line III-III of FIG. 47A.

First, a configuration of a bulb-type lighting device regarding an eleventh example embodiment of the present disclosure will be described in detail with reference to FIGS. 46 through 48. FIG. 46 is an exploded perspective view illustrating an overall configuration of a bulb-type lighting device (hereinafter, referred to simply as 'lighting device') regarding an eleventh example embodiment of the present disclosure. FIG. 47A is a top view and FIG. 47B is a front view illustrating an overall configuration of the lighting device 3100 regarding the eleventh example embodiment. FIG. 48 is a cross-sectional view of the lighting device regarding the eleventh example embodiment taken along line III-III of FIG. 47A.

Figure 49:
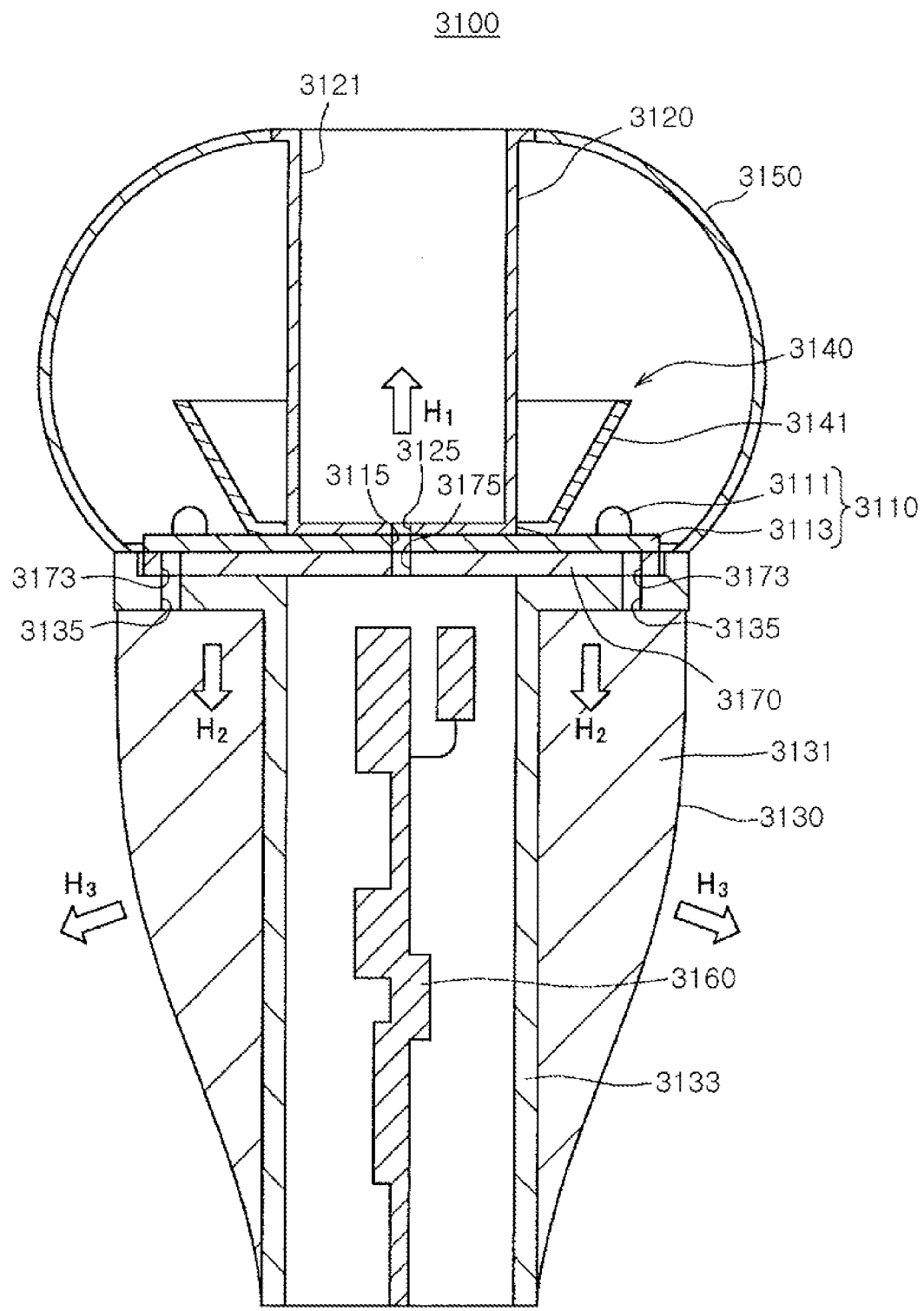
FIG. 49 is a view illustrating a flow of heat in the lighting device regarding the eleventh example embodiment.

As illustrated in FIGS. 47 through 49, the lighting device 3100 regarding the present example embodiment mainly includes a light emitting module 3110, a first heat sink 3120 (hereinafter, referred to as an 'upper heat sink'), a second heat sink 3130, (hereinafter, referred to as a 'lower heat sink'), a reflector 3140, a globe 3150, a driving circuit 3160, and a heat dissipation plate 3170.

(Light Emitting Module 3110)

The light emitting module 3110 is a member which includes a light emitting device 3111 and a light emitting device board 3113 and is a light source of the lighting device 3100.

The light emitting device 3111 is a semiconductor light emitting device such as a light emitting diode (LED), or the like, and outputs light. A luminous color of the light emitting device 3111 may vary according to a material of the globe 3150 as described hereinafter. In detail, in a case in which the globe 3150 is formed of a material (resin, or the like) containing a phosphor, the light emitting device 3111 is an LED (for example, a blue LED) emitting light exciting the phosphor, and a wavelength of light is converted in the globe 3150 to emit white light. Meanwhile, in a case in which the globe 3150 is formed of a material (resin, or the like) containing a light diffuser, the light emitting device 3111 emits white light (6500 k to 20000K). Light output from the light emitting device 3111 is reflected by the reflector 3140 or directly reaches the globe 3150 and diffused from the globe 3150 so as to be emitted outwardly Also, in the present example embodiment, the light emitting device 3111 is provided in plural, and the plurality of light emitting devices 3111 are disposed in an annular arrangement on one surface of the light emitting device board 3113. Here, the annular arrangement includes an oval annular arrangement and a polygonal annular arrangement, as well as a circular annular arrangement as illustrated in FIG. 46.

The light emitting device board 3113 may be a board on which the light emitting device 3111 is mounted, and preferably, the light emitting device board 3113 may be formed of a material having high conductivity such as a metal such as aluminum, nickel, or the like, a glass composite CEM3, a ceramic, or the like. Accordingly, heat generated by the light emitting module 3110 may be effectively transmitted to the upper heat sink 3120 or the lower heat sink 3130 so heat dissipation efficiency of the lighting device 3100 may be enhanced. A shape of the light emitting device board 3113 is not particularly limited and, preferably, the light emitting device board 3113 may have a substantially circular or polygonal shape in order to satisfy the aforementioned ANSI standards.

Also, as the light emitting device board 3113 is inserted between a lower portion of the upper heat sink 3120 and an upper portion of the lower heat sink 3130 (or the heat dissipation plate 3170), a position of the light emitting device board 3113 is fixed. In this case, a screw hole 3115 is installed in a substantially central portion of the light emitting device board 3113, and the position of the screw hole 3115 corresponds to a screw hole 3125 of a lower portion of the upper heat sink 3120 and a screw hole 3175 of the heat dissipation plate 3170 as described hereinafter, and the upper heat sink 3120, the light emitting device board 33113, and the heat dissipation plate 3170 are screw-coupled through the screw holes 3125, 3115, and 3175.

(Upper Heat Sink 3120)

The upper heat sink 3120 serves to dissipate at least any one of heat generated by the light emitting module 3110 and heat generated by the driving circuit 3160 outwardly. In order to implement the heat dissipation function, the upper heat sink 3120 is formed of a metal having high thermal conductivity, such as aluminum, copper, or the like, a resin having high thermal conductivity, or the like. Also, in order to further enhance the heat dissipation effect, the upper heat sink 3120 may have a concave portion, a plurality of fins, or the like, to increase a surface area thereof.

In this sense, the upper heat sink 3120 according to the present example embodiment may have a shape in which a substantially disk-shaped lower portion is connected to an end portion of a substantially cylindrical hollow body portion with an opening 3121 formed in one end thereof. Since the upper heat sink 3120 has the cylindrical hollow portion, a surface area of an outwardly exposed surface of the upper heat sink 3120 (area of the surface used to dissipate heat) is increased to enhance the heat dissipation effect. Also, in order to enhance the heat dissipation effect, besides the hollow shape, for example, the upper heat sink 1140 may have a substantially cylindrical or columnar body portion and the body portion may have a plurality of fins exposed outwardly.

Also, the upper heat sink 3120 is installed in contact with the light emitting device board 3113 on one side of a ring configured according to a disposition of the light emitting device 3111 in a central axis C direction, based on the light emitting device board 3113 as a reference. In this manner, since the upper heat sink 3120 is installed to be in contact with the light emitting device board 3113, it mainly serves to dissipate heat generated by the light emitting device board 3113 (or the entirety of the light emitting module 3110) outwardly. Accordingly, heat generated by the light emitting module 3110 that generates a large amount of heat, relative to the driving circuit 3160, is entirely dissipated by both of the upper heat sink 3120 and the lower heat sink 3130 as described hereinafter, heat dissipation efficiency of the lighting device 3100 may be significantly increased, compared to a case in which only a single heat sink is provided.

Also, the screw hole 3125 is installed in a substantially central portion of a lower surface (closed surface) of the upper heat sink 3120, and as described above, the upper heat sink 3120 is screw-coupled with the light emitting device board 3113 and the heat dissipation plate 3170 so as to be fixed in position.

Also, in FIGS. 46 and 48, the upper heat sink 3120 is illustrated to have a cylindrical shape, but the shape of the upper heat sink 3120 is not limited thereto and the upper heat sink 3120 may have, for example, a reversed circular truncated conical shape, like the reflector 3140 as described hereinafter.

(Lower Heat Sink 3130)

The lower heat sink 3130 is connected to a socket (not shown) in one end thereof (a lower end in FIGS. 46 through 48) and serves to dissipate at least one of heat generated by the light emitting module 3110 and heat generated by the driving circuit 3160 outwardly. In order to implement the heat dissipation function, the lower heat sink 3130 is formed of a resin having high thermal conductivity. In the present example embodiment, the lower heat sink 3130 is formed of a resin, rather than a metal, so as to reduce a weight of the lighting device 3100, and in addition, since a resin has insulating properties, there is no need to take measures for insulation in a caulking portion when the lower heat sink 3130 is connected to a socket. Thus, in a case in which an increase in weight of the lighting device 3100 is not problematic, a metal such as aluminum, copper, or the like, may be used as a material of the lower heat sink 3130. However, in the case in which the lower heat sink 3130 is formed of a metal, insulation measures need to be taken in the caulking portion of the socket.

Also, in order to further increase the heat dissipation effect, a concave portion or a plurality of fins may be installed on the lower heat sink 3130 to increase a surface area of the lower heat sink 3130.

In this respect, in the present example embodiment, the lower heat sink 3130 may have a plurality of fins 3139 formed in an outer circumferential surface of a substantially hollow cylindrical body portion with openings 3130*a* and 3130*b* formed in both ends thereof. With the plurality of fins 3139, a surface area of an outwardly exposed surface of the lower heat sink 3130 (an area of the surface used to dissipate heat) may be increased to enhance a heat dissipation effect. Alternatively, in order to enhance the heat dissipation effect, for example, a plurality of concave portions (not shown) may be formed in the outer circumferential surface of the body portion of the lower heat sink 3130, in addition to the fins 3139.

Also, the lower heat sink 3130 is installed on the other side of a ring configured according to a disposition of the light emitting device 3111 in a central axis direction, based on the light emitting device board 3113 as a reference. Accordingly, the lower heat sink 3130 may dissipate heat generated by the driving circuit 3160 or the light emitting module 3110, outwardly therefrom, independently from the upper heat sink 3120. Thus, heat dissipation efficiency of the lighting device 3100 may be remarkably enhanced, compared to the case in which only a single heat sink is provided.

In addition, in the present example embodiment, the lower heat sink 3130 includes a resin 3131 and a metal member 3133 insertedly positioned within the resin 3131. The lower heat sink 3130 is obtained by integrally insert-molding the resin 3131 and the metal member 3133. This is because, the resin 3131 alone has low thermal conductivity, relative to a metal such as aluminum, copper, or the like, and thus, in order to increase thermal conductivity, the metal member 3133 such as aluminum, copper, or the like, is inserted into the resin 3131. Thus, if heating of the light emitting module 3110 is suppressed through management of performance of the light emitting module 3110 or the driving circuit 3160 to have a sufficient heat dissipation effect, the metal member 3133 may not need to be inserted.

Also, in the case of inserting the metal member 3133, preferably, the metal member 3133 is disposed to be in contact with the heat dissipation plate 3170 (without the heat dissipation plate 3170, the metal member 3133 is disposed to be in contact with the light emitting device board 3113) in order for heat generated by the driving circuit 3160 to be easily transmitted also to the upper heat sink 3120 as well as to the lower heat sink 3130.

Also, a screw hole 3135 is installed in a surface of the metal member 3133 in contact with the heat dissipation plate 3170 at a position corresponding to the screw hole 3173 installed in the heat dissipation plate 3170 as described hereinafter, and the metal member 3133 and the heat dissipation plate 3170 are screw-coupled through the screw holes 3135 and 3173.

Also, besides the foregoing heat dissipation function, the lower heat sink 3130 serves as a case in which the driving circuit 3160 is accommodated. In the present example embodiment, the driving circuit 3160 is installed within a hollow body portion of the lower heat sink 3130.

(Reflector 3140)

The reflector 3140 is supported by a surface of the light emitting device board 3113 in which the light emitting device 3111 (hereinafter, referred to as a "surface of the light emitting device 3111 side), and reflects light output from the light emitting device 3111. In the present example embodiment, the reflector 3140 is formed of a material having a high level of light reflectivity and serves to reflect light from the light emitting device 3111 in a direction toward a socket (in a direction toward the lower heat sink 3130) and expand a light distribution angle (or a beam angle) of the lighting device 3100 in the direction toward the socket.

In order to implement such a function, the reflector 3140 has a reversed circular truncated conical shape. Namely, the reflector 3140 is installed to be protruded from the surface of the light emitting device board 3113 on the light emitting device 3111 side such that the reflector 3140 has a diameter increased in a direction away from the light emitting device board 3113, forming a circular truncated conical shape. Also, a lateral circumferential surface of the reflector 3140 having the circular truncated conical shape is formed as a reflective surface 3141 from which light output from the light emitting device 3111 is reflected. Thus, only the reflective surface 3141 of the reflector 3140 may be formed of a material having a high degree of light reflectivity and other portions thereof may be formed of a material without light reflectivity.

Also, the reflector 3140 has open upper and lower end portions having a truncated conical shape. The end portion (lower end portion in FIGS. 46 and 48) of the reflector 3140 in contact with the light emitting device board 3113 has an opening 3143 to be connected to a lower portion of the upper heat sink 3120. Since the reflector 3140 has the opening 3143, the upper heat sink 3120 may be in direct contact with the light emitting device board 3113, increasing heat dissipation (in particular, heat dissipation efficiency of heat generated by the light emitting module 3110) of the lighting device 3100. Thus, the opening 3143 may not need to be in contact with the lower portion of the upper heat sink 3120 and may have a diameter greater than that of the lower portion of the upper heat sink 3120.

(Globe 3150)

The globe 3150 is installed substantially in a globular shape to cover the light emitting module 3110 and the reflector 3140 and serves to control a color of light (luminous color of the light emitting device 3111) output from the light emitting device 3111 and diffuse light from a surface thereof to widen a light distribution angle of the lighting device 3100.

In order to implement the role of controlling a luminous color of the light emitting device 3111, the globe 3150 includes a phosphor or a light diffuser according to a luminous color of the light emitting device 3111.

In detail, in a case in which the light emitting device 3111 is an LED emitting blue light, the globe 3150 may be formed of a material containing a phosphor or may have a surface (an inner surface as well as an outer surface) coated with a phosphor. For example, in a case in which the globe 3150 is formed of a resin, the resin may contain fluorescent pigment, or in a case in which the globe 3150 is formed of glass, the globe 3150 may have a surface coated with fluorescent pigment. A wavelength of light reflected by the reflector 3140 or output from the light emitting device 3111 and arriving at the globe 3150 is converted by the phosphor of the globe 3150 to emit white light.

Here, light emission by the phosphor has a high degree of light diffusion, so even though a light distribution of light reflected by the reflector 3140 is insufficient, a desirable light distribution may be obtained by light diffusion when light is emitted by the phosphor. Also, since the blue LED is combined with a phosphor, light may be emitted in a color close to natural light.

Also, in order to further widen the light distribution angle of the lighting device 3100, the globe 3150 may be formed of a material further containing a light diffuser in addition to the phosphor, or a light diffuser may be further coated on the surface of the globe 3150 in addition to the phosphor.

Meanwhile, in a case in which the light emitting device 3111 is an LED emitting white light, the globe 3150 may be formed of a material containing a light diffuser or may have a surface coated with a light diffuser. Also, in this case, light output from the light emitting device 3111, or light reflected from the reflector 3140, may be diffused from the surface of the globe 3150 by the light diffuser, thus widening a light distribution angle of the lighting device 3100.

In order to widen the light distribution angle of the lighting device 3100, preferably, a maximum diameter (please refer to length $D_1$ in FIG. 50) of the globe 3150 is greater than a maximum diameter (please refer to $D_2$ in FIG. 50) of the lower heat sink 3130, and preferably, 1.2 times or greater. If the maximum diameter of the lower heat sink 3130 is too large, relative to the maximum diameter of the globe 3150, a region in which light is emitted in the direction toward the socket from the surface of the globe 3150 is blocked by the lower heat sink 3130 is increased, reducing the light distribution angle of light in the direction of the socket. Details thereof will be described hereinafter.

In the present example embodiment, an opening 3151, connected to an upper end portion (end portion where the opening 3121 is formed) of the upper heat sink 3120, is formed in a top portion of the globe 3150 (end portion opposite to the light emitting module 3110). Accordingly, since the hollow portion of the upper heat sink 3120 is exposed, heat dissipation efficiency of the lighting device 3100 may be enhanced.

Also, an opening (not shown) is installed in a lower portion of the globe 3150 (end portion of the light emitting module 3110), and the globe 3150 is connected to the lower heat sink 3130 in the opening.

(Driving Circuit 3160)

The driving circuit 3160 is a power circuit installed within the lower heat sink 3130 and driving (lighting) the light emitting device 3111 using power supplied from an external source through a socket. The driving circuit 3160 includes a plurality of electronic components mounted on a board, and the plurality of electronic components generate heat when driving the light emitting device 3111. Heat generated by the driving circuit 3160 is transmitted to the lower heat sink 3130 or to the upper heat sink 3120 through the metal member 3133, the heat dissipation plate 3170, and the light emitting device board 3113 so as to be dissipated outwardly.

Also, the driving circuit 3160 regarding the present example embodiment does not have an electrolytic capacitor for converting an alternating current (AC) into a direct current (DC). Lifespans of LED lighting devices on the market is known as tens of thousands of hours, but in actuality, a lifespan of an electrolytic capacitor is thousands of hours, so before an LED lighting device is no longer of use, the electrolytic capacitor needs to be changed. In contrast, the driving circuit 3160 regarding the present example embodiment does not have an electrolytic capacitor for converting an AC into a DC, so there is no need to replace a component at the time of termination of thousands of hours and a lifespan of the lighting device 3100 may be significantly lengthened.

(Heat Dissipation Plate 3170)

The heat dissipation plate 3170 is installed to be in contact with both of the light emitting device board 3113 and the lower heat sink 3130 and mainly serves to transmit heat generated by the light emitting module 3110 to the lower heat sink 3130. Of course, the heat dissipation plate 3170 may transmit heat generated by the driving circuit 3160 to the upper heat sink 3120. In order to implement the role of heat transmission, the heat dissipation plate 3170 may be formed of a metal having a high degree of thermal conductivity, such as aluminum (Al), copper (Cu), or the like.

Also, a pin for preventing a positioning error of the reflector 3140 may be installed in the heat dissipation plate 3170, and in this case, the heat dissipation plate 3170 may serve as a reference of positions of the light emitting device board 3113, the reflector 3140, the globe 3150, and the upper heat sink 3120, as well as serving to transmit heat.

Also, if heat dissipation efficiency of the lighting device 3100 is sufficiently high and precision of positioning among the light emitting device board 3113, the reflector 3140, the globe 3150, and the upper heat sink 3120 is secured, the heat dissipation plate 3170 may not be installed.

[Method of Assembling Lighting Device According to Eleventh Example Embodiment]

So far, the configuration of the lighting device 3100 according to the eleventh example embodiment of the present disclosure has been described in detail. Hereinafter, a method for assembling the lighting device having the configuration will be described with reference to FIG. 46.

When the lighting device 3100 is assembled, first, respective components, namely, the light emitting module 3110, the upper heat sink 3120, the lower heat sink 3130, the reflector 3140, the globe 3150, the driving circuit 3160, and the heat dissipation plate 3170 as needed are prepared. Subsequently, the driving circuit 3160 is installed within (inside of a hollow portion) of the lower heat sink 3130, and the heat dissipation plate 3170 is disposed above the lower heat sink 3130 in which the driving circuit 3160 is installed. At this point of time, a position of the screw hole 3135 and that of the screw hole 3173 of the heat dissipation plate 3170 are adjusted to screw-couple the heat dissipation plate 3170 to the metal member 3133 of the lower heat sink 3130.

Thereafter, the light emitting module 3110 and the reflector 3140 are disposed on the heat dissipation plate 3170 in order based on the lower heat sink 3130. The reflector 3140 is fixed to the light emitting device board 3113 by a screw. Also, the globe 3150 is placed to cover the light emitting module 3110 and the reflector 3140, and the upper heat sink 3120 is inserted from the opening 3151 of the globe 3150 until when it comes into contact with the light emitting device board 3113. Finally, a screw is allowed to pass through the screw hole 3125 of the upper heat sink 3120, the screw hole 3115 of the light emitting device board 3113, and the screw hole 3175 of the heat dissipation plate 3170 so as to be fixed, thus assembling the lighting device 3100.

Also, although not shown, a socket is connected to a lower end portion of the lower heat sink 3130.

As described above, when the lighting device 3100 regarding the present example embodiment is assembled, all the components, excluding a socket, are installed in one direction (in the example of FIG. 46, from an upper side of the lower heat sink 3130), facilitating assembling, and thus, precision of positioning, or the like, may also be enhanced. Thus, according to the lighting device 3100 regarding the present example embodiment, manufacturability and production yield may also be enhanced.

[Operational Effect of Lighting Device According to Eleventh Example Embodiment]

Figure 50:
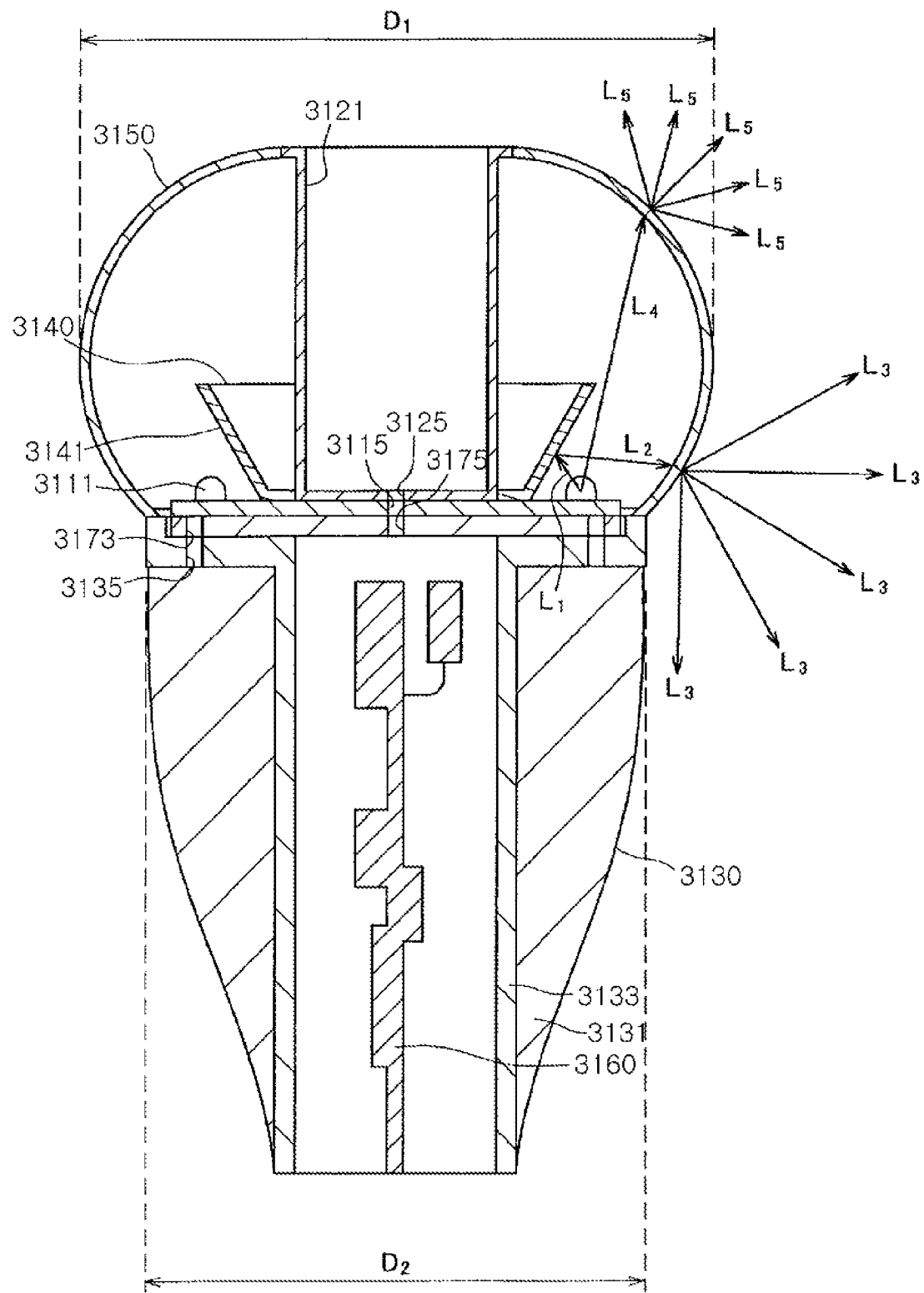
FIG. 50 is a view illustrating directionality of light in the lighting device regarding the eleventh example embodiment.
Figure 51:
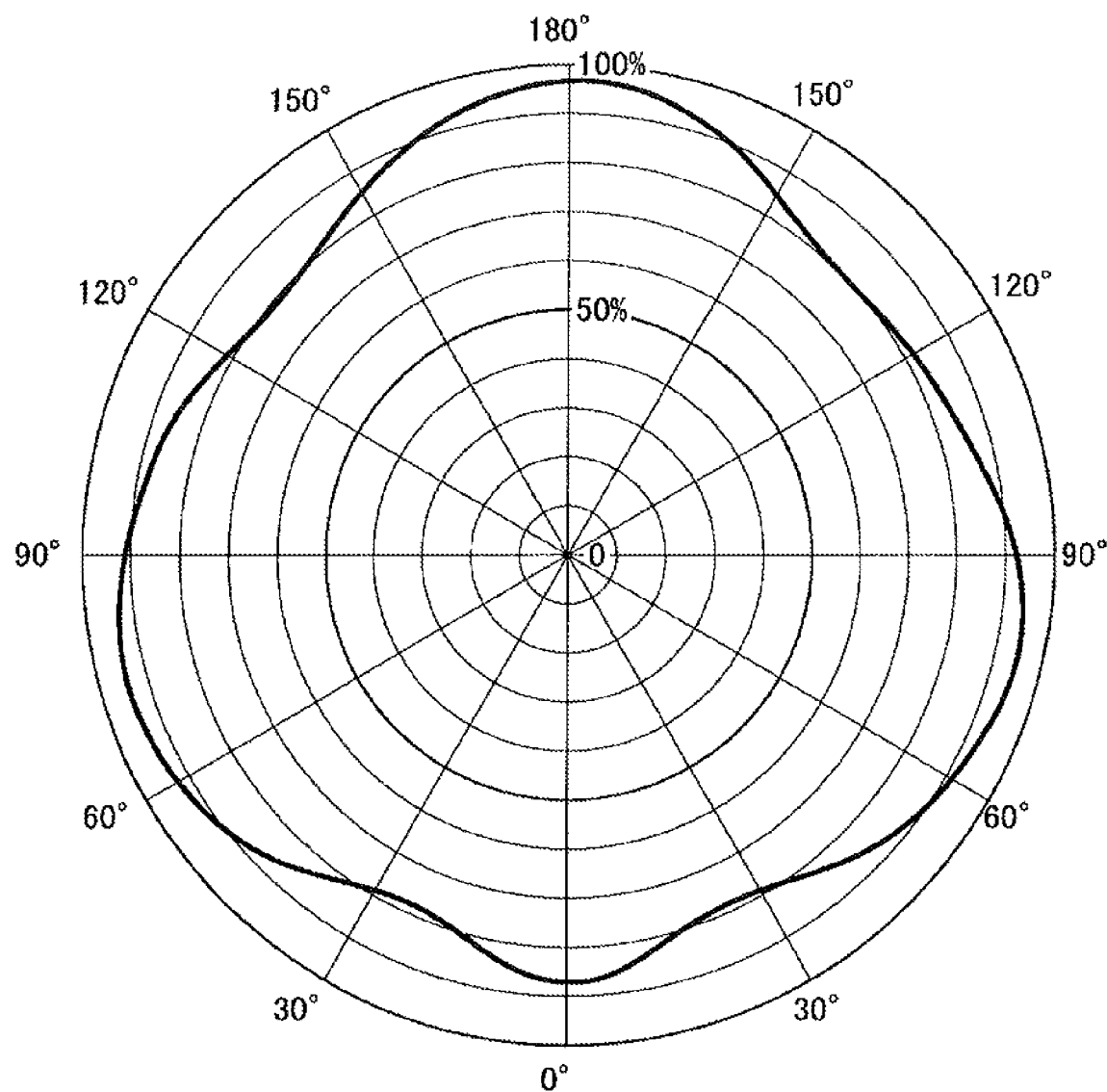
FIG. 51 is a view illustrating an example of light distribution characteristics of the lighting device regarding the eleventh example embodiment.

Hereinafter, operational effects of the lighting device 3100 regarding the present example embodiment will be described with reference to FIGS. 49 through 53. FIG. 49 is a view illustrating a flow of heat in the lighting device 3100 regarding the eleventh example embodiment. FIG. 50 is a view illustrating movements of light in the lighting device 3100 regarding the eleventh example embodiment. FIG. 51 is a view illustrating an example of light distribution characteristics of the lighting device 3100 regarding the eleventh example embodiment. FIG. 52 is a view illustrating a difference in light distribution according to a ratio of a diameter of the globe 3150 and a diameter of the lower heat sink 3130 regarding the eleventh example embodiment. FIG. 53 is a view illustrating a relationship between a maximum diameter of the upper heat sink 3120 and that of the reflector 3140 regarding the eleventh example embodiment.

(Enhancement Effect of Heat Dissipation Efficiency)

First, an enhancement effect of heat dissipation efficiency of the lighting device 3100 regarding the present example embodiment will be described with reference to FIG. 49.

The lighting device 3100 has two mainly heating parts (heating elements). A first is the light emitting module 3110. When the light emitting device 3111 is driven by the driving circuit 3160 to output light, heat is generated in the light emitting module 3110. Heat generated by each of the light emitting devices 3111 is transmitted to the light emitting device board 3113 on which the light emitting devices 3111 are mounted. Here, the light emitting device board 3113, the upper heat sink 3120, the heat dissipation plate 3170, and the lower heat sink 3130 (resin 3131 and metal member 3133) are formed of a material having high thermal conductivity.

Thus, heat generated by the light emitting module 3110 (heat generated by the light emitting devices 3111 and transmitted to the light emitting device board 3113) is first transmitted to the upper heat sink 3120 in contact with an upper surface of the light emitting device board 3113, and dissipated from an inner circumferential surface of the opening 3121 of the upper heat sink 3120 as indicated by the arrow H1 of FIG. 49. Heat generated by the light emitting module 3110 is also transmitted to the heat dissipation plate 3170 in contact with a lower surface of the light emitting device board 3113, passing through the metal member 3133, and transmitted to the resin 3131 as indicated by the arrow H2 in FIG. 49. Heat transmitted to the resin 3131 is dissipated from the fins 3139, or the like, as indicated by the arrow H3.

Meanwhile, a second heating element is the driving circuit 3160. Heat generated by the driving circuit 3160 is transmitted from the hollow portion of the lower heat sink 3130 sequentially to the metal member 3133 and the resin 3131, and dissipated outwardly from the fins 3139, or the like, as indicated by the arrow H3 like heat generated by the light emitting module 3110. Also, heat generated by the driving circuit 3160 is transmitted from the hollow portion of the lower heat sink 3130 sequentially to the heat dissipation plate 3170, the light emitting device board 3113, and the upper heat sink 3120, so as to be dissipated from an inner circumferential surface of the opening 3121 of the upper heat sink 3120 outwardly as indicated by the arrow H1 of FIG. 49.

As described above, in the lighting device 3100, heat generated by the light emitting module 3110 and the driving circuit 3160 (in particular, heat generated by the light emitting module 3110) may be dissipated by the upper heat sink 3120 as well as by the lower heat sink 3130, unlike the related art in which only a single heat sink is provided. Thus, a partial quantity of heat to be dissipated by the lower heat sink 3130 may be dissipated in a substitutional manner by the upper heat sink 3120, and thus, heat dissipation efficiency may be enhanced, which leads to enhancements in luminous efficiency.

Also, since an amount of heat dissipation burdened to the lower heat sink 3130 may be reduced, an overall size of the lower heat sink 3130 may be reduced and an area of fins 3139 of the lower heat sink 3130 may also be reduced. Also, when the size of the lower heat sink 3130 is reduced, a region in which light diffused in the direction toward a socket from the globe 3150 is blocked by the lower heat sink 3130 is narrowed, contributing to wide light distribution.

(Enhancement Effect of Light Distribution Characteristics)

Hereinafter, an enhancement effect of light distribution characteristics by the lighting device 3100 regarding the present example embodiment will be described with reference to FIGS. 50 through 52.

In the lighting device 3100 regarding the present example embodiment, as illustrated in FIG. 50, light output from the light emitting device 3111 mainly passes along two paths. A first path is a path along which light emitted from the light emitting device 3111 is reflected from a reflective surface 3141 of the reflector 3140 to reach the globe 3150, and a second path is a path along which light emitted from the light emitting device 3111 directly reaches the globe 3150.

In case of passing along the first path, light L1 output from the light emitting device 3111 is reflected from the reflective surface 3141 of the reflector 3140 and reflected light L2 is made incident to the globe 3150 and diffused from a surface of the globe 3150. Diffused light L3 is emitted in various directions. As described above, in a case in which the light emitting device 3111 is a blue LED and the globe 3150 contains a phosphor or in a case in which the surface of the globe 3150 is coated with a phosphor, a degree of light diffusion is high, and thus, the diffused light L3 may be diffused in a wider range. Also, in a case in which the globe 3150 contains a light diffuser or in a case in which the surface of the globe 3150 is coated with a light diffuser, a diffusion range of the diffused light L3 may be increased.

Here, as described above, the reflector 3140 has the reversed circular truncated conical shape and the maximum diameter D1 of the globe 3150 is greater than the maximum diameter D2 of the lower heat sink 3130. Thus, when light output from the light emitting device 3111 passes along the first path, light output from the light emitting device 3111 may be emitted in the direction toward a socket. Namely, since the reflector 3140 has the reversed circular truncated conical shape having a diameter increased in a direction away from the light emitting device board 3113 (in a direction opposite to the direction of the socket) and the lateral circumferential surface of the reflector 3140 is the light reflective surface 3141, light L1 output from the light emitting device 3111 may be reflected in the direction toward the socket, more than in the horizontal direction, by the light reflective surface 3141, and the reflective light L2 may be further diffused from the globe 3150. When the light is diffused, since the maximum diameter D1 of the globe 3150 is greater than the maximum diameter D2 of the lower heat sink 3130, the lower heat sink 3130 does not block the diffused light L3 diffused from the surface of the globe 3150, and thus, the diffused light L3 may be emitted in a wider range in the direction toward the socket, rather than in the horizontal direction.

In case of passing along the second path, light L4 output from the light emitting device 3111 is made directly incident to the globe 3150, without contacting the reflector 3140, and diffused from a surface of the globe 3150. Also, in this case, diffused light L5 is diffused in various directions. Here, in the case in which light output from the light emitting device 3111 passes along the first path, a diffused amount of light in a direction toward the top portion of the globe 3150 (opposite to the direction of the socket) is smaller than that in the horizontal direction. However, since light output from the light emitting device 3111 passes along the second path, a diffused amount of light in the direction toward the top portion of the globe 3150, relative to the horizontal direction, may be sufficiently secured.

As described above, in the lighting device 3100 according to the present example embodiment, since light output from the light emitting device 3111 passes along the two paths, a wide light distribution angle may be realized. In detail, the lighting device 3100 may accomplish very high light distribution characteristics with a difference in intensity of light emission of, for example, ±10% within a range of a light distribution angle of 300 deg, and thus, the lighting device 3100 may have performance equal to that of an incandescent lamp, and thus, it may be used as a substitute for an incandescent lamp.

The effect of a wide degree of light distribution may be conspicuous when the maximum diameter D1 of the globe 3150 is 1.2 times or greater the maximum diameter D2 of the lower heat sink 3130. FIG. 52 illustrates the results of inventor's review regarding the relationship between the maximum diameter D1 of the globe 3150 and the maximum diameter D2 of the lower heat sink 3130. In FIG. 52, the horizontal axis indicates a ratio (hereinafter, referred to as 'diameter of globe/ diameter of lower heat sink') of the maximum diameter of the globe 3150 (diameter of the globe) to the maximum diameter of the lower heat sink 3130 (diameter of the lower heat sink), while the vertical axis indicates a ratio (hereinafter, referred to as 'minimum light amount/maximum light amount') of a minimum value of an amount of light to a maximum value of an amount of light diffused from the globe 3150. Here, maximum light amount refers to a value of an amount of light at a light distribution at which an amount of light is maximized in the entire light distribution angles in a case in which the direction of a socket is set as an angle 0 and a light distribution angle is indicated by a rotation angle in a counterclockwise direction, and the minimum light amount refers to a value of an amount of light at a light distribution angle at which an amount of light is minimized in the entire light distribution angles.

Figure 52A:
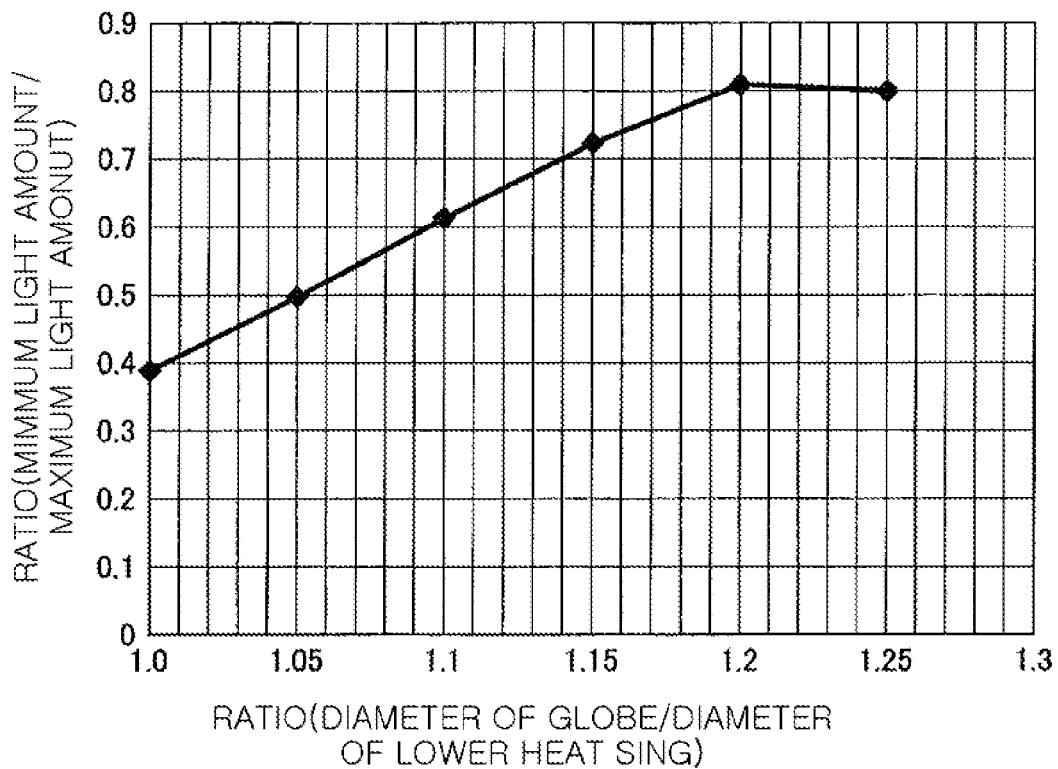
FIG. 52 is a view illustrating a difference in light distribution according to a ratio of a diameter of a globe and a diameter of a lower heat sink regarding the eleventh example embodiment.
Figure 52B:
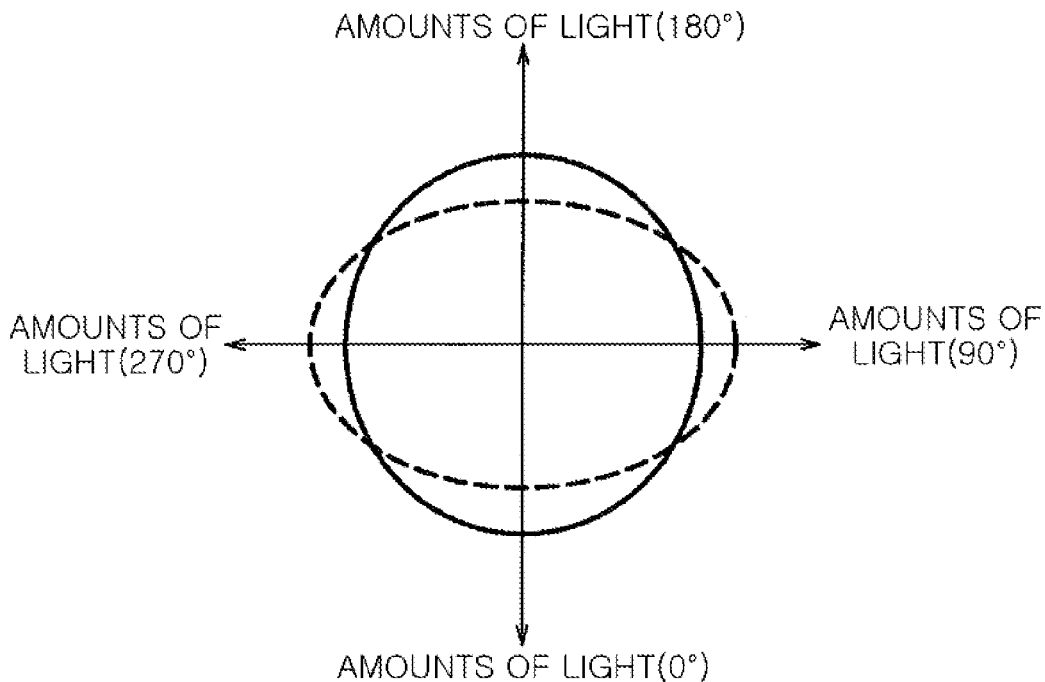

As illustrated in FIG. 52A, in a case in which 'diameter of globe/diameter of lower heat sink' is less than 1.2, 'minimum light amount/maximum light amount' is small. This means that a difference in amounts of light is significant depending on directions in which light is diffused from the globe 3150, as indicated by the dotted line in FIG. 52B. In the example of FIG. 52B, it can be seen that amounts of light in the horizontal direction in which light distribution angles are 90 and 270 degrees are large, while amounts of light in the direction perpendicular to the horizontal direction in which light distribution angles are 0 and 180 degrees are small and different.

Meanwhile, when 'diameter of globe/diameter of lower heat sink' is 1.2 or greater, 'minimum light amount/maximum light amount' is increased. This means that a difference in amounts of light depending on directions in which light is diffused from the globe 3150 is small, as indicated by the solid line. In the example of FIG. 52B, it can be seen that the amounts of light is nearly uniform regardless of a direction of light diffusion.

In this manner, when 'diameter of globe/diameter of lower heat sink' is 1.2 or greater, the amount of light is substantially uniform regardless of a direction of light diffusion, and thus, very high light distribution characteristics that the light distribution angle is within the 300 deg and a difference in intensity of light emission is within ±10% may be easily realized.

Also, a maximum value of 'diameter of globe/diameter of lower heat sink' is not particularly defined, but if 'diameter of globe/diameter of lower heat sink' is too great, it may exceed the range of ANSI standards as a standard of a bulb size, and thus, preferably, 'diameter of globe/diameter of lower heat sink' is determined within a range satisfying the ANSI standards.

(Relationship Between Maximum Diameter of Upper Heat Sink 3120 and Maximum Diameter of Reflector 3140)

Hereinafter, a relationship between a maximum diameter of the upper heat sink 3120 and that of the reflector 3140 will be described.

As described above, in the present example embodiment, the upper heat sink 3120 is disposed in the hollow portion of the reflector 3140, and in this case, a relationship between a maximum diameter of the upper heat sink 3120 and that of the reflector 3140 (for example, a diameter of the reflector farthest from the light emitting device board 3113 needs to be noted in consideration of a wide light distribution angle of the lighting device 3100.

Figure 53A:
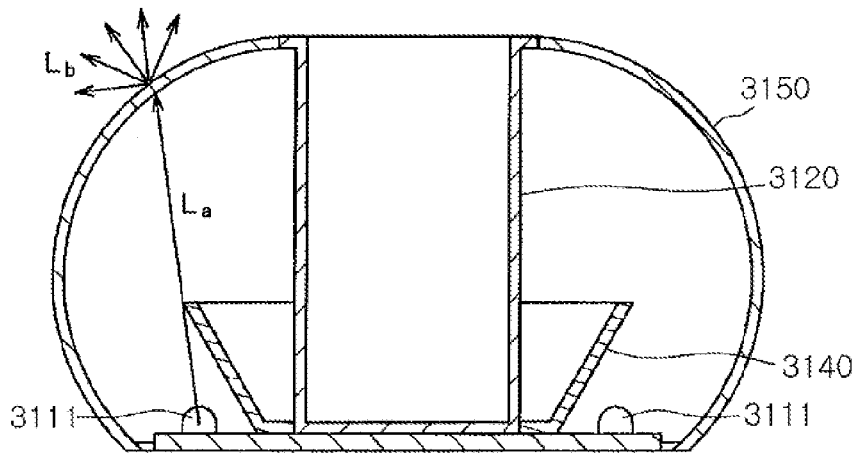
FIG. 53 is a view illustrating a relationship between a maximum diameter of an upper heat sink regarding the eleventh example embodiment.
Figure 53B:
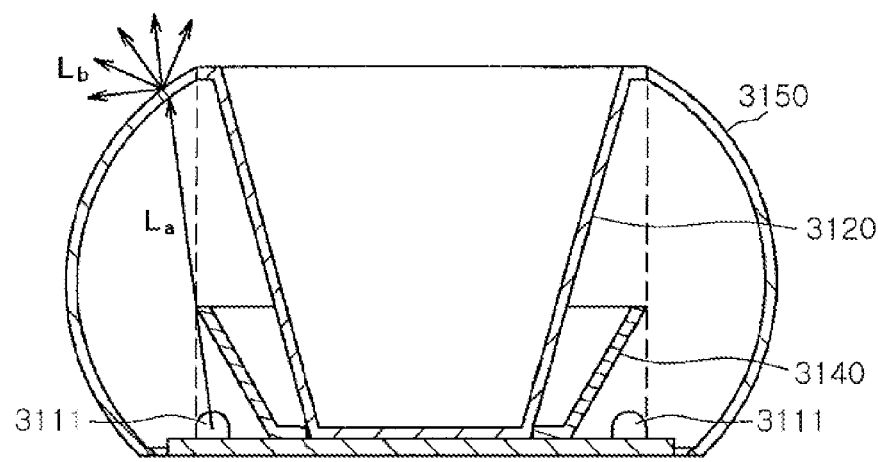
Figure 53C:
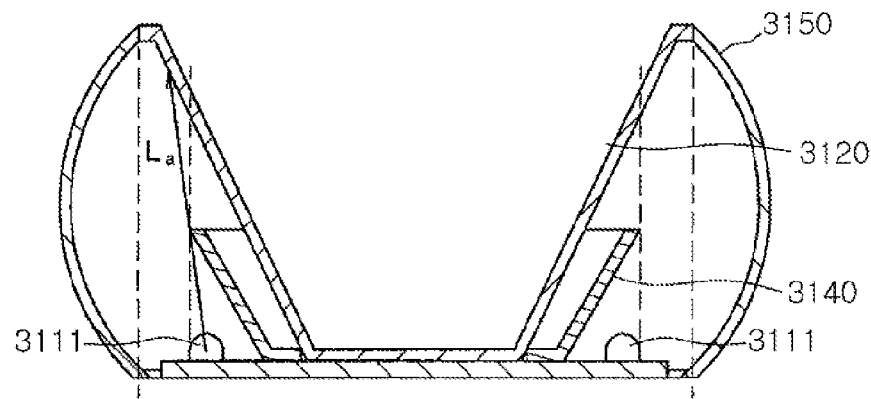

Namely, in a case in which a maximum diameter of the upper heat sink 3120 is smaller than that of the reflector 3140 as illustrated in FIG. 53A and in a case in which a maximum diameter of the upper heat sink 3120 is equal to that of the reflector 3140 as illustrated in FIG. 53B, light output from the light emitting device 3111 may directly reach the globe 3150, without contacting the reflector 3140. However, in a case in which a maximum diameter of the upper heat sink 3120 is greater than that of the reflector 3140 as illustrated in FIG. 53C, although light output from the light emitting device 3111 does not reach the reflector 3140, the light is blocked by the upper heat sink 3120 and cannot reach the globe 3150. Thus, in this case, an amount of light moving in a direction toward the top portion of the globe 3150 in the horizontal direction is reduced. This may make it difficult to realize very high light distribution characteristics in which a light distribution angle is within a range of 300 deg and a difference in intensity of light emission is ±10%.

Thus, in the lighting device 3100 regarding the present example embodiment, preferably, a maximum diameter of the upper heat sink 3120 is equal to or smaller than a maximum diameter of the reflector 3140.

Meanwhile, if the upper heat sink 3120 is too small, an amount of heat dissipation by the upper heat sink 3120 may be reduced. Thus, a size of the upper heat sink 3120 may be determined in consideration of a trade-off between light dissipation efficiency and light distribution characteristics.

(Others)

According to the lighting device 3000 regarding the present example embodiment having the configuration as described above, luminous efficiency (90 lm/W or greater), an amount of light emission (800 lm or greater), color temperature (2700 to 3000 K), color rendering (Ra 90 or greater), shape (standard regarding a bulb size conforming to ANSI standards), and the like, as well as the enhancement effects of the light dissipation efficiency and light distribution characteristics, may be satisfied, and since the lighting device 3000 has performance equal to that of incandescent bulbs, it may be used as a substitute for incandescent bulbs.

<Twelfth Example Embodiment>

[Configuration of Lighting Device According to Twelfth Example Embodiment]

Figure 54A:
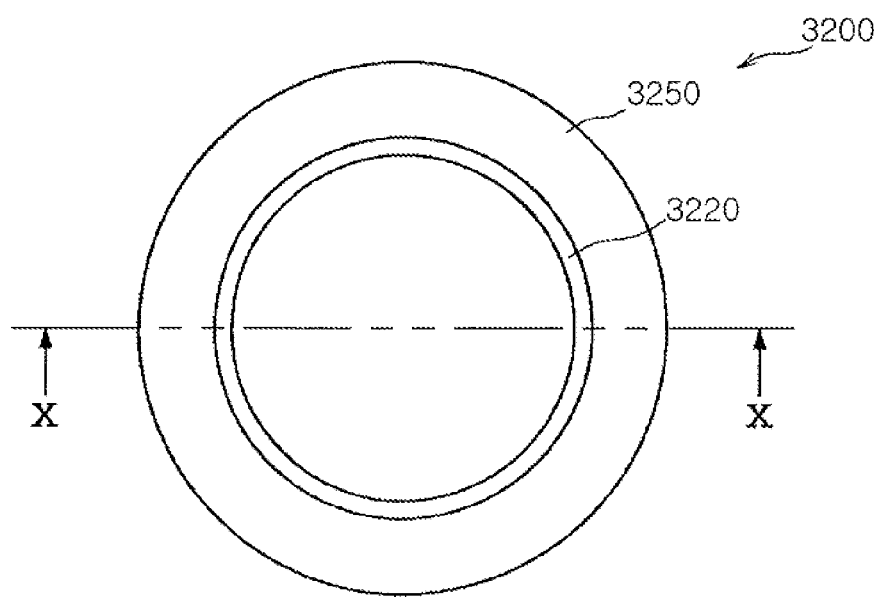
FIG. 54A is a top view and FIG. 54B is a front view illustrating an overall configuration of a bulb-type lighting device regarding a twelfth example embodiment of the present disclosure.
Figure 54B:
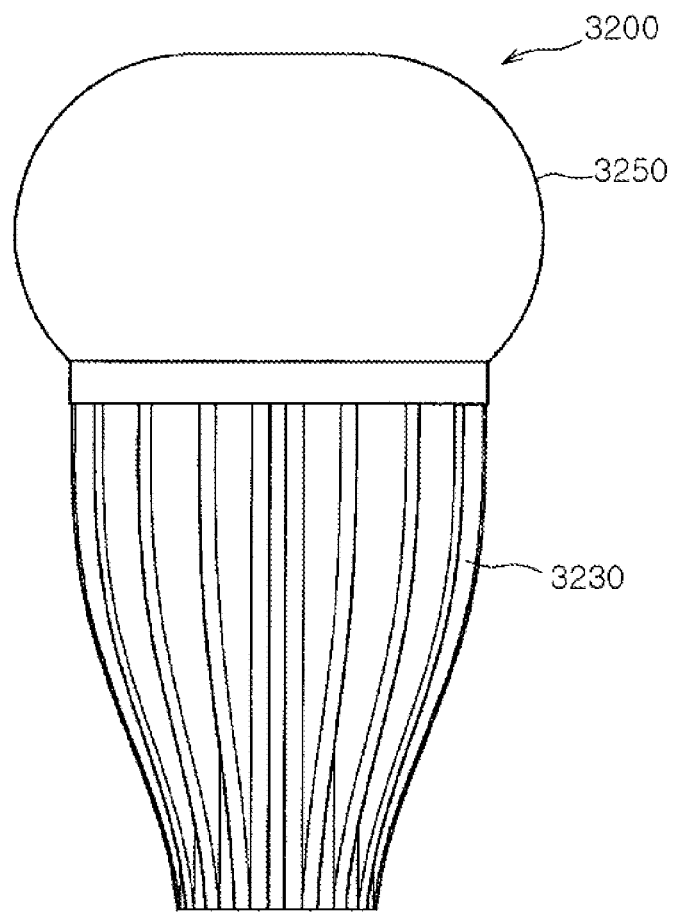
Figure 55:
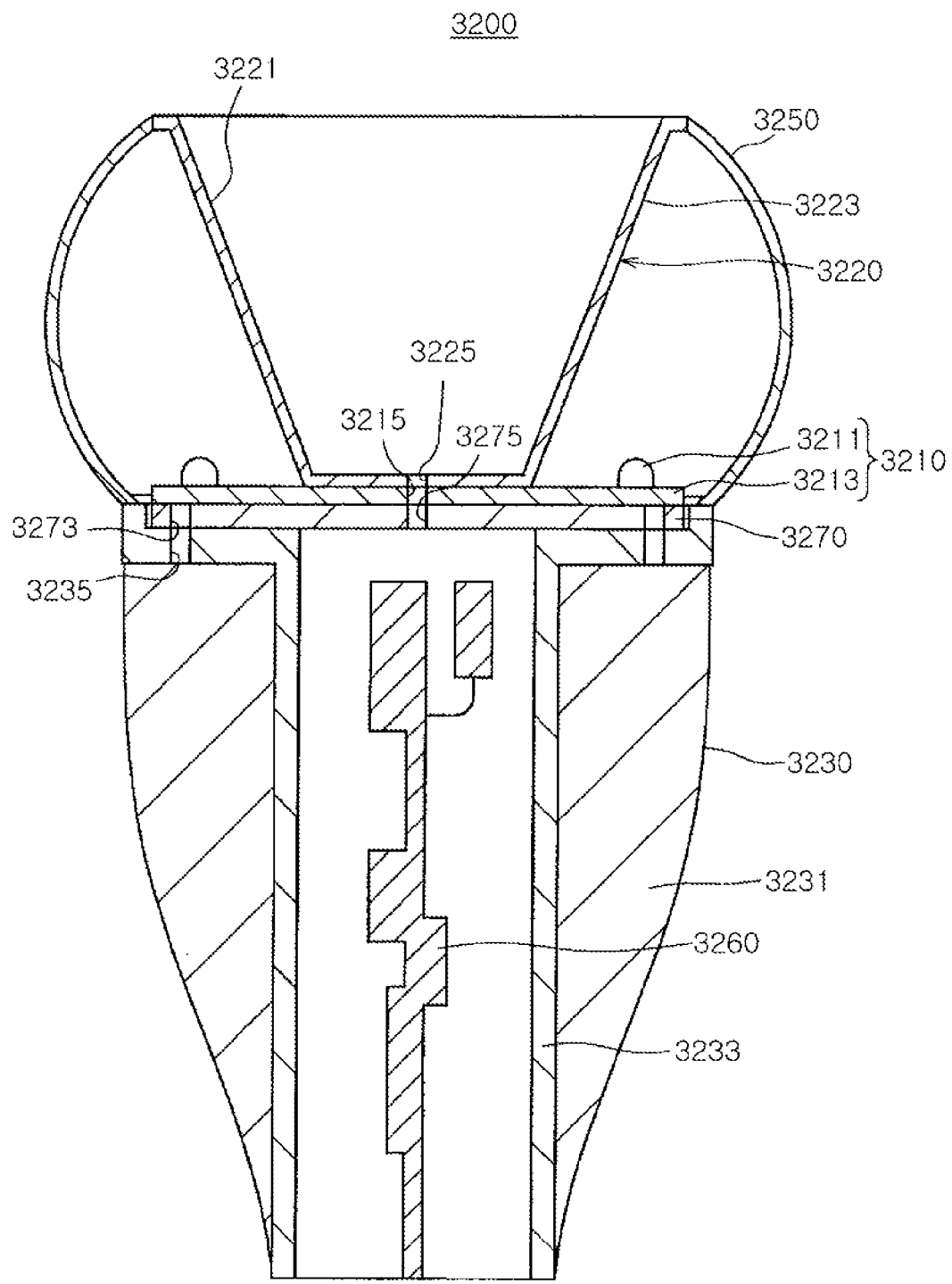
FIG. 55 is a cross-sectional view of the lighting device regarding the twelfth example embodiment taken along line X-X of FIG. 54A.

Hereinafter, a configuration of a bulb-type lighting device regarding the twelfth example embodiment of the present disclosure will be described in detail with reference to FIGS. 54 and 55. FIG. 54A is a top view and FIG. 54B is a front view illustrating an overall configuration of a bulb-type lighting device 3200 regarding a twelfth example embodiment of the present disclosure. FIG. 55 is a cross-sectional view of the lighting device 3200 regarding the twelfth example embodiment taken along line X-X of FIG. 54A.

As illustrated in FIGS. 54 and 55, the lighting device 3200 regarding the present example embodiment mainly includes a light emitting module 3210, a first heat sink 3220 (hereinafter, referred to as an 'upper heat sink'), a second heat sink 3230 (hereinafter, referred to as a 'lower heat sink'), a globe 3250, a driving circuit 3260, and a heat dissipation plate 3270. Unlike the lighting device 3100 regarding the eleventh example embodiment as described above, the lighting device 3200 does not have a reflector and the upper heat sink 3220 serves as a reflector. Hereinafter, each component will be described in detail.

(Light Emitting Module 3210, Lower Heat Sink 3230, Globe 3250, Driving Circuit 3260, Heat Dissipation Plate 3270).

The light emitting module 3210, the lower heat sink 3230, the globe 3250, the driving circuit 3260, and the heat dissipation plate 3270 have the same configurations and functions as those of the light emitting module 3110, the lower heat sink 3130, the globe 3150, the driving circuit 3160, and the heat dissipation plate 3170, so a detailed description thereof will be omitted.

(Upper Heat Sink 3220)

The upper heat sink 3220 has a combination of the function of the upper heat sink 3120 and the function of the reflector 3140 regarding the eleventh example embodiment. Namely, the upper heat sink 3220 dissipates at least any one of heat generated by the light emitting module 3210 and heat generated by the driving circuit 3260 outwardly and maintained in a surface (hereinafter, the surface of the light emitting device 3211 side) of the light emitting device board 3213 on which the light emitting device 3211 is disposed, to reflect light output from the light emitting device 3211.

Thus, the upper heat sink 3220 is formed of a material having high light reflectivity and high thermal conductivity. Such a material may include, for example, a metal such as aluminum, or the like, of which a surface, corresponding to an outer circumferential surface of the upper heat sink 3220, is subjected to mirror surface machining.

Since the upper heat sink 3220 serves to reflect light from the light emitting device 3211 in a direction toward a socket to widen a light distribution angle of the lighting device 3200 toward the socket, the upper heat sink 3220 has a reversed circular truncated conical shape. Namely, the upper heat sink 3220 is installed to be protruded from the surface of the light emitting device 3211 side of the light emitting device board 3213 such that the upper heat sink 3220 has a diameter increased in a direction away from the light emitting device board 3213, forming a circular truncated conical shape. Also, an outer circumferential surface of the upper heat sink 3220 having the circular truncated conical shape is formed as a reflective surface 3223 from which light output from the light emitting device 3211 is reflected. Thus, the mirror-surface machining may be performed only on the reflective surface 3223.

Also, the upper heat sink 3220 has a hollow shape with an opening 3221 formed one end thereof. Since the upper heat sink 3220 has the hollow portion, a surface area (area of the surface used to dissipate heat) of the outwardly exposed surface of the upper heat sink 3220 may be increased to enhance a heat dissipation effect.

Also, the upper heat sink 3220 is installed on one side of the ring configured according to the disposition of the light emitting devices 3211 in the central axis direction, based on the light emitting device board 3213 as a reference such that it is in contact with the light emitting device board 3213. In this manner, since the upper heat sink 3220 is installed to be in contact with the light emitting device board 3213, it mainly serves to dissipate heat generated by the light emitting device board 3213 (or the entirety of the light emitting module 3210) outwardly. Accordingly, heat generated by the light emitting module 3210 that generates a large amount of heat, relative to the driving circuit 3260, is entirely dissipated by both the upper heat sink 3220 and the lower heat sink 3230, heat dissipation efficiency of the lighting device 3200 may be significantly increased, compared to a case in which only a single heat sink is provided.

Also, a screw hole 3225 is installed in a substantially central portion of a lower surface (closed surface) of the upper heat sink 3220, and the upper heat sink 3220 is screw-coupled with the light emitting device board 3213 and the heat dissipation plate 3270 through the screw holes 3215 and 3275 so as to be fixed in position.

An assembling method of the lighting device 3200 is identical to that of the lighting device 3100 regarding the eleventh example embodiment as described above, except for the absence of the reflector, so a detailed description thereof will be omitted.

[Operational Effect of Lighting Device According to Twelfth Example Embodiment]

Figure 56:
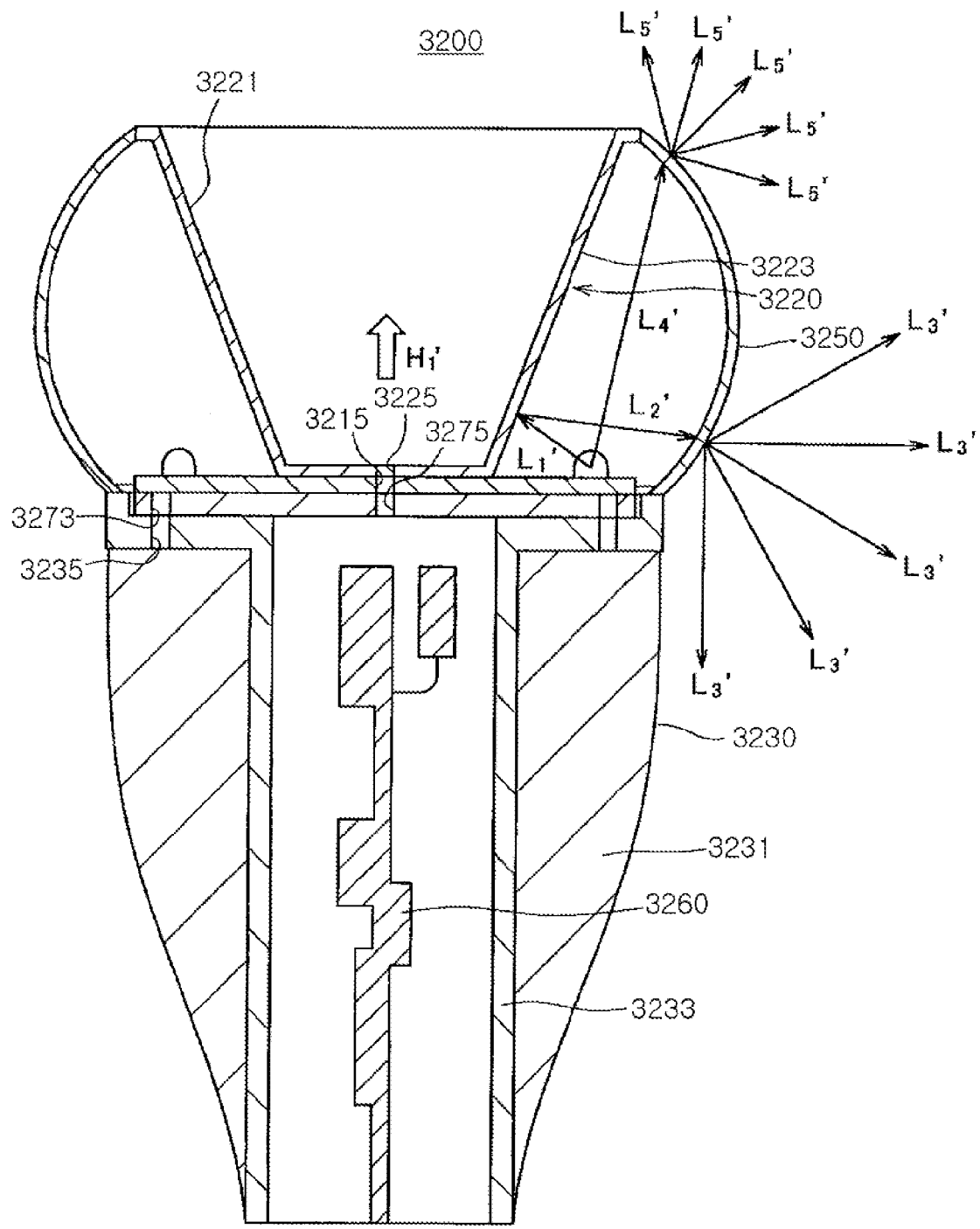
FIG. 56 is a view illustrating a flow of heat and directionality of light in the lighting device regarding the twelfth example embodiment.

Hereinafter, operational effects of the lighting device 3200 regarding the present example embodiment will be described with reference to FIG. 56. FIG. 56 is a view illustrating a flow of heat and movements of light in the lighting device 3200 regarding the twelfth example embodiment.

(Enhancement Effect of Heat Dissipation Efficiency)

First, an enhancement effect obtained by the lighting device 3200 regarding the present example embodiment will be described.

The lighting device 3200 has two mainly heating parts (heating elements)). A first one is the light emitting module 3210. When the light emitting device 3211 is driven by the driving circuit 3260 to output light, heat is generated by the light emitting module 3210. Heat generated by each of the light emitting devices 3211 is transmitted to the light emitting device board 3213 on which the light emitting devices 3211 are mounted. Here, the light emitting device board 3213, the upper heat sink 3220, the heat dissipation plate 3270, and the lower heat sink 3230 (resin 3231 and metal member 3233) are formed of a material having high thermal conductivity.

Thus, heat generated by the light emitting module 3210 (heat generated by the light emitting devices 3211 and transmitted to the light emitting device board 3213) is first transmitted to the upper heat sink 3220 in contact with an upper surface of the light emitting device board 3213, and dissipated from an inner circumferential surface of the opening 3221 of the upper heat sink 3220 as indicated by the arrow H1' of FIG. 56. Heat generated by the light emitting module 3210 is also transmitted to the heat dissipation plate 3270 in contact with a lower surface of the light emitting device board 3213, passing through the metal member 3233, and transmitted to the resin 3231, and subsequently dissipated from the lower heat sink 3230 outwardly, as in the eleventh example embodiment.

Meanwhile, a second heating element is the driving circuit 3260. Heat generated by the driving circuit 3260 is transmitted from the hollow portion of the lower heat sink 3230 sequentially to the metal member 3233 and the resin 3231, and dissipated outwardly from lower heat sink 3230 together with heat generated by the light emitting module 3210. Also, heat generated by the driving circuit 3260 is transmitted from the hollow portion of the lower heat sink 3230 sequentially to the heat dissipation plate 3270, the light emitting device board 3213, and the upper heat sink 3220, so as to be dissipated from an inner circumferential surface of the opening 3221 of the upper heat sink 3220 outwardly as indicated by the arrow H1' of FIG. 56.

As described above, in the lighting device 3200, heat generated by the light emitting module 3210 and the driving circuit 3260 (in particular, heat generated by the light emitting module 3210) may be dissipated by the upper heat sink 3220 as well as by the lower heat sink 3230, unlike the related art in which only a single heat sink is provided. Thus, a partial quantity of heat to be dissipated by the lower heat sink 3230 may be dissipated in a substitutional manner by the upper heat sink 3220, and thus, heat dissipation efficiency may be enhanced, which leads to enhancement of luminous efficiency.

Also, since an amount of heat dissipation burdened to the lower heat sink 3230 may be reduced, an overall size of the lower heat sink 3230 may be reduced and an area of fins (not shown) of the lower heat sink 3230 may also be reduced. Also, when the size of the lower heat sink 3230 is reduced, a region in which light diffused in the direction toward a socket from the globe 3250 is blocked by the lower heat sink 3230 is narrowed, contributing to wide light distribution.

(Enhancement Effect of Light Distribution Characteristics)

Hereinafter, an enhancement effect of light distribution characteristics by the lighting device 3200 regarding the present example embodiment will be described.

In the lighting device 3200 regarding the present example embodiment, as illustrated in FIG. 56, light output from the light emitting device 3211 mainly passes along two paths. A first path is a path along which light emitted from the light emitting device 3211 is reflected from a reflective surface 3223 of the upper heat sink 3220 to reach the globe 3250, and a second path is a path along which light emitted from the light emitting device 3211 directly reaches the globe 3250.

In case of passing along the first path, light L1' output from the light emitting device 3211 is reflected from the reflective surface 3223 of the upper heat sink 3220 and reflected light L2' is made incident to the globe 3250 and diffused from a surface of the globe 3250. Diffused light L3' is emitted in various directions. In a case in which the light emitting device 3211 is a blue LED and the globe 3250 contains a phosphor or in a case in which the surface of the globe 3250 is coated with a phosphor, a degree of light diffusion is high, and thus, the diffused light L3' may be diffused in a wider range. Also, in a case in which the globe 3250 contains a light diffuser or in a case in which the surface of the globe 3250 is coated with a light diffuser, a diffusion range of the diffused light L3' may be increased.

Here, as described above, the upper heat sink 3220 has the reversed circular truncated conical shape and the maximum diameter of the globe 3250 is greater than the maximum diameter of the lower heat sink 3230. Thus, when light output from the light emitting device 3211 passes along the first path, light output from the light emitting device 3211 may be emitted in the direction toward a socket. Namely, since the upper heat sink 3220 has the reversed circular truncated conical shape having a diameter increased in a direction away from the light emitting device board 3213 (in a direction opposite to the direction of the socket) and the lateral circumferential surface of the upper heat sink 3220 is the light reflective surface 3223, light L1' output from the light emitting device 3211 may be reflected in the direction toward the socket, rather than in the horizontal direction, by the light reflective surface 3223, and the reflective light L2' may be further diffused from the globe 3250. When the light is diffused, since the maximum diameter of the globe 3250 is greater than the maximum diameter of the lower heat sink 3230, the lower heat sink 3230 does not block the diffused light L3' diffused from the surface of the globe 3250, and thus, the diffused light L3' may be emitted in a wider range in the direction toward the socket, rather than in the horizontal direction.

In case of passing along the second path, light L4' output from the light emitting device 3211 is directly made incident to the globe 3250, without contacting the upper heat sink 3220, and diffused from a surface of the globe 3250. Also, in this case, diffused light L5' is diffused in various directions. Here, in the case in which light output from the light emitting device 3211 passes along the first path, a diffused amount of light in a direction toward the top portion of the globe 3250 (opposite to the direction of the socket) is smaller than that in the horizontal direction. However, since light output from the light emitting device 3211 passes along the second path, a diffused amount of light in the direction toward the top portion of the globe 3250, relative to the horizontal direction, may be sufficiently secured.

As described above, in the lighting device 3200 according to the present example embodiment, since light output from the light emitting device 3211 passes along the two paths, a wide light distribution angle may be implemented. In detail, the lighting device 3200 may accomplish very high light distribution characteristics with a difference in intensity of light emission of, for example, ±10% within a range of a light distribution angle of 300 deg as illustrated in FIG. 51, and thus, the lighting device 3200 may have performance equal to that of an incandescent lamp, and thus, it may be used as a substitute for an incandescent lamp.

Also, other operational effects are identical to those of the eleventh example embodiment, except for the relationship between the maximum diameter of the upper heat sink and that of the reflector, so a detailed description thereof will be omitted.

So far, the example embodiments of the present disclosure have been described with respect to the accompanying drawings, but the present disclosure is not limited thereto. For example, in the aforementioned eleventh and twelfth example embodiments, the cross-sections of the light emitting device board 3113, the first heat sink 3120, the second heat sink 3130, the reflector 3140, the globe 3150, and the heat dissipation plate 3170 taken in a direction perpendicular with respect to the central axis C have a circular shape, but the present disclosure is not limited thereto. For example, a cross-section of each member may have a polygonal or oval shape.

Also, in the aforementioned eleventh example embodiment, only a single light emitting device group configured by disposing the plurality of light emitting devices 3111 in an annular arrangement on the light emitting device board 3113 is provided, but the present disclosure is not limited thereto. For example, a plurality of light emitting device groups may be installed in a concentric shape on the light emitting device board 3113.

Meanwhile, in the lighting device according to the example embodiments of the present disclosure as described above, LED chips having various structures or various types of LED package including such LED chips may be used. Hereinafter, various LED chips and LED packages advantageously employable in the lighting devices according to the example embodiments of the present disclosure will be described.

<LED Chip—First Example>

Figure 57:
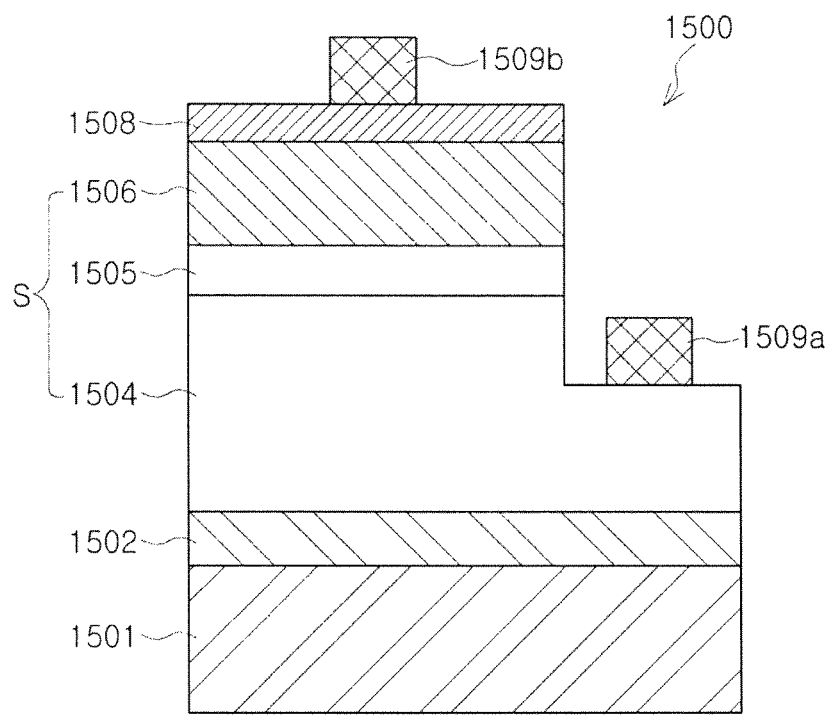
FIG. 57 is a cross-sectional view illustrating an example of an LED chip employable in a lighting device according to an example embodiment of the present disclosure.

FIG. 57 is a cross-sectional view illustrating an example of an LED chip employable in a lighting device according to an example embodiment of the present disclosure.

As illustrated in FIG. 57, an LED chip 1500 may include a light emitting laminate S formed on a semiconductor substrate 1501. The light emitting laminate S includes a first conductivity-type semiconductor layer 1504, an active layer 1505, and a second conductivity-type semiconductor layer 1506.

An ohmic-contact layer 1508 may be formed on the second conductivity-type semiconductor layer 1506, and first and second electrodes 1509a and 1509b may be formed on upper surfaces of the first conductivity-type semiconductor layer 1504 and the ohmic-contact layer 1508, respectively.

In the present disclosure, terms such as 'upper portion', 'upper surface', 'lower portion', 'lower surface', 'lateral surface', and the like, are determined based on the drawings, and in actuality, the terms may be changed according to a direction in which a device is disposed.

Hereinafter, major components of the LED chip 1500 will be described.

(Substrate 1501)

As the substrate 1501, an insulating substrate, a conductive substrate, or a semiconductor substrate may be used as needed. For example, sapphire, SiC, Si, $MgAl_2O_4$, MgO, $LiAlO_2$, $LiGaO_2$, or GaN may be used as a material of the substrate 1501. For epitaxial growth of a GaN material, a GaN substrate, a homogeneous substrate, may be desirable, but it incurs high production costs due to difficulties in the manufacturing thereof.

As a heterogeneous substrate, a sapphire substrate, a silicon carbide substrate, or the like, is largely used, and in this case, a sapphire substrate is utilized relatively more than the costly silicon carbide substrate. When a heterogeneous substrate is used, defects such as dislocation, and the like, are increased due to differences in lattice constants between a substrate material and a thin film material. Also, differences in coefficients of thermal expansion between the substrate material and the thin film material may cause bowing due to changing temperatures, and the bowing may cause cracks in the thin film. This problem may be reduced by using a buffer layer 1502 between the substrate 1501 and the light emitting laminate S based on GaN.

The substrate 1501 may be fully or partially removed or patterned during a chip manufacturing process in order to enhance optical or electrical characteristics of the LED chip before or after the LED structure is grown.

For example, a sapphire substrate may be separated by irradiating a laser on the interface between the substrate and a semiconductor layer through the substrate, and a silicon substrate or a silicon carbide substrate may be removed through a method such as polishing, etching, or the like.

In removing the substrate, a support substrate may be used, and in this case, in order to enhance luminous efficiency of an LED chip on the opposite side of the original growth substrate, the support substrate may be bonded by using a reflective metal or a reflective structure may be inserted into a bonding layer.

Substrate patterning forms a concavo-convex surface or a sloped surface on a main surface (one surface or both surfaces) or lateral surfaces of a substrate before or after the growth of the LED structure, enhancing light extraction efficiency. A pattern size may be selected within a range from 5 nm to 500 µm. The substrate may have any structure as long as it has a regular or irregular pattern to enhance light extraction efficiency. The substrate may have various shapes such as a columnar shape, a peaked shape, a hemispherical shape, and the like.

A sapphire substrate is a crystal having Hexa-Rhombo R3c symmetry, of which lattice constants in c-axial and a-axial directions are approximately 13.001 Å and 4.758 Å, respectively, and has a C-plane (0001), an A-plane (1120), an R-plane (1102), and the like. In this case, the C-plane of sapphire crystal allows a nitride thin film to be relatively easily grown thereon and is stable at high temperatures, so a sapphire substrate is commonly used as a nitride growth substrate.

The substrate may also be formed of silicon (Si). Since a silicon (Si) substrate is more appropriate for increasing a diameter and is relatively low in price, it may be used to facilitate mass-production. Here, a difference in lattice constants between the silicon substrate having a (111) plane as a substrate surface and GaN is approximately 17%, requiring a technique of suppressing the generation of crystal defects due to the difference between the lattice constants is required. Also, a difference in coefficients of thermal expansion between silicon and GaN is approximately 56%, requiring a technique of suppressing bowing of a wafer generated due to the difference in the coefficients of thermal expansion. Bowed wafers may result in cracks in the GaN thin film and make it difficult to control processes to increase dispersion of emission wavelengths of light in the same wafer, or the like.

The silicon substrate absorbs light generated in the GaN-based semiconductor, lowering external quantum yield of the light emitting device. Thus, the substrate may be removed and a support substrate such as a silicon substrate, a germanium substrate, an SiAl substrate, a ceramic substrate, a metal substrate, or the like, including a reflective layer may be additionally formed to be used, as needed.

(Buffer Layer 1502)

When a GaN thin film is grown on a heterogeneous substrate such as the silicon substrate, dislocation density may be increased due to a lattice constant mismatch between a substrate material and a thin film material, and cracks and bowing may be generated due to a difference between coefficients of thermal expansion. In order to prevent dislocation of and cracks in the light emitting laminate S, the buffer layer 1502 may be disposed between the substrate 1501 and the light emitting laminate S. The buffer layer 1502 may serve to adjust a degree of bowing of the substrate when an active layer is grown, to reduce wavelength dispersion of a wafer.

The buffer layer 1502 may be made of $Al_xIn_yGa_{1-x-y}N$ ($0 \leq x \leq 1$, $0 \leq y \leq 1$), in particular, GaN, AlN, AlGaN, InGaN, or InGaNAlN, and a material such as $ZrB_2$, $HfB_2$, ZrN, HfN, TiN, or the like, may also be used as necessary. Also, the buffer layer may be formed by combining a plurality of layers or by gradually changing a composition.

A silicon (Si) substrate has a coefficient of thermal expansion significantly different from that of GaN. Thus, in the case of growing a GaN-based thin film on the silicon substrate, when a GaN thin film is grown at a high temperature and is subsequently cooled to room temperature, tensile stress is applied to the GaN thin film due to the difference in the coefficients of thermal expansion between the silicon substrate and the GaN thin film, generating cracks. In this case, in order to prevent the generation of cracks, a method of growing the GaN thin film such that compressive stress is applied to the GaN thin film while the GaN thin film is being grown is used to compensate for tensile stress.

A difference in the lattice constants between silicon (Si) and GaN involves a high possibility of a defect being generated therein. In the case of using a silicon substrate, a buffer layer having a composite structure may be used in order to control stress for suppressing bowing as well as controlling a defect.

For example, first, an AlN layer is formed on the substrate 1501. In this case, a material not including gallium (Ga) may be used in order to prevent a reaction between silicon (Si) and gallium (Ga). Besides AlN, a material such as SiC, or the like, may also be used. The AlN layer is grown at a temperature ranging from 400° C. to 1,300° C. by using an aluminum (Al) source and a nitrogen (N) source. An AlGaN intermediate layer may be inserted between a plurality of AlN layers to control stress, as needed.

(Light Emitting Laminate S)

The light emitting laminate S having a multilayer structure of a Group III nitride semiconductor will be described in detail. The first and second conductivity-type semiconductor layers 1504 and 1506 may be formed of n-type and p-type impurity-doped semiconductor materials, respectively.

However, the present disclosure is not limited thereto and, conversely, the first and second conductivity-type semiconductor layers 1504 and 1506 may be formed of p-type and n-type impurity-doped semiconductor materials, respectively. For example, the first and second conductivity-type semiconductor layers 1504 and 1506 may be made of a Group III nitride semiconductor, e.g., a material having a composition of $Al_xIn_yGa_{1-x-y}N$ ($0 \leq x \leq 1$, $0 \leq y \leq 1$, $0 \leq x+y \leq 1$). Of course, the present disclosure is not limited thereto and the first and second conductivity-type semiconductor layers 1504 and 1506 may also be formed of a material such as an AlGaInP-based semiconductor or an AlGaAs-based semiconductor.

Meanwhile, the first and second conductivity-type semiconductor layers 1504 and 1506 may have a monolayer structure, or, alternatively, the first and second conductivity-type semiconductor layers 1504 and 1506 may have a multilayer structure including layers having different compositions, thicknesses, and the like, as necessary. For example, the first and second conductivity-type semiconductor layers 1504 and 1506 may have a carrier injection layer for improving electron and hole injection efficiency, or may have various types of superlattice structure, respectively.

The first conductivity-type semiconductor layer 1504 may further include a current spreading layer (not shown) in a region adjacent to the active layer 1505. The current spreading layer may have a structure in which a plurality of $In_xAl_yGa_{(1-x-y)}N$ layers having different compositions or different impurity contents are iteratively laminated or may have an insulating material layer partially formed therein.

The second conductivity-type semiconductor layer 1506 may further include an electron blocking layer (not shown) in a region adjacent to the active layer 1505. The electron blocking layer may have a structure in which a plurality of $In_xAl_yGa_{(1-x-y)}N$ layers having different compositions are laminated or may have one or more layers including $Al_yGa_{(1-y)}N$. The electron blocking layer has a bandgap wider than that of the active layer 1505, thus preventing electrons from being transferred to the second conductivity-type (p-type) semiconductor layer 1506.

The light emitting laminate S may be formed by using metal-organic chemical vapor deposition (MOCVD). In order to fabricate the light emitting laminate S, an organic metal compound gas (e.g., trimethyl gallium (TMG), trimethyl aluminum (TMA)) and a nitrogen-containing gas (ammonia ($NH_3$), or the like) are supplied to a reaction container in which the substrate 1501 is installed as reactive gases, the substrate being maintained at a high temperature ranging from 900° C. to 1,100° C., and while a gallium nitride-based compound semiconductor is being grown, an impurity gas is supplied as necessary to laminate the gallium nitride-based compound semiconductor as an undoped n-type or p-type semiconductor. Silicon (Si) is a well known n-type impurity and p-type impurity includes zinc (Zn), cadmium (Cd), beryllium (Be), magnesium (Mg), calcium (Ca), barium (Ba), and the like. Among these, magnesium (Mg) and zinc (Zn) are commonly used.

Also, the active layer 1505 disposed between the first and second conductivity-type semiconductor layers 1504 and 1506 may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used.

(Ohmic-Contact Layer and First and Second Electrodes 1509a and 1590b)

The ohmic-contact layer 1508 may have a relatively high impurity concentration to have low ohmic-contact resistance to lower an operating voltage of the element and enhance element characteristics. The ohmic-contact layer 1508 may be formed of a GaN layer, a InGaN layer, a ZnO layer, or a graphene layer. The first or second electrode 1509a or 1509b may be made of a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like.

The LED chip illustrated in FIG. 57 has a structure in which first and second electrodes 1509a and 1509b face the same surface as a light extraction surface, but it may also be implemented to have various other structures, such as a flip-chip structure in which first and second electrodes face a surface opposite to a light extraction surface, a vertical structure in which first and second electrodes are formed on mutually opposing surfaces, a vertical and horizontal structure employing an electrode structure by forming several vias in a chip as a structure for enhancing current spreading efficiency and heat dissipation efficiency, and the like.

<LED Chip—Second Example>

Figure 58:
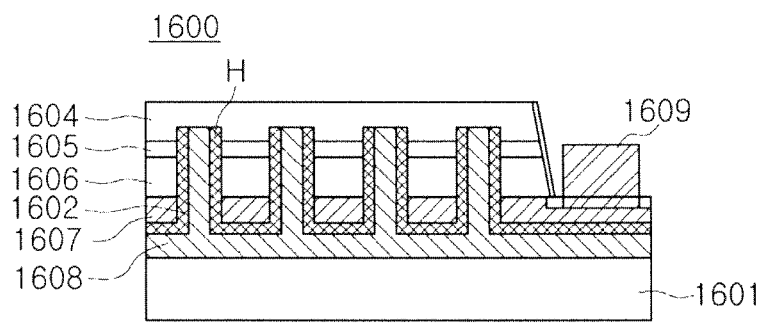
FIG. 58 is a cross-sectional view illustrating another example of an LED chip employable in a lighting device according to an example embodiment of the present disclosure.

In case of manufacturing a large light emitting device chip for a high output for the purpose of illumination, an LED chip illustrated in FIG. 58 having a structure promoting current spreading efficiency and heat dissipation efficiency may be provided.

As illustrated in FIG. 58, an LED chip 1600 may include a first conductivity-type semiconductor layer 1604, an active layer 1605, a second conductivity-type semiconductor layer 1606, a second electrode layer 1607, an insulating layer 1602, a first electrode 1608, and a substrate 1601, laminated sequentially. Here, in order to be electrically connected to the first conductivity-type semiconductor layer 1604, the first electrode layer 1608 includes one or more contact holes H extending from one surface of the first electrode layer 1608 to at least a partial region of the first conductivity-type semiconductor layer 1604 and electrically insulated from the second conductivity-type semiconductor layer 1606 and the active layer 1605. However, the first electrode layer 1608 is not an essential element in the present example embodiment.

The contact hole H extends from an interface of the first electrode layer 1608, passing through the second electrode layer 1607, the second conductivity-type semiconductor layer 1606, and the first active layer 1605, to the interior of the first conductivity-type semiconductor layer 1604. The contact hole H extends at least to an interface between the active layer 1605 and the first conductivity-type semiconductor layer 1604, and preferably, extends to a portion of the first conductivity-type semiconductor layer 1604. However, the contact hole H is formed for the purposes electrical connectivity and current spreading, so the purpose of the presence of the contact hole H is achieved when it is in contact with the first conductivity-type semiconductor layer 1604. Thus, it is not necessary for the contact hole H to extend to an external surface of the first conductivity-type semiconductor layer 1604.

The second electrode layer 1607 formed on the second conductivity-type semiconductor layer 1606 may be selectively made of a material among silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like, in consideration of a light reflecting function and an ohmic-contact function with the second conductivity-type semiconductor layer 1606, and may be formed by using a process such as sputtering, deposition, or the like.

The contact hole H may have a form penetrating the second electrode layer 1607, the second conductivity-type semiconductor layer 1606, and the active layer 1605 so as to be connected to the first conductivity-type semiconductor layer 1604. The contact hole H may be formed through an etching process, e.g., inductively coupled plasma-reactive ion etching (ICP-RIE), or the like.

The insulating layer 1602 is formed to cover a side wall of the contact hole H and a surface of the second electrode layer 1607. In this case, at least a portion of the first conductivity-type semiconductor layer 1604 corresponding to a lower surface of the contact hole H may be exposed. The insulating layer 1602 may be formed by depositing an insulating material such as $SiO_2$, $SiO_xN_y$, or $Si_xN_y$.

The first electrode layer 1608 including a conductive via formed by filling the contact hole H with a conductive material. Subsequently, the substrate 1601 is formed on the first electrode layer 1608. In this structure, the substrate 1601 may be electrically connected by the conductive via connected to the first conductivity-type semiconductor layer 1604.

The substrate 1601 may be formed of a material including any one of Au, Ni, Al, Cu, W, Si, Se, GaAs, SiAl, Ge, SiC, AlN, $Al_2O_3$, GaN, AlGaN and may be formed through a process such as plating, sputtering, deposition, bonding, or the like, but the present disclosure is not limited thereto.

In order to reduce contact resistance, the amount, a shape, a pitch, a contact area with the first and second conductivity-type semiconductor layers 1604 and 1606, and the like, of the contact hole H may be appropriately regulated. The contact holes H may be arranged to have various shapes in rows and columns to improve a current flow. In this case, the conductive via may be surrounded by the insulating layer 1602 so as to be electrically separated from the active layer 1605 and the second conductivity-type semiconductor layer 1606.

<LED Chip—Third Example>

An LED lighting device provides improved heat dissipation characteristics, but in the aspect of overall heat dissipation performance, preferably, a lighting device employs an LED chip having a low heating value. As an LED chip satisfying such requirements, an LED chip including a nano-structure (hereinafter, referred to as a 'nano-LED chip') may be used.

Such a nano-LED chip includes a recently developed core/shell type nano-LED chip, which has a low binding density to generate a relatively low degree of heat, has increased luminous efficiency by increasing a light emitting region by utilizing nano-structures, and prevents a degradation of efficiency due to polarization by obtaining a non-polar active layer, thus improving droop characteristics.

Figure 59:
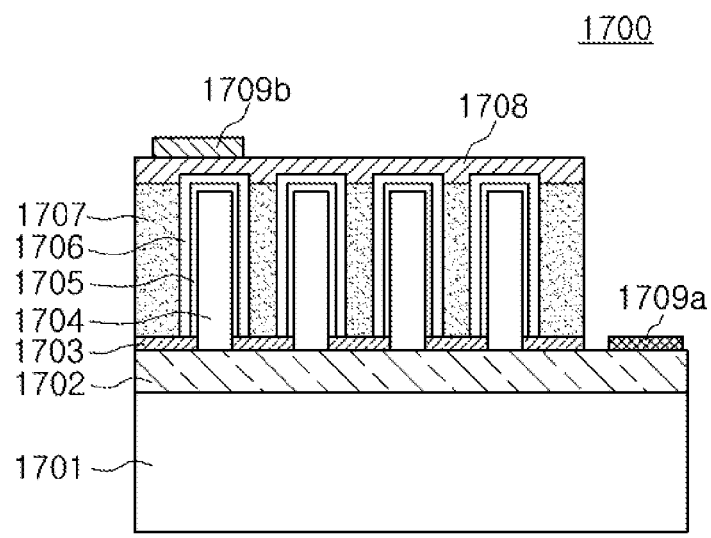
FIG. 59 is a cross-sectional view illustrating another example of an LED chip employable in a lighting device according to an example embodiment of the present disclosure.

FIG. 59 is a cross-sectional view illustrating another example of an LED chip employable in the lighting device as described above.

As illustrated in FIG. 59, a nano-LED chip 1700 includes a plurality of light emitting nanostructures N formed on a substrate 1701. In this example, it is illustrated that the light emitting nanostructures N have a core-shell structure as a rod structure, but the present disclosure is not limited thereto and the light emitting nanostructures N may have a different structure such as a pyramid structure.

The nano-LED chip 1700 includes a base layer 1702 formed on the substrate 1701. The base layer 1702 is a layer providing a growth surface for the light emitting nanostructure, which may be a first conductivity-type semiconductor layer. A mask layer 1703 having an open area for the growth of the light emitting nanostructures N (in particular, the core) may be formed on the base layer 1702. The mask layer 1703 may be formed of a dielectric material such as $SiO_2$ or SiNx.

In the light emitting nanostructures N, a first conductivity-type nano-core 1704 is formed by selectively growing a first conductivity-type semiconductor by using the mask layer 1703 having an open area, and an active layer 1705 and a second conductivity-type semiconductor layer 1706 are formed as shell layers on a surface of the nanocore 1704. Accordingly, the light emitting nanostructures N may have a core-shell structure in which the first conductivity-type semiconductor is the nanocore and the active layer 1705 and the second conductivity-type semiconductor layer 1706 enclosing the nanocore are shell layers.

The nano-LED chip 1700 according to the present example includes a filler material 1707 filling spaces between the light emitting nanostructures N. The filler material 1707 may structurally stabilize the light emitting nanostructures N. The filler material 1707 may be formed of a transparent material such as $SiO_2$, or the like, but the present disclosure is not limited thereto. An ohmic-contact layer 1708 may be formed on the light emitting nanostructures N and connected to the second conductivity-type semiconductor layer 1706. The nano-LED chip 1700 includes first and second electrodes 1709a and 1709b connected to the base layer 1702 formed of the first conductivity-type semiconductor and the ohmic-contact layer 1708, respectively.

By forming the light emitting nanostructures N such that they have different diameters, components, and doping concentrations, light having two or more different wavelengths may be emitted from a single device. By appropriately adjusting light having different wavelengths, white light may be implemented without using phosphors in a single device, and light having various desired colors or white light having different color temperatures may be implemented by combining a different LED chip with the foregoing device or combining wavelength conversion materials such as phosphors.

<LED Chip—Fourth Example>

Figure 60:
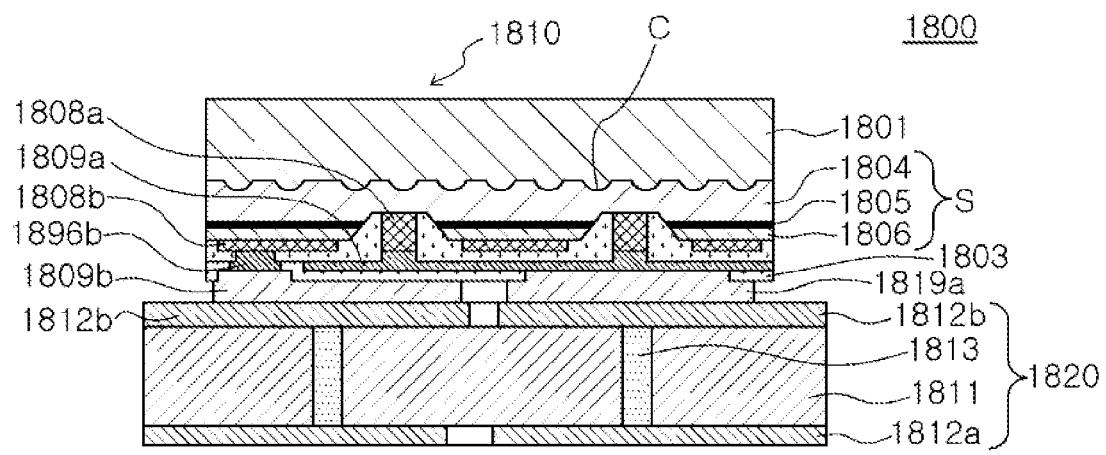
FIG. 60 is a cross-sectional view illustrating an example of an LED chip mounted on a mounting board, as a lighting device employable in a lighting device according to an example embodiment of the present disclosure.

FIG. 60 illustrates a semiconductor light emitting device 1800 having an LED chip 1810 mounted on a mounting board 1820, as a light source employable in the lighting device as described above.

The semiconductor light emitting device 1800 illustrated in FIG. 60 includes the LED chip 1810 mounted on a mounting board 1820. The LED chip 1810 is presented as an LED chip different from that of the example described above.

The LED chip 1810 includes a light emitting laminate S disposed in one surface of the substrate 1801 and first and second electrodes 1808a and 1808b disposed on the opposite side of the substrate 1801 based on the light emitting laminate S. Also, the LED chip 1810 includes an insulating part 1803 covering the first and second electrodes 1808a and 1808b.

The first and second electrodes 1808a and 1808b may include first and second electrode pads 1819a and 1819b connected thereto by electrical connection parts 1809a and 1809b.

The light emitting laminate S may include a first conductivity-type semiconductor layer 1804, an active layer 1805, and a second conductivity-type semiconductor layer 1806 sequentially disposed on the substrate 1081. The first electrode 1808a may be provided as a conductive via connected to the first conductivity-type semiconductor layer 1804 through the second conductivity-type semiconductor layer 1806 and the active layer 1805. The second electrode 1808b may be connected to the second conductivity-type semiconductor layer 1806.

The insulating part 1803 may have an open area exposing at least portions of the first and second electrodes 1808a and 1808b, and the first and second electrode pads 1819a and 1819b may be connected to the first and second electrodes 1808a and 1808b.

The first and second electrodes 1809a and 1809b may have a multilayer structure in which one or a plurality of layers formed of a conductive material having ohmic characteristics with respect to the first and second conductivity-type semiconductor layers 1804 and 1806, respectively, are formed. For example, the first and second electrodes 1809a and 1809b may be formed by depositing or sputtering one or more of silver (Ag), aluminum (Al), nickel (Ni), chromium (Cr), a transparent conductive oxide (TCO), and the like. The first and second electrodes 1809a and 1809b may be disposed in the same direction and may be mounted as a so-called flip-chip on a lead frame as described hereinafter. In this case, the first and second electrodes 1809a and 1809b may be disposed to face in the same direction.

In particular, the first electrical connection unit 1809a may be formed by the first electrode 1808a having a conductive via connected to the first conductivity-type semiconductor layer 1804 by passing through the second conductivity-type semiconductor layer 1804 and the active layer 1805 within the light emitting laminate S.

The amount, a shape, a pitch, a contact area with the first conductivity-type semiconductor layer 1804, and the like, of the conductive via and the first electrical connection unit 1809a may be appropriately regulated in order to lower contact resistance, and the conductive via and the first electrical connection portion 1809a may be arranged in a row and in a column to improve a current flow.

Another electrode structure may include the second electrode 1808b directly formed on the second conductivity-type semiconductor layer 1806 and the second electrical connection portion 1809b formed on the second electrode 1808b. In addition to having a function of forming electrical-ohmic connection with the second conductivity-type semiconductor layer 1806, the second electrode 1808b may be formed of a light reflective material, whereby, as illustrated in FIG. 60, in a state in which the LED chip 1810 is mounted as a so-called flip chip structure, light emitted from the active layer 1805 may be effectively emitted in a direction of the substrate 1801. Of course, the second electrode 1808b may be formed of a light-transmissive conductive material such as a transparent conductive oxide, according to a main light emitting direction.

The two electrode structures as described above may be electrically separated by the insulating unit 1803. The insulating unit 1803 may be formed of any material as long as it has electrically insulating properties. Namely, the insulating unit 1803 may be formed of a material having electrically insulating properties, and here, preferably, a material having a low degree of light absorption is used. For example, a silicon oxide or a silicon nitride such as $SiO_2$, $SiO_xN_y$, $Si_xN_y$, or the like, may be used. If necessary, a light reflective filler may be dispersed in the light-transmissive material to form a light reflective structure.

The first and second electrode pads 1819a and 1819b may be connected to the first and second electrical connection units 1809a and 1809b to serve as external terminals of the LED chip 1810, respectively. For example, the first and second electrode pads 1819a and 1819b may be formed of gold (Au), silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. In this case, when the LED chip is mounted on the mounting board 1820, the first and second electrode pads 1819a and 1819b may be bonded by using the eutectic metal, so solder bumps generally required for flip chip bonding may not be used. The use of a eutectic metal advantageously obtains superior heat dissipation effects in the mounting method to the case of using solder bumps. In this case, in order to obtain excellent heat dissipation effects, the first and second electrode pads 1819a and 1819b may be formed to occupy a relatively large area.

The substrate 1801 and the light emitting laminate S may be understood with reference to content described above with reference to FIG. 57 unless otherwise described. Also, although not shown, a buffer layer (not shown) may be formed between the light emitting structure S and the substrate 1801. The buffer layer may be employed as an undoped semiconductor layer formed of a nitride, or the like, to alleviate lattice defects of the light emitting structure grown thereon.

The substrate 1801 may have first and second main surfaces opposing one another, and an uneven structure (i.e., depressions and protrusions) may be formed on at least one of the first and second main surfaces. The uneven structure formed on one surface of the substrate 1801 may be formed by etching a portion of the substrate 1801 so as to be formed of the same material as that of the substrate. Alternatively, the uneven structure may be formed of a heterogeneous material different from that of the substrate 1801.

In the present embodiment, since the uneven structure is formed on the interface between the substrate 1801 and the first conductivity-type semiconductor layer 1804, paths of light emitted from the active layer 1805 may be of diversity, and thus, a light absorption ratio of light absorbed within the semiconductor layer may be reduced and a light scattering ratio may be increased, increasing light extraction efficiency.

In detail, the uneven structure may be formed to have a regular or irregular shape. The heterogeneous material used to form the uneven structure may be a transparent conductor, a transparent insulator, or a material having excellent reflectivity. Here, as the transparent insulator, a material such as $SiO_2$, $SiN_x$, $Al_2O_3$, HfO, $TiO_2$, or ZrO may be used. As the transparent conductor, a transparent conductive oxide (TCO) such as ZnO, an indium oxide containing an additive (e.g., Mg, Ag, Zn, Sc, Hf, Zr, Te, Se, Ta, W, Nb, Cu, Si, Ni, Co, Mo, Cr, Sn), or the like, may be used. As the reflective material, silver (Ag), aluminum (Al), or a distributed Bragg reflector (DBR) including multiple layers having different refractive indices, may be used. However, the present invention is not limited thereto.

The substrate 1801 may be removed from the first conductivity-type semiconductor layer 1804. To remove the substrate 1801, a laser lift-off (LLO) process using a laser, an etching or a polishing process may be used. Also, after the substrate 1801 is removed, depressions and protrusions may be formed on the surface of the first conductivity-type semiconductor layer 1804.

As illustrated in FIG. 60, the LED chip 1810 is mounted on the mounting board 1820. The mounting board 1820 includes upper and lower electrode layers 1812b and 1812a formed on upper and lower surfaces of the board body 1811, and vias 1813 penetrating the substrate body 1811 to connect the upper and lower electrode layers 1712b and 1712a. The board body 1811 may be formed of a resin, a ceramic, or a metal, and the upper or lower electrode layer 1812b or 1812a may be a metal layer formed of gold (Au), copper (Cu), silver (Ag), or aluminum (Al).

Of course, the board on which the foregoing LED chip 1810 is mounted is not limited to the configuration of the mounting board 1820 illustrated in FIG. 60, and any board having a wiring structure for driving the LED chip 1801 may be employed. For example, it may also be provided as a package structure in which an LED chip 1810 is mounted in a package body having a pair of lead frames.

<Other Examples of LED>

Meanwhile, LED chips having various structures other than that of the foregoing LED chip described above may also be used. For example, an LED chip in which surface-plasmon polaritons (SPP) are formed in a metal-dielectric boundary of an LED chip to interact with quantum well excitons, thus obtaining significantly improved light extraction efficiency, may also be advantageously used.

[LED Package]

Various LED chips may be mounted as bare chips on a circuit board and used in the foregoing lighting devices, and also, an LED chip may be mounted on a package body having a pair of electrode structures so as to be used as various package structures.

A package having an LED chip may have various optical structures for enhancing a heat dissipation structure improving heat dissipation characteristics and optical characteristics of an LED chip, as well as providing an external terminal structure easily connected to an external circuit.

For example, various optical structures may have a wavelength conversion unit converting light emitted from an LED chip into a light having a different wavelength or a lens structure for improving light distribution characteristics.

<Example of LED Package—Chip Scale Package (CSP)>

An LED chip package having a CSP structure may be used as an example of an LED package employable in the foregoing lighting devices.

The CSP, reducing a size of the LED chip package and simplifying a manufacturing process, is appropriate for mass-production, and since a wavelength conversion material such as a phosphor and an optical structure such as a lens can be integrally fabricated together with an LED chip by the CSP, the CSP can be appropriately used in a lighting device.

Figure 61:
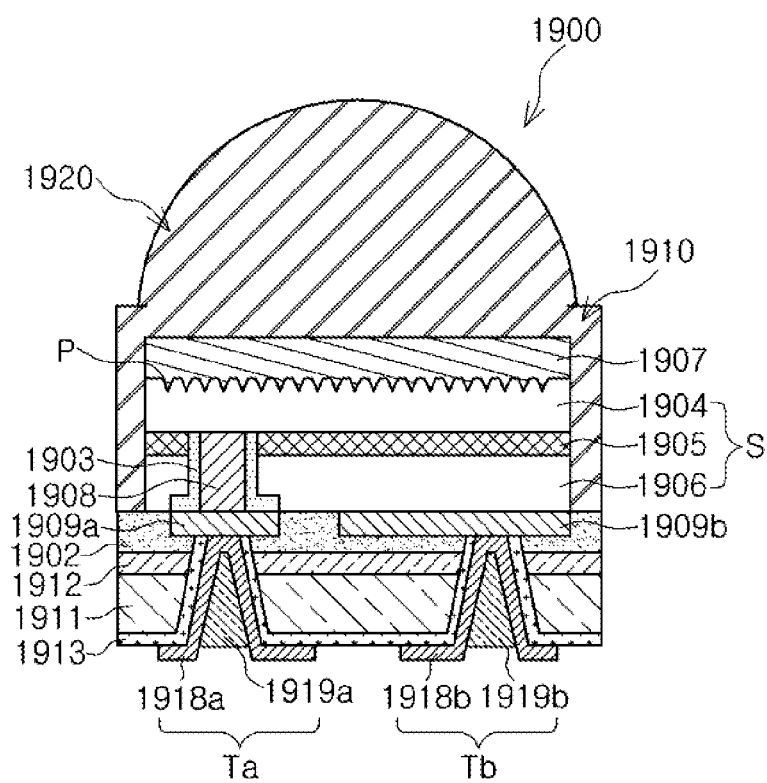
FIG. 61 is a cross-sectional view illustrating an example of an LED package (chip-scale package) employable in a lighting device according to an example embodiment of the present disclosure.

FIG. 61 illustrates an example of a CSP, a package structure in which an electrode is formed in a lower surface of an LED 1910, opposite to a main light extracting surface, and a phosphor layer 1907 and a lens 1920 are integrally formed.

The SCP 1900 illustrated in FIG. 61 includes a light emitting laminate S disposed on a board 1911, first and second terminal units Ta and Tb, the phosphor layer 1907, and the lens 1920.

The light emitting laminate S is a lamination structure including first and second conductivity-type semiconductor layers 1904 and 1906 and an active layer 1905 disposed therebetween. In the present embodiment, the first and second conductivity-type semiconductor layers 1904 and 1906 may be a n-type and an p-type semiconductor layers, respectively, and may be made of a nitride semiconductor, e.g., $Al_xIn_yGa_{(1-x-y)}N$ ($0 \leq x \leq 1$, $0 \leq y \leq 1$, $0 \leq x+y \leq 1$). However, besides a nitride semiconductor, a GaAs-based semiconductor or GaP-based semiconductor may also be used.

The active layer 1905 formed between the first and second conductivity-type semiconductor layers 1904 and 1906 may emit light having a predetermined level of energy according to electron-hole recombination, and may have a multi-quantum well (MQW) structure in which a quantum well layer and a quantum barrier layer are alternately laminated. In the case of the MQW structure, for example, an InGaN/GaN or AlGaN/GaN structure may be used.

Meanwhile, the first and second conductivity-type semiconductor layers 1904 and 1906 and the active layer 1905 may be formed by using a semiconductor growth process such as metal-organic chemical vapor deposition (MOCVD), molecular beam epitaxy (MBE), hydride vapor phase epitaxy (HVPE), or the like.

The LED 1910 illustrated in FIG. 61 is in a state in which a growth substrate was removed, and depressions and protrusions (or an uneven surface) P may be formed on the surface from which the growth substrate was removed. Also, the phosphor layer 1907 may be applied to the uneven surface, as a light conversion layer.

The LED 1910 includes first and second electrodes 1909a and 1909b connected to the first and second conductivity-type semiconductor layers 1904 and 1906, respectively, similar to the LED chip illustrated in FIG. 60. The first electrode 1909a may have a conductive via 1908 connected to the first conductivity-type semiconductor layer 1904 through the second conductivity-type semiconductor layer 1906 and the active layer 1905. An insulating layer 1903 is formed between the active layer 1905 and the second conductivity-type semiconductor layer 1906 in the conductive via 1908 to prevent a short-circuit occurring.

A single conductive via 1908 is illustrated, but two or more conductive vias 1908 may be provided to advantageously distribute current, and may be arranged in various forms.

The mounting board 1911 employed in the present embodiment is illustrated as a support substrate such as a silicon substrate to which a semiconductor process can be easily applicable, but the present invention is not limited thereto. The mounting board 1911 and the LED 1910 may be bonded by first and second bonding layers 1902 and 1912. The first and second bonding layers 1902 and 1912 may be made of an electrically insulating material or an electrically conductive material. For example, the electrically insulating material may include an oxide such as $SiO_2$, SiN, or the like, a resin material such as a silicon resin, an epoxy resin, or the like. The electrically conductive material may include silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal alloy thereof. This process may be implemented such that the first and second bonding layers 1902 and 1912 are applied to respective bonding surfaces of the LED 1910 and the mounting board 1911 and subsequently bonded thereto.

A via is formed from a lower surface of the mounting board 1911 so as to be connected to the first and second electrodes 1909a and 1909b of the LED 1910 as bonded. An insulator 1913 may be formed on a lateral surface of the via and on a lower surface of the mounting board 1911. In a case in which the mounting board 1911 is a silicon substrate, the insulator 1913 may be provided as a silicon oxide film through thermal oxidation. The vias are filled with a conductive material to form first and second terminal units Ta and Tb connected to the first and second electrodes 1909a and 1909b. The first and second terminal units Ta and Tb may include seed layers 1918a and 1918b and plating charged units 1919a and 1919b formed through a plating process by using the seed layers 1918a and 1918b.

<Phosphor>

[Improvement of Color Rendering]

A lighting device may be implemented to have a high color rendering index to provide illumination light close to natural light. In order to enhance color rendering, red, green, and blue LED chips or packages may be used together, and a white light source may be provided by combining red and green phosphors to a blue LED chip or package or combining a red or green phosphor to blue and green LED chips or blue and red LED chips. In addition, color rendering may further enhanced by using a yellow and/or yellowish green phosphor or chip. As the additional phosphor, at least one selected from the group consisting of $Lu_3Al_5O_{12}$:Ce3+, Ca-α-SiAlON: Eu2+, $La_3Si_6N_{11}$:Ce3+, (Ca,Sr)AlSiN$_3$:Eu2+, $Y_3Al_5O_{12}$: Ce3+, $LiAlO_2$:Fe3+, and $(Ba,Sr,Mg)_3Si_2O_7$:Pb2+.

[Phosphor Application Technology]

A phosphor may be directly applied to an LED chip or may be provided in a light extraction path of a package. For example, a phosphor may be applied to an upper surface or an upper surface and lateral surfaces of an LED chip, may be provided as a layer structure in a cup structure of a package, or may be mixed with a packing resin so as to be coated. A phosphor application type may be classified as a type in which a phosphor is in contact with an LED chip and a type in which a phosphor is disposed to be spaced apart from an LED chip.

As a phosphor application method, at least one dispensing method including a pneumatic dispensing method, a mechanical dispensing method, and a jetting dispensing method for controlling a small amount may be used. Alternatively, a process such as screen printing, a spraying process, or the like, that may be comprehensively applied to a large amount of products may be used. Also, electrophoresis or a conformal coating process may be used for locally coating a particular region such as an upper surface of an LED chip may be used.

As another phosphor application method, a ceramic phosphor film or a phosphor-containing resin film may be separately manufactured and bonded to an LED chip or package.

The lighting device using an LED as described above may be classified as an indoor lighting device or an outdoor lighting device depending on a purpose thereof. The indoor LED lighting device may include a lamp, a fluorescent lamp (LED-tube), or a flat panel type lighting device replacing an existing lighting fixture (retrofit), and the outdoor LED lighting device may include a streetlight, a security light, a flood light, a scene lamp, a traffic light, and the like.

An LED chip, a package device, or a board module structure including an LED chip or package needs to have excellent heat dissipation effect and have color rendering close to solar light.

Also, optical design and lighting control should be conducted according to a utilization space, and advantages in terms of cost may be essential for excellent lighting products. A chip structure (GaN on Si substrate) or a chip scale package (CSP) structure using a low-priced silicon substrate may be applied.

First, an LED chip that does not generate heat or that generates heat as small as possible is preferably used in terms of heat dissipation, and a recently developed core/shell type nano-LED structure is advantageous in that a combination density within an LED structure is so low that it generates a relatively small amount of heat.

Also, since the flipchip or vertical structure or vertical-horizontal structure having an electrically or thermally stable structure may have enhanced heat dissipation effect by forming several vias within an LED chip, the LED chip may be appropriate as a lighting LED chip. In order to enhance color rendering, red, green, blue LED chips or packages may be used. Also, a white light emitting device may be manufactured by combining red and green phosphors to a blue LED chip or package or by combining a red or green phosphor to blue and green or blue and red LED chips. In addition, color rendering may be enhanced by using a yellow and/or yellowish green phosphor or chip.

The lighting device using an LED as described above may be altered in terms of an optical design thereof according to a product type, a location, and a purpose. For example, in relation to the foregoing emotional illumination, a technique for controlling lighting by using a wireless (remote) control technique utilizing a portable device such as a smartphone may be provided, in addition to a technique of controlling color, temperature, brightness, and hue of illumination In addition, a visible wireless communications technology aimed at simultaneously achieving a unique purpose of an LED light source and a purpose of a communications unit by adding a communications function to LED lighting devices and display devices may be available. This is because an LED light source has a longer lifespan and excellent power efficiency, implements various colors, supports a high switching rate for digital communications, and is available for digital control, in comparison with existing light sources.

The visible light wireless communications technology is a wireless communications technology transferring information wirelessly by using light having a visible light wavelength band recognizable by human eyes. The visible light wireless communications technology is distinguished from a wired optical communications technology in that it uses light having a visible light wavelength band and that a communications environment is based on a wireless scheme.

Also, unlike RF wireless communications, the visible light wireless communications technology has excellent convenience and physical security properties as it can be freely used without being regulated or needing permission in the aspect of frequency usage, is differentiated in that a user can physically check a communications link, and above all, the visible light wireless communications technology has features as a fusion technique obtaining both a unique purpose as a light source and a communications function.

Also, the lighting device using LEDs may be utilized as an internal or external light source of a vehicle. As an internal light source, the LED lighting device may be used as an indoor light, a reading light, or as various dashboard light sources of a vehicle. As an external light source, the LED lighting device may be used as a headlight, a brake light, a turn signal lamp, a fog light, a running light, and the like. LED lighting using light within a particular wavelength band may promote plant growth and stabilize a person's mood or treat diseases using emotional lighting. In addition, the LED lighting device may also be applicable as a light source used in robots or various mechanic facilities.

While example embodiments have been shown and described above, the present disclosure is not limited thereto.

It will be apparent to those skilled in the art that modifications and variations could be made without departing from the spirit and scope of the present disclosure as defined by the appended claims.

What is claimed is:

1. A lighting device comprising:
 a light emitting module having a plurality of light emitting devices outputting light and a light emitting device board on which the light emitting devices are disposed in an annular arrangement;
 a substantially hollow vessel-like housing installed on one side of the light emitting module along a central axis;
 a reflector supported by the other surface of the light emitting device board opposite to the one side and reflecting light output from the light emitting devices; and
 a globe installed to cover the light emitting module and the reflector and having a maximum diameter greater than that of the housing,
 wherein the reflector is installed to be protruded from the other surface of the light emitting device board such that the reflector has a reversed circular truncated conical shape, and has a reflective surface formed on a lateral circumferential surface of the truncated cone to reflect light output from the light emitting devices, and the globe is connected to the housing.

2. The lighting device of claim 1, wherein a material of the globe is a material containing a phosphor or a surface of the globe is coated with a phosphor, and the light emitting device is a light emitting diode (LED) emitting light exciting the phosphor of the globe.

3. The lighting device of claim 1, wherein a material of the globe is a material containing a light diffuser, a light diffuser is coated on a surface of the globe, and the light emitting device is an LED emitting white light.

4. The lighting device of claim 1, wherein the lighting device has luminous efficiency equal to or greater than 90 lm/W, an amount of light emission is equal to or greater than 800 lm, and a color temperature ranging from 2700 K to 3000 K.

5. The lighting device of claim 1, wherein the lighting device has a color rendering index equal to or greater than 90 and has a shape sufficient to be used as a substitute of an incandescent bulb satisfying the ANSI standards.

6. The lighting device of claim 1, wherein the lighting device is configured such that at least one of a color, temperature, and brightness of illustration thereof is wirelessly controlled by a portable device.

7. The lighting device of claim 1, wherein the reflector has a reversed circular truncated conical shape having a diameter increased as the reflector becomes distant from the light emitting device board.

8. The lighting device of claim 1, wherein a maximum diameter of the globe is 1.2 times or greater the maximum diameter of the housing.

9. A lighting device comprising:
 a light emitting module having a plurality of light emitting devices outputting light and a light emitting device board on which the light emitting devices are disposed in an annular arrangement;
 a first heat sink installed on one side of the light emitting module along a central axis direction;
 a second heat sink installed on the other side of the light emitting module along a central axis direction;
 a globe installed to cover the light emitting module; and
 a driving circuit installed within the second heat sink and driving the light emitting devices,
 wherein the first heat sink and the second heat sink only outwardly dissipates only heat generated by at least one of the light emitting module and the driving circuit.

10. The lighting device of claim 9, further comprising a reflector maintained in one surface of the light emitting device board and reflecting light output from the light emitting devices.

11. The lighting device of claim 10, wherein the reflector is installed to be protruded from one surface of the light emitting device board such that the reflector has a reversed circular truncated conical shape having a diameter increased in a direction away from the light emitting device board, and have a reflective surface formed on a lateral circumferential surface of the truncated cone to reflect light output from the light emitting devices.

12. The lighting device of claim 10, wherein a maximum diameter of the globe is 1.2 times or greater than the maximum diameter of the second heat sink.

13. The lighting device of claim 12, wherein a maximum diameter of the globe is 1.2 times or greater than the maximum diameter of the second heat sink.

14. The lighting device of claim 10, wherein a material of the globe is a material containing a phosphor or a surface of the globe is coated with a phosphor, the light emitting device is a light emitting diode (LED) emitting light exciting the phosphor of the globe, and wavelengths of light reflected by the reflector and light output from the light emitting devices are converted by the phosphor.

15. The lighting device of claim 14, wherein a material of the globe is a material further containing a light diffuser or a light diffuser is further coated on the surface of the globe.

16. The lighting device of claim 10, wherein a material of the globe is a material containing a light diffuser or a light diffuser is coated on the surface of the globe so the light emitting device is a light emitting diode (LED) emitting white light.

17. The lighting device of claim 10, wherein the second heat sink has a metal member inserted into a resin, and is obtained by integrally insert-molding the resin and the metal member.

18. The lighting device of claim 10, wherein the driving circuit does not have an electrolytic capacitor converting an alternating current (AC) into a direct current (DC).

19. The lighting device of claim 10, wherein the first heat sink has a substantially cylindrical or columnar shape, and the globe has an opening connected to one end of the first heat sink.

20. The lighting device of claim 19, wherein the reflector has a hollow shape, the first heat sink is disposed in the hollow portion of the reflector, and a maximum diameter of the first heat sink is equal to or smaller than a maximum diameter of the reflector.

* * * * *